United States Patent
Widjaja et al.

(10) Patent No.: US 11,985,809 B2
(45) Date of Patent: May 14, 2024

(54) MEMORY DEVICE HAVING ELECTRICALLY FLOATING BODY TRANSISTOR

(71) Applicant: Zeno Semiconductor, Inc., Sunnyvale, CA (US)

(72) Inventors: Yuniarto Widjaja, San Jose, CA (US); Jin-Woo Han, San Jose, CA (US); Benjamin S. Louie, Fremont, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 17/867,593

(22) Filed: Jul. 18, 2022

(65) Prior Publication Data
US 2022/0359522 A1 Nov. 10, 2022

Related U.S. Application Data

(60) Continuation of application No. 17/207,687, filed on Mar. 21, 2021, now Pat. No. 11,417,657, which is a
(Continued)

(51) Int. Cl.
*H10B 12/00* (2023.01)
*G11C 11/404* (2006.01)
(Continued)

(52) U.S. Cl.
CPC ............ *H10B 12/20* (2023.02); *G11C 11/404* (2013.01); *G11C 16/0433* (2013.01);
(Continued)

(58) Field of Classification Search
CPC ........ H10B 12/20; H10B 41/35; H10B 12/10; G11C 16/26; G11C 16/3427; G11C 16/10;
(Continued)

(56) References Cited

U.S. PATENT DOCUMENTS 4,300,212 A 11/1981 Simko
4,959,812 A 9/1990 Momodomi et al.
(Continued)

FOREIGN PATENT DOCUMENTS

WO 2006091263 A3 9/2007

OTHER PUBLICATIONS

Almeida et al., "comparision between low and high read bias in FB-RAM on UTBOX FDSOI devices", Ultimate Integration on Silicon (ULIS), 2012 13th International Conference on, Mar. 6, 2012, pp. 61-64.
(Continued)

*Primary Examiner* — Latanya N Crawford Eason
(74) *Attorney, Agent, or Firm* — Law Office of Alan W. Cannon

(57) ABSTRACT

A semiconductor memory cell includes a floating body region configured to be charged to a level indicative of a state of the memory cell selected from at least first and second states. A first region of the memory cell is in electrical contact with the floating body region. A second region of the memory cell is spaced apart from the first region and is also in electrical contact with the floating body region. A gate is positioned between the first and second regions. A back-bias region is configured to generate impact ionization when the memory cell is in one of the first and second states, and the back-bias region is configured so as not to generate impact ionization when the memory cell is in the other of the first and second states.

20 Claims, 37 Drawing Sheets

Related U.S. Application Data continuation of application No. 16/827,373, filed on Mar. 23, 2020, now Pat. No. 10,978,455, which is a continuation of application No. 16/224,534, filed on Dec. 18, 2018, now Pat. No. 10,629,599, which is a continuation of application No. 15/867,877, filed on Jan. 11, 2018, now Pat. No. 10,192,872, which is a continuation of application No. 15/403,757, filed on Jan. 11, 2017, now Pat. No. 9,893,067, which is a continuation of application No. 14/955,339, filed on Dec. 1, 2015, now Pat. No. 9,576,962, which is a division of application No. 13/746,523, filed on Jan. 22, 2013, now Pat. No. 9,230,651.

(60) Provisional application No. 61/621,546, filed on Apr. 8, 2012.

(51) Int. Cl.
| | |
|---|---|
| *G11C 16/04* | (2006.01) |
| *G11C 16/10* | (2006.01) |
| *G11C 16/26* | (2006.01) |
| *G11C 16/34* | (2006.01) |
| *H01L 29/08* | (2006.01) |
| *H01L 29/10* | (2006.01) |
| *H01L 29/36* | (2006.01) |
| *H01L 29/70* | (2006.01) |
| *H01L 29/73* | (2006.01) |
| *H01L 29/732* | (2006.01) |
| *H01L 29/78* | (2006.01) |
| *H10B 12/10* | (2023.01) |
| *H10B 41/35* | (2023.01) |

(52) U.S. Cl.
CPC .............. *G11C 16/10* (2013.01); *G11C 16/26* (2013.01); *G11C 16/3427* (2013.01); *H01L 29/0804* (2013.01); *H01L 29/0821* (2013.01); *H01L 29/1095* (2013.01); *H01L 29/36* (2013.01); *H01L 29/70* (2013.01); *H01L 29/73* (2013.01); *H01L 29/7302* (2013.01); *H01L 29/7841* (2013.01); *H10B 12/10* (2023.02); *H10B 41/35* (2023.02); *H01L 29/1004* (2013.01); *H01L 29/732* (2013.01)

(58) Field of Classification Search
CPC .............. G11C 16/0433; G11C 11/404; H01L 29/0804; H01L 29/0821; H01L 29/1095; H01L 29/36; H01L 29/7841; H01L 29/732; H01L 29/0808; H01L 29/7322; H01L 29/1004; H01L 29/70; H01L 29/73
See application file for complete search history.

(56) References Cited

U.S. PATENT DOCUMENTS

| | | |
|---|---|---|
| 5,519,831 A | 5/1996 | Holzhammer |
| 5,581,504 A | 12/1996 | Chang |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,313,486 B1 | 11/2001 | Kencke et al. |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Matthew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,264,875 B2 | 9/2012 | Widjaja et al. |
| 8,264,876 B2 | 9/2012 | Widjaja et al. |
| 8,294,193 B2 | 10/2012 | Widjaja |
| 8,379,458 B1 | 2/2013 | Or-Bach et al. |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,547,756 B2 | 10/2013 | Widjaja et al. |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,817,548 B2 | 8/2014 | Widjaja et al. |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,025,358 B2 | 5/2015 | Widjaja |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,209,188 B2 | 12/2015 | Widjaja |
| 9,230,651 B2 | 1/2016 | Widjaja et al. |
| 9,230,965 B2 | 1/2016 | Widjaja |

(56) References Cited

U.S. PATENT DOCUMENTS

| | | |
|---|---|---|
| 9,236,382 B2 | 1/2016 | Widjaja et al. |
| 9,257,179 B2 | 2/2016 | Widjaja |
| 9,391,079 B2 | 7/2016 | Widjaja |
| 9,401,206 B2 | 7/2016 | Widjaja |
| 9,455,262 B2 | 9/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,514,803 B2 | 12/2016 | Widjaja et al. |
| 9,524,970 B2 | 12/2016 | Widjaja |
| 9,576,962 B2 | 2/2017 | Widjaja et al. |
| 9,589,963 B2 | 3/2017 | Widjaja |
| 9,601,493 B2 | 3/2017 | Widjaja |
| 9,614,080 B2 | 4/2017 | Widjaja |
| 9,646,693 B2 | 5/2017 | Widjaja |
| 9,653,467 B2 | 5/2017 | Widjaja et al. |
| 9,666,275 B2 | 5/2017 | Widjaja |
| 9,679,648 B2 | 6/2017 | Widjaja |
| 9,704,870 B2 | 7/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 9,812,203 B2 | 11/2017 | Widjaja |
| 9,812,456 B2 | 11/2017 | Widjaja |
| 9,847,131 B2 | 12/2017 | Widjaja |
| 9,893,067 B2 | 2/2018 | Widjaja et al. |
| 9,905,564 B2 | 2/2018 | Widjaja et al. |
| 9,922,711 B2 | 3/2018 | Widjaja |
| 9,922,981 B2 | 3/2018 | Widjaja |
| 9,928,910 B2 | 3/2018 | Widjaja |
| 9,960,166 B2 | 5/2018 | Widjaja |
| 9,978,450 B2 | 5/2018 | Widjaja |
| 10,008,266 B1 | 6/2018 | Widjaja |
| 10,032,514 B2 | 7/2018 | Widjaja |
| 10,032,776 B2 | 7/2018 | Widjaja et al. |
| 10,056,387 B2 | 8/2018 | Widjaja |
| 10,074,653 B2 | 9/2018 | Widjaja |
| 10,079,236 B2 | 9/2018 | Widjaja |
| 10,109,349 B2 | 10/2018 | Widjaja |
| 10,141,315 B2 | 11/2018 | Widjaja et al. |
| 10,163,907 B2 | 12/2018 | Widjaja et al. |
| 10,181,471 B2 | 1/2019 | Widjaja et al. |
| 10,192,872 B2 | 1/2019 | Widjaja et al. |
| 10,204,684 B2 | 2/2019 | Widjaja |
| 10,204,908 B2 | 2/2019 | Widjaja |
| 10,210,934 B2 | 2/2019 | Widjaja |
| 10,211,209 B2 | 2/2019 | Widjaja |
| 10,242,739 B2 | 3/2019 | Widjaja |
| 10,249,368 B2 | 4/2019 | Widjaja |
| 10,340,006 B2 | 7/2019 | Widjaja |
| 10,340,276 B2 | 7/2019 | Widjaja et al. |
| 10,347,636 B2 | 7/2019 | Widjaja |
| 10,388,378 B2 | 8/2019 | Widjaja |
| 10,403,361 B2 | 9/2019 | Widjaja |
| 10,453,847 B2 | 10/2019 | Widjaja et al. |
| 10,461,084 B2 | 10/2019 | Widjaja |
| 10,468,102 B2 | 11/2019 | Widjaja |
| 10,497,443 B2 | 12/2019 | Widjaja |
| 10,515,968 B2 | 12/2019 | Widjaja |
| 10,529,424 B2 | 1/2020 | Widjaja |
| 10,553,281 B2 | 2/2020 | Widjaja |
| 10,593,675 B2 | 3/2020 | Widjaja et al. |
| 10,615,163 B2 | 4/2020 | Widjaja |
| 10,622,069 B2 | 4/2020 | Widjaja |
| 10,629,599 B2 | 4/2020 | Widjaja et al. |
| 10,644,001 B2 | 5/2020 | Widjaja et al. |
| 10,644,002 B2 | 5/2020 | Widjaja |
| 10,707,209 B2 | 7/2020 | Widjaja |
| 10,734,076 B2 | 8/2020 | Widjaja |
| 10,748,904 B2 | 10/2020 | Widjaja et al. |
| 10,797,055 B2 | 10/2020 | Widjaja et al. |
| 10,804,276 B2 | 10/2020 | Widjaja |
| 10,818,354 B2 | 10/2020 | Widjaja |
| 10,825,520 B2 | 11/2020 | Widjaja |
| 10,861,548 B2 | 12/2020 | Widjaja |
| 10,867,676 B2 | 12/2020 | Widjaja |
| 10,978,455 B2 | 4/2021 | Widjaja et al. |
| 10,991,698 B2 | 4/2021 | Widjaja |
| 11,004,512 B2 | 5/2021 | Widjaja |
| 11,011,232 B2 | 5/2021 | Widjaja |
| 11,018,136 B2 | 5/2021 | Widjaja et al. |
| 11,037,929 B2 | 6/2021 | Widjaja |
| 11,063,048 B2 | 7/2021 | Widjaja |
| 11,133,313 B2 | 9/2021 | Widjaja |
| 11,183,498 B2 | 11/2021 | Widjaja et al. |
| 11,211,125 B2 | 12/2021 | Widjaja |
| 11,295,813 B2 | 4/2022 | Widjaja |
| 11,348,922 B2 | 5/2022 | Widjaja et al. |
| 11,348,923 B2 | 5/2022 | Widjaja |
| 11,404,420 B2 | 8/2022 | Widjaja |
| 11,417,657 B2 | 8/2022 | Widjaja et al. |
| 2002/0018366 A1 | 2/2002 | von Schwerin et al. |
| 2002/0048193 A1 | 4/2002 | Tanikawa et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0211535 A1 | 9/2007 | Kim |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0179656 A1 | 7/2008 | Aoki |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0213641 A1 | 8/2009 | Park et al. |
| 2009/0251966 A1 | 10/2009 | Widjaja |
| 2009/0310431 A1 | 12/2009 | Saito |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0221877 A1 | 9/2010 | Park et al. |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0081941 A1 | 4/2012 | Widjaja et al. |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |

(56) References Cited

U.S. PATENT DOCUMENTS

| | | |
|---|---|---|
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0213892 A1 | 7/2015 | Widjaja |
| 2015/0221650 A1 | 8/2015 | Widjaja et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0300613 A1 | 10/2016 | Widjaja |
| 2016/0300841 A1 | 10/2016 | Widjaja |
| 2016/0365444 A1 | 12/2016 | Widjaja |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0365340 A1 | 12/2017 | Widjaja |
| 2017/0365607 A1 | 12/2017 | Widjaja |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0075907 A1 | 3/2018 | Widjaja |
| 2018/0158825 A1 | 6/2018 | Widjaja et al. |
| 2018/0166446 A1 | 6/2018 | Widjaja |
| 2018/0174654 A1 | 6/2018 | Widjaja |
| 2018/0182458 A1 | 6/2018 | Widjaja |
| 2018/0182460 A1 | 6/2018 | Widjaja |
| 2018/0219013 A1 | 8/2018 | Widjaja |
| 2018/0233199 A1 | 8/2018 | Widjaja |
| 2018/0301191 A1 | 10/2018 | Widjaja |
| 2018/0308848 A1 | 10/2018 | Widjaja et al. |
| 2018/0330790 A1 | 11/2018 | Widjaja |
| 2018/0331109 A1 | 11/2018 | Widjaja |
| 2018/0374854 A1 | 12/2018 | Widjaja |
| 2019/0006367 A1 | 1/2019 | Widjaja |
| 2019/0027220 A1 | 1/2019 | Widjaja |
| 2019/0067289 A1 | 2/2019 | Widjaja et al. |
| 2019/0096889 A1 | 3/2019 | Widjaja et al. |
| 2019/0131305 A1 | 5/2019 | Widjaja et al. |
| 2019/0139962 A1 | 5/2019 | Widjaja |
| 2019/0148381 A1 | 5/2019 | Widjaja et al. |
| 2019/0156889 A1 | 5/2019 | Widjaja |
| 2019/0156890 A1 | 5/2019 | Widjaja |
| 2019/0164974 A1 | 5/2019 | Widjaja |
| 2019/0180820 A1 | 6/2019 | Widjaja |
| 2019/0189212 A1 | 6/2019 | Widjaja |
| 2019/0259763 A1 | 8/2019 | Widjaja et al. |
| 2019/0267089 A1 | 8/2019 | Widjaja |
| 2019/0267382 A1 | 8/2019 | Widjaja |
| 2019/0295646 A1 | 9/2019 | Widjaja |
| 2019/0355419 A1 | 11/2019 | Widjaja |
| 2020/0013780 A1 | 1/2020 | Widjaja |
| 2020/0013781 A1 | 1/2020 | Widjaja et al. |
| 2020/0051633 A1 | 2/2020 | Widjaja |
| 2020/0091155 A1 | 3/2020 | Widjaja |
| 2020/0118627 A1 | 4/2020 | Widjaja |
| 2020/0118628 A1 | 4/2020 | Widjaja |
| 2020/0168609 A1 | 5/2020 | Widjaja et al. |
| 2020/0203346 A1 | 6/2020 | Widjaja |
| 2020/0227415 A1 | 7/2020 | Widjaja et al. |
| 2020/0243529 A1 | 7/2020 | Widjaja et al. |
| 2020/0243530 A1 | 7/2020 | Widjaja |
| 2020/0312855 A1 | 10/2020 | Widjaja |
| 2020/0335503 A1 | 10/2020 | Widjaja et al. |
| 2020/0342939 A1 | 10/2020 | Widjaja |
| 2020/0411521 A1 | 12/2020 | Widjaja et al. |
| 2021/0005608 A1 | 1/2021 | Widjaja |
| 2021/0050059 A1 | 2/2021 | Widjaja |
| 2021/0074358 A1 | 3/2021 | Widjaja |

OTHER PUBLICATIONS

Andrade et al., "The Impact of Back Bias on the Floating Body Effect in UTBOX SOI Devices for 1T-FBRAM memory Applications", Devices, Circuits and Systems (ICCDCS), 2102 8th International Caribbean Conference on, IEEE, 2012, pp. 1-4.

Aoulaiche et al., "Junction Field Effect on the Retention time for One-Transistor Floating-body RAM." Electron Devices, IEEE Transactions on, vol. 59, No. 8, 2012, pp. 2167-2172.

Aoulaiche et al., "Hot hole induced damage in 1T-FBRAM on bulk FinFET." Reliability Physics Symposium (IRPS), 2011 IEEE International, IEEE, 2011, pp. 99-104.

Avci et al., "Floating-Body Diode—A Novel DRAM Device." Electron Device Letters, IEEE, vol. 33, No. 2, 2012, pp. 161-163.

Bawedin et al., "Floating-Body SOI Memory: Concepts, Physics and Challenges", ECS Transactions 19.4 (2009), pp. 243-256.

Ban et al., "Integration of Back-Gate doping for 15-nm node floating body cell (FBC) memory." VLSI Technology (VLSIT), 2010 Symposium on, IEEE, 2010, pp. 159-160.

Cho et al., "Variation Study and Implications for BJT-Based Thin-Body Capacitorless DRAM." Electron Device Letters, IEEE, vol. 33, No. 3, 2012, pp. 312-314.

Cho et al., "Variation-aware study of BJT-based capacitorless DRAM cell scaling limit." Silicon Nanoelectronics Workshop (SNW), 2012 IEEE, IEEE, 2012, pp. 102.

Chiu et al., "Characteristics of a new trench-oxide thin-film transistor and its 1T-DRAM applications." Solid-State and Integrated Circuit Technology (ICSICT), 2010 10th IEEE International Conference on, IEEE, 2010, pp. 1106-1108.

Chiu et al., "A simple process of thin-film transistor using the trench-oxide layer for improving 1T-DRAM performance." Next-Generation Electronics (ISNE), 2010 International Symposium on, IEEE, 2010, pp. 254-257.

Chun et al., "A 1.1 V, 667 MHz random cycle, asymmetric 2T gain cell embedded DRAM with a 99.9 percentile retention time of 110μsec." VLSI Circuits (VLSIC), 2010 IEEE Symposium on, IEEE, 2010, pp. 191-192.

Chun et al., "A 667 MHz Logic-compatible Embedded DRAM Featuring an Asymmetric 2T Gain Cell for High Speed On-Die Cache." Solid-State circuits, IEEE Journal of, vol. 47, No. 2, 2012, pp. 547-559.

Cao et al., "A Novel 1T-1D DRAM Cell for Embedded Application." Electron Devices, IEEE Transactions on, vol. 59, No. 5, 2012, pp. 1304-1310.

Collaert et al., "Substrate bias dependency of sense margin and retention in bulk Fin FET 1T-DRAM cells." Solid-State Electronics 65 (2011), pp. 205-210.

(56) References Cited

OTHER PUBLICATIONS

Collaert et al., "A low-voltage biasing scheme for aggressively scaled bulk FinFET 1T-DRAM featuring 10s retention at 85 C." VLSI Technology (VLSIT), 2010 Symposium on, IEEE, 2010, pp. 161-162.

Chatterjee et al., "Tap;er isolated dynamic gain RAM cell." Electron Devices Meeting, 1978 International, vol. 24, IEEE, 1978, pp. 698-699.

Chatterjee et al., "Circuit Optimization of the Taper Isolated Dynamic Gain RAM Cell for VLSI Memories", 1979 IEEE International Solid State Circuits Conference, pp. 22-23.

Chatterjee et al., "A survey of high-density dynamic RAM cell concepts." Electron Devices, IEEE Transactions on, 26.56 (1979): 827-839.

Erb, "Stratified charge memory." Solid-State Circuits Conference, Digest of Technical Papers, 1978, IEEE International, vol. 21, IEEE, 1978, pp. 24-25.

Galeti et al., "BJT effect analysis in p- and n-SOI MuGFETs with high-k gate dielectrics and TiN metal gate electrode for a 1T-DRAM application." SOI Conference (SOI), 2011 IEEE International, IEEE, 2011, pp. 1-2.

Gamiz et al, "3D Trigate 1T-DRAM memory Cell for 2x nm Nodes." Memory Workshop (IMW), 2012 4th IEEE International, IEEE, 2012, pp. 1-4.

Gamiz et al., "A 20nm low-power triple-gate multibody 1T-DRAM cell." VLSI Technology , Systems and Applications (VLSI-TSA), 2012 International Symposium on, IEEE, 2012, pp. 1-2.

Giusi et al., "Bipolar mode operation and scalability of double-gate capacitorless 1T-DRAM cells." Electron Devices, IEEE Transactions on, vol. 57, No. 8 (2010), pp. 1743-1750.

Gupta et al., "32nm high-density high-speed T-RAM embedded memory technology." Electron Devices meeting (IEDM), 2010 IEEE International, IEEE, 2010, pp. 12.1.1-12.1.4.

Han et al., "Bistable resistor (biristor)-gateless silicon nanowire memory." VLSI Technology (VLSIT), 2010 Symposium on, IEEE, 2010, pp. 171-172.

Han et al., "Biristor-Bistable resistor based on a silicon nanowire." Electron Device Letters, IEEE 31.8 (2010): 797-799.

Hulbert et al., "Experimental comparison of programming mechanisms in 1T-DRAM cells with variable channel length", Solid-State Device Research Conferences (ESSDERC), 2010 Proceedings of the European, pp. 150-153, Sep. 14-16, 2010.

Hwang et al., "Offset buried meatal gate vertical floating body memory technology with excellent retention time for DRAM application." VLSI Technology (VLSIT), 2011 Symposium on, IEEE, 2011, pp. 172-173.

Kim et al., "Vertical double gate Z-RAM technology with remarkable low voltage operation for DRAM application." VLSI Technology (VLSIT), 2010 symposium on, 2010, pp. 163-164.

Kim et al., "Silicon on replacement insulator (SRI) floating body cell (FBC) memory." VLSI Technology (VLSIT), 2010 Symposium on, IEEE, 2010, pp. 165-166.

Kim et al., "Optical charge-pumping: A universal trap characterization technique for nanoscale floating body devices." VLSI Technology (VLSIT), 2011 Symposium on, IEEE, 2011, pp. 190-191.

Kim et al., "Investigation of 1T Dram cell with non-overlap structure and recessed channel." Silicon Nanoelectronics Workshop (SNW), 2010, IEEE, 2010, pp. 1-2.

Lu et al., "A Simplified Superior floating-body/Gate DRAM Cell", IEEE Elec. Dev. Letters, vol. 30, No. 3, Mar. 2009, pp. 282-28.

Lu et al., "A Floating-Body/Gate DRAM Cell Upgraded for Long Retention Time", IEEE Elec. Dev. Letters, vol. 32, No. 6, pp. 731-733, Jun. 2011.

Liu et al., "A three-dimensional DRAM using floating body cell in FDSOI devices." Design and Diagnostics of Electronic Circuits & Systems (DDECS), 2012 IEEE 15th International Symposium on, IEEE, 2012, pp. 159-162.

Lee et al., "A Novel Capacitorless 1T Dram Cell for Data Retention Time Improvement." Nanotechnology, IEEE Transaction on, vol. 10, No. 3, 2011, pp. 462-466.

Leiss et al., "dRAM Design Using the Taper-Isolated Dynamic RAM Cell," Solid-State Circuits, IEEE Journal of, 17.2 (1982): 337-344.

Mahatme et al., "Total ionizing dose effects on ultra thin buried oxide floating body memories." Reliability Physics Symposium (IRPS), 2102 IEEE International, 2012, pp. 1-5.

Moon et al., "fin-width dependence of BJT-based 1T-DRAM implemented on FinFET." Electron Device Letters, vol. 31, No. 9 (2010): 909-911.

Moon et al., "An optically assisted program method for capacitorless 1T-DRAM." elect4ron Devices, IEEE Transaction on, vol. 57, No. 7, 2010, pp. 1714-1718.

Moon et al., "Multi-functional universal device using a band-engineered vertical structure." Electron Devices Meeting (IEDM), 2011 IEEE International, IEEE, 2011, pp. 24.6.1-24.6.4.

Moon et al., "Ultimately scaled 20nm unified-RAM." Electron Devices meeting (IEDM), 2010IEE International, IEEE, 2010, pp. 12.2.1-12.2.4.

Nicoletti et al., "The Dependence of Retention Time on Gate Length in UTBOX FBRAM With Different Source/Drain Junction Engineering." Electron Device Letters, vol. 33, No. 7, 2012, pp. 940-942.

Ohsawa et al., "A Novel Capacitor-less DRAM Cell: floating Body Cell", CRC Press, Taylor & Francis Group, 2012, pp. 1-7.

Ranica et al., "A non-transistor cell on bulk substrate (1T-Bulk) for low-cost and high density eDRAM." VLSI Technology, 2004, Digest of Technical Papers, 2004 Symposium on, IEEE, 2004, pp. 128-129.

Okhonin et al., "A Capaictor-less 1T-DRAM Cell", IEEE Electron Device Letters, vol. 23, No. 2, Feb. 2002, pp. 85-87.

Ohsawa et al., "Autonomous refresh of floating body cell (FBC)." Electron Devices Meeting, 2008, IEDM 2008, IEEE International, IEEE, 2008.

Ohsawa et al., "Memory Design Using One-Transistor Gain Cell on SOI", Tech. digest, IEEE International Solid-State Circuirs, vol. 37, No. 11, 2002, pp. 1510-1522.

Pulicani et al., "Simulation of intrinsic bipolar transistor mechanisms for future capacitor-less eDRAM on bulk substrate." Electronics, Circuits, and Systems (ICECS), 2010 17th IEEE International Conference on, IEEE, 2010, pp. 966-969.

Ranica et al., "Scaled 1T-Bulk devices built with CMOS 90nm technology for low-cost eDRAM applications." VLSI Technology, 2005, Digest of Technical Papers, 2005 Symposium on, IEEE, 2005, pp. 38-39.

Reisch, "ON bistable behavior and open-base breakdown of bipolar transistors in the avalanche regime-modeling and applications." Electron Devices, IEEE Transactions on, 39.6 (1992): 1398-1409.

Rodriguez et al., "A-RAM Novel capacitor-less DRAM memory." In SOI Conference,m 2009 IEEE International, pp. 1-2, IEEE, 2009.

Rodriguez et al., "Novel capacitorless 1T-DRAM cell for 22nm node compatible with bulk and SOI substrates." Electron Devices, IEEE Transactions on, vol. 58, No. 8 (2011), pp. 2371-2377.

Rodriguez et al., "A-RAM memory cell: concept and operation." Electron Device Letters, IEEE, vol. 31, No. 9 (2010), pp. 972-974.

Romanjek et al., "compact (Wg/Lg=80/85nm) FDSOI 1T-DRAM programmed by Meta Stable Dip", Ultimate integration on Silicon (ULIS), 2012 13th International Conference on, Mar. 6, 2012, pp. 199-202.

Rothemund et al., "The importance of being modular", Nature, vol. 485, May 2012, pp. 584-585.

Sakui et al., "A new static memory cell based on reverse base current (RBC) effect of bipolar transistors." Electron Devices, IEEE Transaction on , 36.6 (1989): 1215-1217.

Sakui et al., "A new static memory cell based on the reverse base current effect of bipolar transistors." Electron Devices, IEEE Transactions on, 36.6 (1989): 1215-1217.

Sze et al. "Physics of Semiconductor Devices", Wiley-Interscience, 2007, p. 104.

Shim et al., "A BJT-Based Heterostructure 1T-DRAM for Low-Voltage Operation." Electron Device Letters, vol. 33, No. 1, 2012, pp. 14-16.

(56) References Cited

OTHER PUBLICATIONS

Shin et al., "Vertical-Gate Si/SiGe Double-HBT-Based Capacitorless 1T Dram Cell for Extended Retention Time at Low Latch Voltage." Electron Device Letters, vol. 33, No. 2, 2012, pp. 134-136.
Shin et al . . . "A novel double HBT-based capacitorless 1T DRAM cell with Si/SiGe heterojunctions." Electron Device Letters, vol. 32, No. 7, 2011, pp. 850-852.
Tack et al., "The multistable charge-controlled memory effect in SOI MOS transistors at low temperatures." Electron Devices, IEEE Transactions on, 37.5 (1990): 1373-1382.
Terada et al., "A new VLSI memory cell using capacitance coupling (CC cell)." Electron devices, IEEE Transactions on, 31.9 (1984): pp. 1319-1324.
Ventrice et al., "Analytical model of deeply-scaled thyristors for memory applications." Microelectronics and Electron Devices (WMED), 2012 IEEE Workshop on, IEEE, 21012, pp. 1-4.
Villaret et al., "Furtehr insight into the physics and modeling of floating-body capacitorless DRAMs." Electron Devices, IEEE Transactions on, 52.11 (2005): pp. 2447-2454.
Wu et al., "Experimental Demonstration of the High-Performance floating-Body/Gate DRAM Cell for embedded memories", IEEE Elec. Dev. Letters, vol. 33, No. 6, Jun. 2012, pp. 743-745.
Zhang et al., "Total Ionizing Dose Effects on FinFET-Bsed Capacitor-Less 1T-DRAMs." Nuclear Science, IEEE Transactions on, vol. 57, No. 6, 2010, pp. 3298-3304.
Ban et al., A Scaled Floating body Cell (FBC) Memory with High-k+Metal Gate on Thin-Silicon and Thin-BOX for 16-nm Technology Node and Beyond, Symposium on VLSI Technology, 2008, pp. 92-93.
Campardo et al., "VLSI Design of Non-Volatile Memories", Springer Berlin Heidelberg New York, 2005. pp. 94-95.
Han et al., "Programming/Erasing Characteristics of 45 nm NOR-Type Flash Memory Based on SOI FinFET Structure.", J. Korean Physical Society, vol. 47, Nov. 2005, pp. S564-S567.
Headland, "Hot electron injection", Feb. 19, 2004, pp. 1-2.
Pellizer et al., "A 90nm Phase Cahnge Memory Technology for Stand-Alone Non-Volatile memory Applications", 2006 Symposium on VLSI Technology Digest of Technical Papers, 2006, pp. 1-2.
Ranica et al., "Scaled 1T-bulk devices built with CMOS 90nm technology for low-cost eDRAM applications.", 2005 Symposium on VLSI Technology Digest of Technical Papers, 2005, pp. 38-39.
Pierret, "Semiconductor Device Fundamentals", ISBN: 0-201-54393-1, 1996, Addison-Wesley Publishing Company, Inc., pp. 463-476.
Okhonin et al., "Principles of Transient charge Pumping on Partially-Depleted SOI MOSFETs", IEEE Electron Device Letters, vol. 23, No. 5, May 2002, pp. 279-281.
Okhonin et al., "A SOI Capacitor-less 1T DRAM Concept", 2001 IEEE International SOI Conference, pp. 153-154.
Ohsawa et al., "An 18.5ns 128Mb SOI DRAM with a Floating Body Cell", IEEE International Solid-State Circuits conference, 2005, pp. 458-459, 609.
Lanyon et al., "Bandgap Narrowing in Moderately to heavilyt doped Silicon", IEEE Transactions on Electron Devices, vol. ED-26, No. 7, Jul. 1979, pp. 1014-1018.
Yoshida et al., "A Design of a Capacitorless 1T-DRAM Cell Using Gate-Induced Drain leakage (GIDL) Current for Low-power and High-speed Embedded Memory", International Electron Devices Meeting, 2003, pp. 1-4.
Lin et al., "A new 1T DRAM Cell with enhanced Floating Body Effect", Proceedings of the 2006 IEEE International Workshop on Memory Technology, Desgin and Testing, 2006, pp. 1-5.
Oh et al., "a 4-Bit Double SONOS Memory (DSM) with 4 Storage Nodes per Cell for Ultimate Multi-Bit Operation", 2006 Symposium on VLSI Technology Digest of Technical Papers, 2006, pp. 1-2.
Ohsawa et al., "Autonomous refresh of floating body cell (FBC)", 1-4244-2377-4/08, 2008, pp. 801-804.
Ohsawa et al., "Autonomous Refresh of Floating Body Cell due to Current Anomaly of Impact Ionization", IEEE Transactions on Electronic Devices, vol. 56, No. 10, Oct. 2009, pp. 2302-2311.
Cho et al., "A novel capacitor-less DRAM cell using Thin Capacitively-Coupled Thyristor (TCCT)", T-RAM Semiconductor, San Jose, CA, 2005, pp. 1-4.
Celler et al., "Frontiers of silicon-on-insulator", Journal of Applied Physics, vol. 93, No. 9, May 1, 2003, pp. 4956-4978.
Langholz et al., "Foundations of Digital Logic Design", World Scientific Publishing Company Pte Ltd, 1998, pp. 339-342, 244.
Montanaro et al., "A 160-MHz, 32-b, 0.5-W CMOS RISC Microprocessor", IEEE Journal of Solid-State Circuits, vol. 31, No. 11, Nov. 1996, pp. 1703-1714.
Song et al., "55nm Capacitor-less 1T DRAM Cell Transistor with Non-Overlap Structure", IEEE, 2008, pp. 797-800.
Sugizaki et al., "Ultra High-speed Novel Bulk Thyristor-SRAM (BT-RAM) Cell with Selective Epitaxy Anode (SEA)", Sony Corporation, 2006, IEEE, pp. 1-4.

Floating Body 24 is positively charged and V(BL 18) = 0.0V

FB is neutrally charged: and V(BL 18) = V(FB 24) = 0V

MEMORY DEVICE HAVING ELECTRICALLY FLOATING BODY TRANSISTOR

CROSS-REFERENCE

This application is a continuation of U.S. application Ser. No. 17/207,687, filed Mar. 21, 2021, now U.S. Pat. No. 11,417,657, which is a continuation of U.S. application Ser. No. 16/827,373, filed Mar. 23, 2020, now U.S. Pat. No. 10,978,455, which is a continuation of U.S. application Ser. No. 16/224,534, filed Dec. 18, 2018, now U.S. Pat. No. 10,629,588, which is a continuation of U.S. application Ser. No. 15/867,877, filed Jan. 11, 2018, now U.S. Pat. No. 10,192,872, which is a continuation of U.S. application Ser. No. 15/403,757, filed Jan. 11, 2017, now U.S. Pat. No. 9,893,067, which is a continuation of U.S. application Ser. No. 14/955,339, filed Dec. 1, 2015, now U.S. Pat. No. 9,576,962, which is a division of U.S. application Ser. No. 13/746,523, filed Jan. 22, 2013, now U.S. Pat. No. 9,230,651, which claims the benefit of U.S. Provisional Application Ser. No. 61/621,546 filed Apr. 8, 2012, all of which applications and patents are hereby incorporated herein, in their entireties, by reference thereto. Priority to application Ser. Nos. 17/207,687; 16/827,373; 16/224,534; 15/867,877; 15/403,757; 14/955,339 and 13/746,523 is claimed pursuant to 35 U.S.C. § 120 and priority to Application Ser. No. 61/621,546 is claimed pursuant to 35 U.S.C. § 119.

FIELD OF THE INVENTION

The present invention relates to semiconductor memory technology. More specifically, the present invention relates to a semiconductor memory device having an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "dRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, all of which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17th IEEE International Conference on Electronics, Circuits, and Systems (ICECS) ("Pulicani"), all of which are hereby incorporated herein, in their entireties, by reference thereto).

Widjaja and Or-Bach describes a bi-stable SRAM cell incorporating a floating body transistor, where more than one stable state exists for each memory cell (for example as described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto). This bi-stability is achieved due to the applied back bias which causes impact ionization and generates holes to compensate for the charge leakage current and recombination.

As memory cells are being scaled to smaller feature size, the variability in memory cells characteristics also increase, for example due to the Random Dopant Fluctuation (RDF). A purpose of this invention is to provide an improvement of the variability of memory cells characteristics.

SUMMARY OF THE INVENTION

In one aspect of the present invention, a semiconductor memory cell comprises: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; and a back-bias region configured to generate impact ionization when the memory cell is in one of the first and second states, and wherein the back-bias region is configured so as not to generate impact ionization when the memory cell is in the other of the first and second states.

In at least one embodiment, the memory cell further comprises a substrate region, wherein the back-bias region is positioned between the substrate region and the floating body region.

In at least one embodiment, the floating body region comprises first and second subregions, wherein the first subregion has a first doping concentration level and the second region has a second doping concentration level, and wherein the first doping concentration is different from the second doping concentration level.

In at least one embodiment, the first and second subregions have the same conductivity type.

In at least one embodiment, the first subregion is further from the back-bias region than a distance from the second subregion to the back bias region, and wherein the second doping concentration level is greater than the first doping concentration level.

In at least one embodiment, the floating body region further comprises a third subregion, the third subregion having a third doping concentration level, wherein the third doping concentration level is different from at least one of the first and second doping concentration levels.

In at least one embodiment, the first subregion is furthest from the back-bias region, relative to the second and third subregions, and the first doping concentration level is lowest relative to the second and third doping concentration levels.

In at least one embodiment, the memory cell the first and second subregions are localized so that they do not underlie the first and second regions.

In at least one embodiment, the memory cell further comprises at least one halo region adjacent to at least one of the first and second regions, wherein each halo region comprises a first conductivity type selected from p-type conductivity type and n-type conductivity type; and wherein the first and second regions each comprise a second conductivity type selected from the p-type conductivity type and the n-type conductivity type, wherein the second conductivity type is different from the first conductivity type.

In at least one embodiment, the first and second states are stable states.

In another aspect of the present invention, a semiconductor memory cell comprises a floating body region configured to be charged to a level indicative of a state of the memory cell selected from at least first and second states; a first region in electrical contact with the floating body region; and a back-bias region configured to maintain a charge in the floating body region; wherein the first region, the floating body region, and the back-bias region form a bipolar transistor where the product of forward emitter gain and impact ionization efficiency of the bipolar transistor approaches unity.

In at least one embodiment, the back-bias region is configured to generate impact ionization when the memory cell is in one of the first and second states, and wherein the back-bias region is configured so as not to generate impact ionization when the memory cell is in the other of the first and second states.

In at least one embodiment, the memory cell further comprises a second region in electrical contact with the floating body region and spaced apart from the first region.

In at least one embodiment, the memory cell further comprises a gate region positioned above the floating body region.

In at least one embodiment, the memory cell further comprises a substrate region, wherein the back-bias region is positioned between the substrate region and the floating body region.

In at least one embodiment, the first and second states are stable states.

In at least one embodiment, the memory cell the floating body region comprises first and second subregions, wherein the first subregion has a first doping concentration level and the second region has a second doping concentration level, and wherein the first doping concentration is different from the second doping concentration level.

In another aspect of the present invention, a semiconductor memory cell comprises a floating body region configured to be charged to a level indicative of a state of the memory cell selected from at least first and second states; wherein the floating body region acts as a base region of a first bipolar transistor that maintains the state of the memory cell; and wherein the floating body region acts as a base region of a second bipolar transistor that is used to perform at least one of reading and writing the state of the memory cell.

In at least one embodiment, the memory cell further comprises a back-bias region configured to maintain a charge in the floating body region.

In at least one embodiment, the first and second states are stable states.

In at least one embodiment, the product of forward emitter gain and impact ionization efficiency of the first bipolar transistor approaches unity when the memory cell is in one of the first and second states, and wherein impact ionization, when the memory cell is in the other of the first and second states is less than the impact ionization when the memory cell is in the one of the first and second states.

In at least one embodiment, current flow through the first bipolar transistor is larger when the memory cell is in one of the first and second states than when the memory cell is in the other of the first and second states.

In at least one embodiment, the memory cell states are maintained through impact ionization.

In another aspect of the present invention, a semiconductor memory cell comprises: a floating body region configured to be charged to a level indicative of a state of the memory cell selected from at least first and second states; and a back-bias region located below the floating body region; wherein the back-bias region acts as a collector region of a bipolar transistor that maintains the state of the memory cell.

In at least one embodiment, the first and second states are stable.

In at least one embodiment, the product of forward emitter gain and impact ionization efficiency of the bipolar transistor that maintains the state of the memory cell approaches unity when the memory cell is in one of the first and second states, and wherein impact ionization, when the memory cell is in the other of the first and second states is less than the impact ionization when the memory cell is in the one of the first and second states.

In at least one embodiment, current flow through the bipolar transistor is larger when the memory cell is in one of the first and second states than when the memory cell is in the other of the first and second states.

In at least one embodiment, the memory cell states are maintained through impact ionization.

In at least one embodiment, the back-bias region is configured to generate impact ionization when the memory cell is in one of the first and second states, and the back-bias region is configured so as not to generate impact ionization when the memory cell is in the other of the first and second states.

These and other features of the invention will become apparent to those persons skilled in the art upon reading the details of the memory cells, arrays and methods as more fully described below.

DETAILED DESCRIPTION OF THE INVENTION

Before the present memory cells, arrays and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a substrate terminal" includes a plurality of such substrate terminals and reference to "the region" includes reference to one or more regions and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Figure 1:
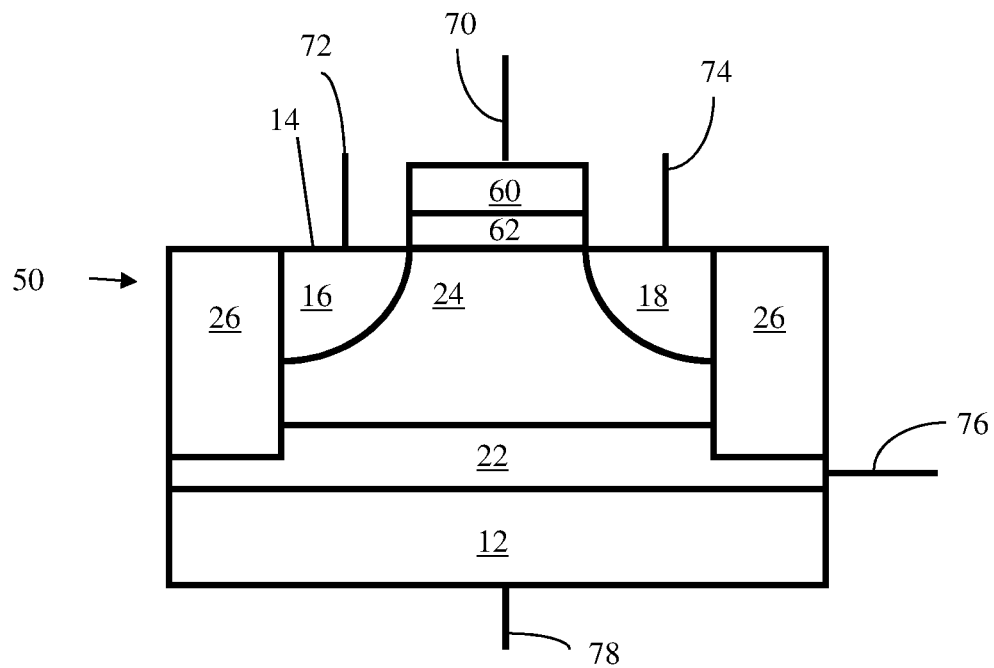
FIG. 1 is a schematic, cross-sectional illustration of a memory cell according to the present invention.

Referring to FIG. 1, a memory cell 50 according to an embodiment of the present invention is shown. Memory cell 50 includes a substrate 12 of a first conductivity type such as p-type, for example. Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment shown in FIG. 2, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to region 12A. To simplify the description, the substrate 12 will usually be drawn as the semiconductor bulk material as it is in FIG. 1.

Memory cell 50 also includes a buried layer region 22 of a second conductivity type, such as n-type, for example; a floating body region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can be grown epitaxially on top of substrate 12 or formed through a solid state diffusion process.

The floating body region 24 of the first conductivity type is bounded on top by source line region 16, drain region 18, and insulating layer 62 (or by surface 14 in general), on the sides by insulating layer 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example, is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 2:
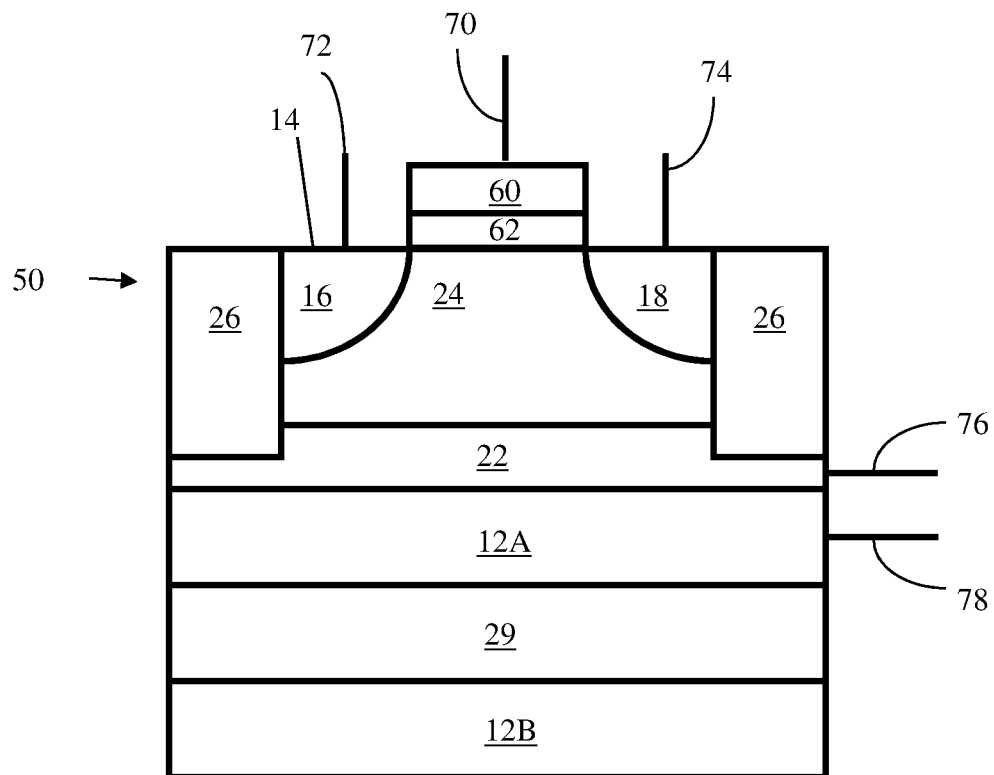
FIG. 2 is a schematic, cross-sectional illustration of a memory cell according to another embodiment of the present invention.
Figure 3A:
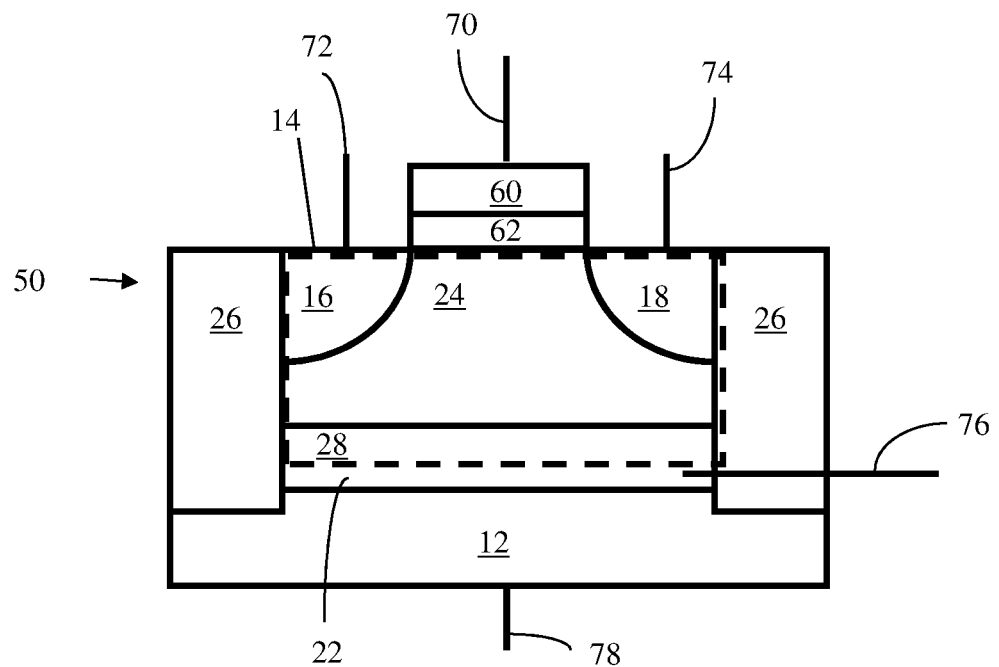
FIG. 3A is a schematic, cross-sectional illustration of a memory cell according to another embodiment of the present invention.
Figure 3B:
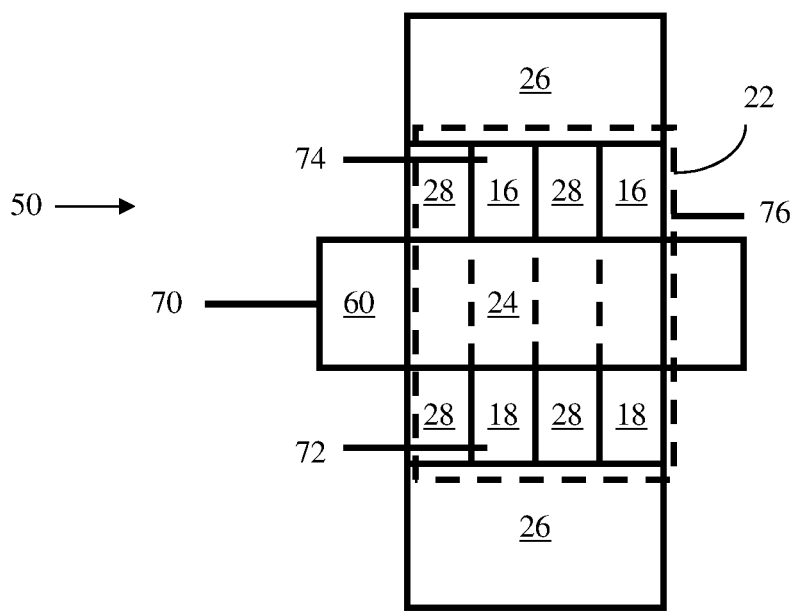
FIG. 3B is a schematic, top-view illustration of the memory cell shown in FIG. 3A.

Insulating layers 26 (like, for example, shallow trench isolation (STI)), may be made of silicon oxide, for example, though other insulating materials may be used. Insulating layers 26 insulate memory cell 50 from adjacent memory cell 50. The bottom of insulating layer 26 may reside inside the buried region 22 allowing buried region 22 to be continuous as shown in FIGS. 1 and 2. Alternatively, the bottom of insulating layer 26 may reside below the buried region 22 as in FIGS. 3A and 3B (shown better in FIG. 3A). This requires a shallower insulating layer 28, which insulates the floating body region 24, but allows the buried layer 22 to be continuous in the perpendicular direction of the cross-sectional view shown in FIG. 3A. For simplicity, only memory cell 50 with continuous buried region 22 in all directions will be shown from hereon.

Cell 50 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Figure 4:
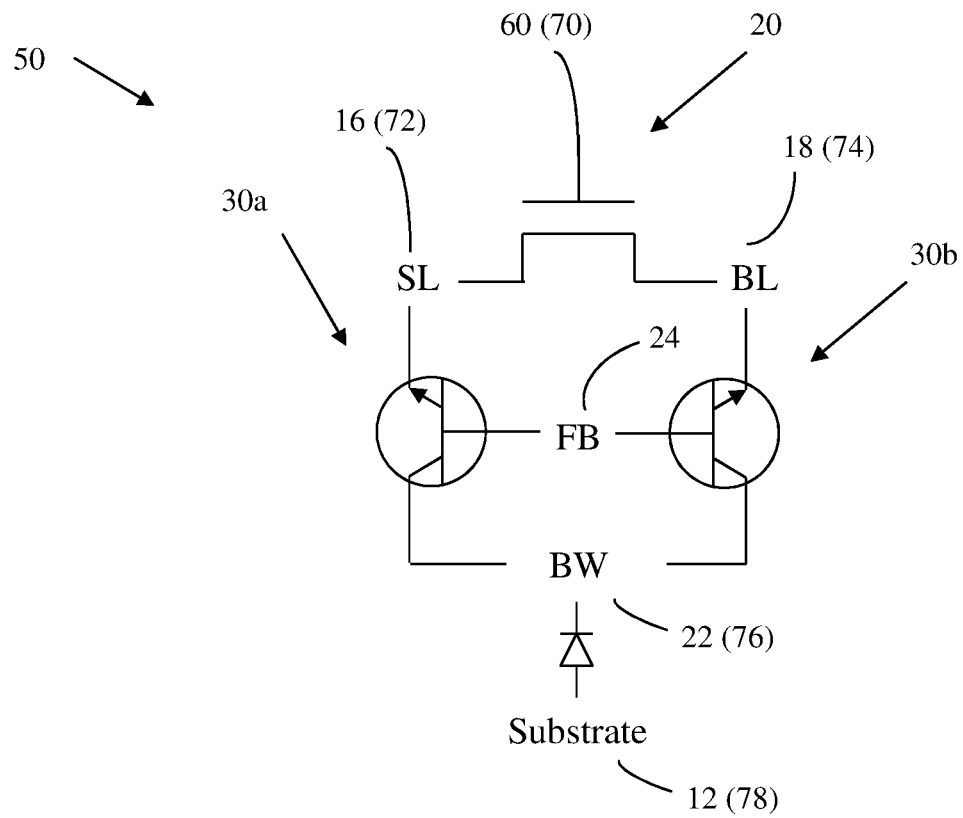
FIG. 4 schematically illustrates an equivalent circuit representation of the memory cells shown in FIGS. 1-3.

FIG. 4 illustrates an equivalent circuit representation of memory cell 50. Inherent in memory cell 50 are metal-oxide-semiconductor (MOS) transistor 20, formed by source line region 16, gate 60, bit line region 18, and floating body region 24, and bipolar devices 30a and 30b, formed by buried well region 22, floating body region 24, and source line region 16 or bit line region 18, respectively.

Figure 5:
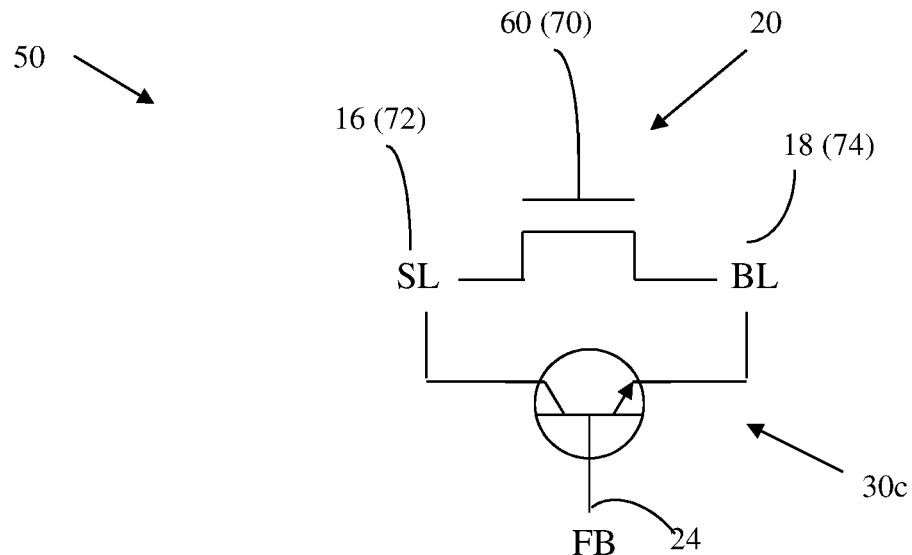
FIG. 5 schematically illustrates a bipolar device inherent in memory devices of FIGS. 1-3.

Also inherent in memory device 50 is bipolar device 30c, formed by source line region 16, floating body 24, and bit line region 18. For drawings clarity, bipolar device 30c is shown separately in FIG. 5.

Figure 6:
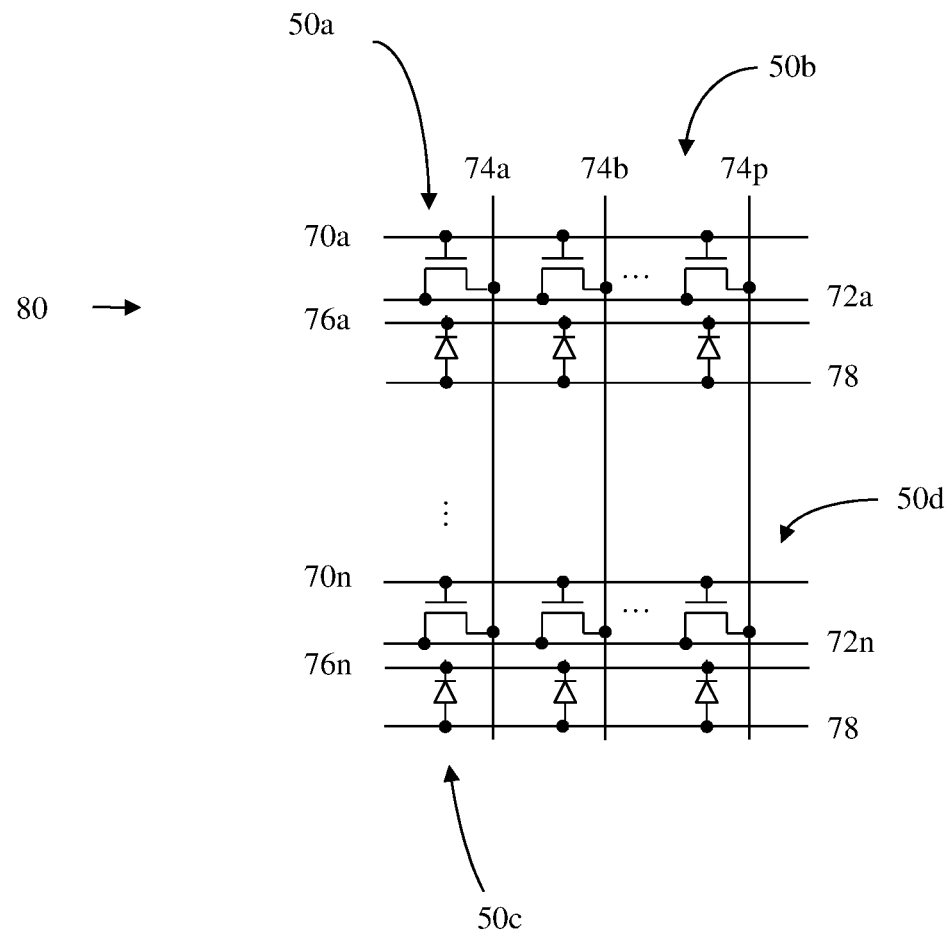
FIG. 6 schematically illustrates multiple cells of the type shown in FIGS. 1-3 joined to make a memory array.

FIG. 6 schematically illustrates an exemplary embodiment of a memory array 80 of memory cells 50 (four exemplary instances of memory cell 50 being labeled as 50a, 50b, 50c and 50d) arranged in rows and columns. In many, but not all, of the figures where array 80 appears, representative memory cell 50a will be representative of a "selected" memory cell 50 when the operation being described has one (or more in some embodiments) selected memory cell(s) 50. In such figures, representative memory cell 50b will be representative of an unselected memory cell 50 sharing the same row as selected representative memory cell 50a, representative memory cell 50c will be representative of an unselected memory cell 50 sharing the same column as selected representative memory cell 50a, and representative memory cell 50d will be representative of an unselected memory cell 50 sharing neither a row or a column with selected representative memory cell 50a.

Present in FIG. 6 are word lines 70a through 70n, source lines 72a through 72n, bit lines 74a through 74p, buried well terminals 76a through 76n, and substrate terminal 78. Representation of the lines/terminal with letters a-n or a through p, includes not only embodiments which include literally twelve lines/terminals (i.e., a,b,c,d,e,f,g,h,i,j,k,l,m,n,o,p) or fourteen lines/terminals (i.e., a,b,c,d,e,f,g,h,i,j,k,l,m,n,o,p), but is meant to more generically represent a plurality of such line terminals, which can be less than twelve (i.e., as low as one given that there is a plurality of cells and at least one row and at least one column) or greater than twelve, thirteen or fourteen (much greater than fourteen up to any positive integer practical)).

Each of the source lines 72a through 72n is associated with a single row of memory cells 50 and is coupled to the source line region 18 of each memory cell 50 in that row. Each of the bit lines 74a through 74p is associated with a single column of memory cells 50 and is coupled to the bit line region 16 of each memory cell 50 in that column.

Substrate 12 is present at all locations under array 80. Persons of ordinary skill in the art will appreciate that one or more substrate terminals 78 may be present in one or more locations. Such skilled persons will also appreciate that although array 80 is shown in FIG. 6 as a single continuous array, many other organizations and layouts are possible. For example, word lines may be segmented or buffered, bit lines may be segmented or buffered, source lines may be segmented or buffered, the array 80 may be broken into two or more sub-arrays, control circuits such as word decoders, column decoders, segmentation devices, sense amplifiers, write amplifiers may be arrayed around array 80 or inserted between sub-arrays of array 80. Thus the present invention is not limited to the exemplary embodiments, features, design options, etc., shown and described.

Several operations can be performed by memory cell 50 such as holding, read, write logic-1 and write logic-0 operations, and have been described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto.

Figure 7:
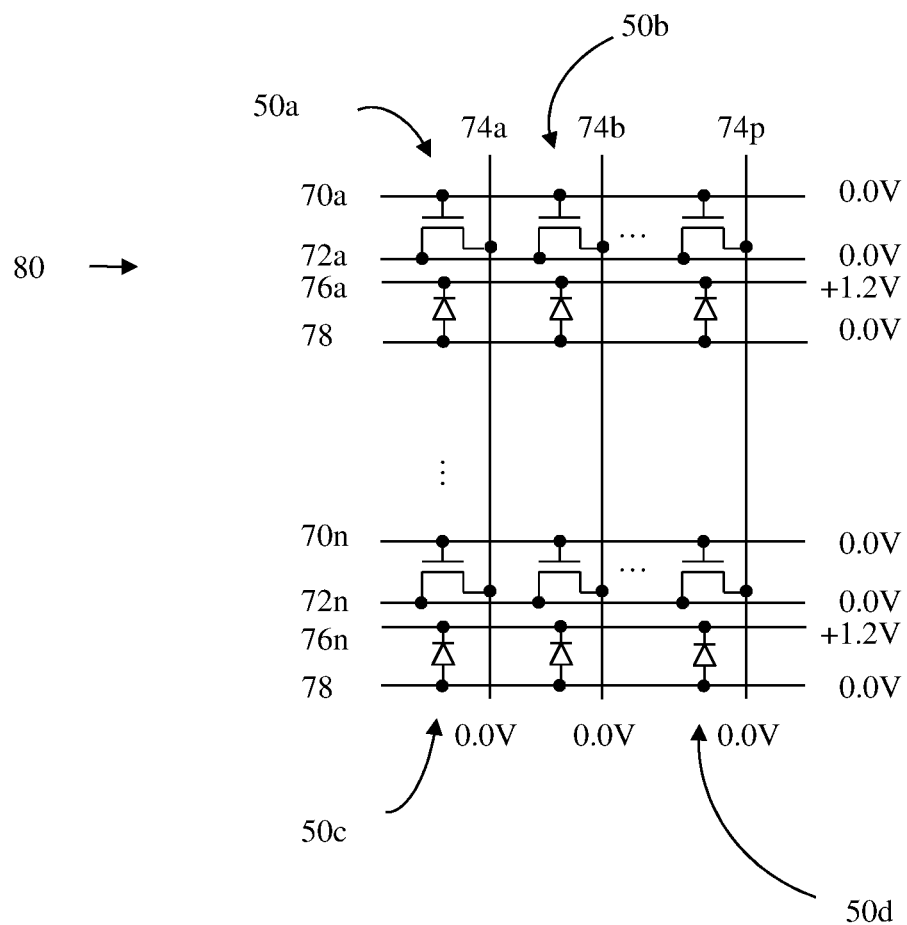
FIG. 7 schematically illustrates a holding operation performed on a memory array according to an embodiment of the present invention.
Figure 8:
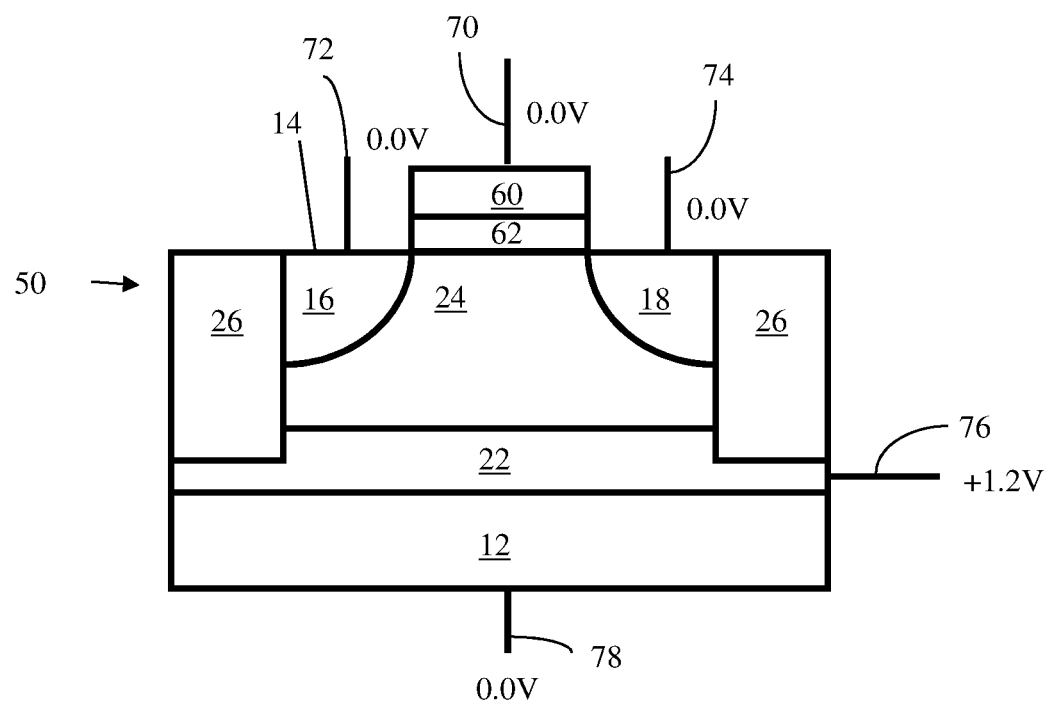
FIG. 8 illustrates exemplary bias conditions applied on the terminals of a memory cell of the array of FIG. 7.

FIG. 7 schematically illustrates performance of a holding operation on memory array 80, while FIG. 8 shows the bias applied on the terminals of a memory cell 50 during the holding operation, according to an exemplary, non-limiting embodiment. The holding operation is performed by applying a positive back bias to the BW terminal 76, zero or negative bias on the WL terminal 70, zero bias on the BL terminal 74, SL terminal 72, and substrate terminal 78. Alternatively, the substrate terminal 78 may be left floating. In another embodiment, one of the SL terminal 72 or BL terminal 74 may be left floating. The positive back bias applied to the buried layer region 22 connected to the BW terminal 76 will maintain the state of the memory cell 50 that it is connected to. The positive bias applied to the BW terminal 76 needs to generate an electric field sufficient to trigger an impact ionization mechanism when the floating body region 24 is positively charged, as will be described through the band diagram shown in FIGS. 9A and 9B. The impact ionization rate as a function of the electric field is for example described in "Physics of Semiconductor Devices", Sze S. M. and Ng K. K., which is hereby incorporated herein, in its entirety, by reference thereto.

In one embodiment the bias conditions for the holding operation on memory cell 50 are: 0 volts is applied to WL terminal 70, 0 volts is applied to BL terminal 74, 0 volts is applied to SL terminal 72, a positive voltage, for example, +1.2 volts is applied to BW terminal 76, and 0 volts is applied to the substrate terminal 78. In other embodiments, different voltages may be applied to the various terminals of memory cell 50 and the exemplary voltages described are not limiting.

Figure 9A:
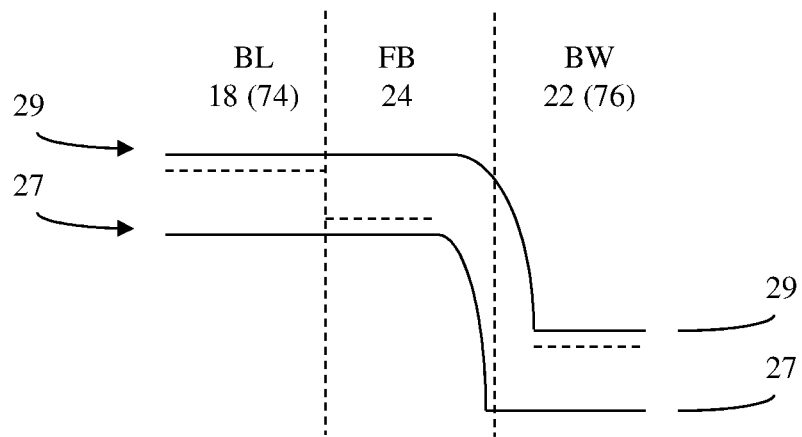
FIG. 9A shows an energy band diagram characterizing an intrinsic bipolar device when a floating body region is positively charged and a positive bias is applied to a buried well region of a memory cell according to an embodiment of the present invention.

FIG. 9A shows an energy band diagram characterizing the intrinsic n-p-n bipolar device 30*b* when the floating body region 24 is positively charged and a positive bias voltage is applied to the buried well region 22. The vertical dashed lines mark the different regions of the bipolar device 30*b*. The energy band diagram of the intrinsic n-p-n bipolar device 30*a* can be constructed in a similar manner, with the source line region 16 (connected to the SL terminal 72) in place of the bit line region 18 (connected to the BL terminal 74). The horizontal dashed lines indicate the Fermi levels in the various regions of the n-p-n transistor 30*b*. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic "1", the bipolar transistors 30*a* and 30*b* will be turned on as the positive charge in the floating body region lowers the energy barrier of electron flow (from the source line region 16 or bit line region 18) into the base region (floating body region 24). Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. When the following condition is met: $\beta \times (M-1) \approx 1$—where $\beta$ is the forward common-emitter current gain of the bipolar transistors 30*a* or 30*b* and M is the impact ionization coefficient—the amount of holes injected into the floating body region 24 compensates for the charge lost due to p-n junction forward bias current between the floating body region 24 and the source line region 16 or bit line region 18 and due to holes recombination. This process maintains the charge (i.e. holes) stored in the floating body region 24 which will keep the n-p-n bipolar transistors 30*a* and 30*b* on for as long as a positive bias is applied to the buried well region 22 through BW terminal 76.

The region where the product $\beta \times (M-1)$ approaches 1 and is characterized by hole current moving into the base region of a bipolar transistor is sometimes referred to as the reverse base current region and has been described for example in "A New Static Memory Cell Based on Reverse Base Current (RBC) Effect of Bipolar Transistor", K. Sakui et al., pp. 44-47, International Electron Devices Meeting, 1988 ("Sakui-1"), "A New Static Memory Cell Based on the Reverse Base Current Effect of Bipolar Transistors", K. Sakui et al., pp. 1215-1217, IEEE Transactions on Electron Devices, vol. 36, no. 6, June 1989 ("Sakui-2"), "On Bistable Behavior and Open-Base Breakdown of Bipolar Transistors in the Avalanche Regime—Modeling and Applications", M. Reisch, pp. 1398-1409, IEEE Transactions on Electron Devices, vol. 39, no. 6, June 1992 ("Reisch"), which are hereby incorporated herein, in their entireties, by reference thereto.

The latching behavior based on the reverse base current region has also been described in a biristor (i.e. bi-stable resistor) for example in "Bistable resistor (Biristor)—Gateless Silicon Nanowire Memory", J.-W. Han and Y.-K. Choi, pp. 171-172, 2010 Symposium on VLSI Technology, Digest of Technical Papers, 2010 "("J.-W. Han"), which is hereby incorporated herein, in its entirety, by reference thereto. In a two-terminal biristor device, a refresh operation is still required. J.-W. Han describes a 200 ms data retention for the silicon nanowire biristor memory. In memory cell 50, the state of the memory cell is maintained due to the vertical bipolar transistors 30*a* and 30*b*, while the remaining cell operations (i.e. read and write operations) are governed by the lateral bipolar transistor 30*c* and MOS transistor 20. Hence, the holding operation does not require any interruptions to the memory cell 50 access.

If floating body 24 is neutrally charged (the voltage on floating body 24 being equal to the voltage on grounded bit line region 18), a state corresponding to logic-0, no (or low) current will flow through the n-p-n bipolar devices 30*a* and 30*b*. The bipolar devices 30*a* and 30*b* will remain off and no impact ionization occurs. Consequently memory cells in the logic-0 state will remain in the logic-0 state.

Figure 9B:
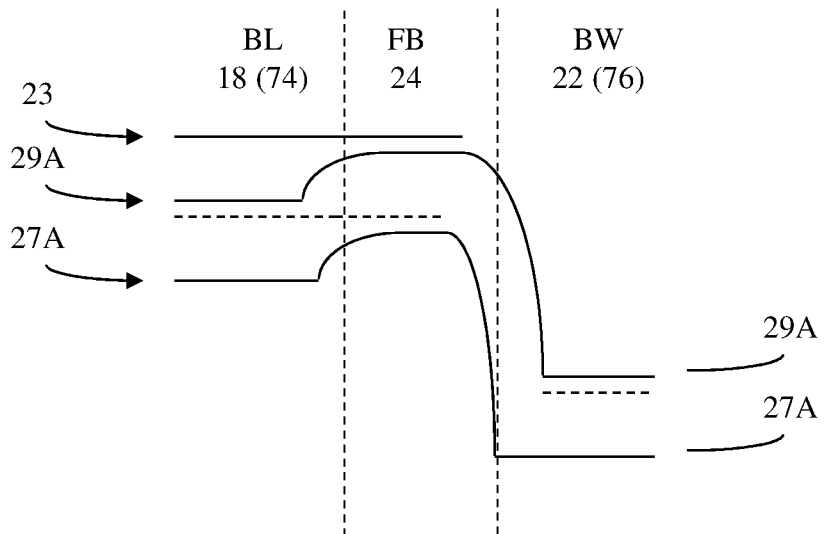
FIG. 9B shows an energy band diagram of an intrinsic bipolar device when a floating body region is neutrally charged and a positive bias is applied to a buried well region of a memory cell according to an embodiment of the present invention.

FIG. 9B shows an energy band diagram of the intrinsic bipolar device 30*a* when the floating body region 24 is neutrally charged and a bias voltage is applied to the buried well region 22. In this state the energy level of the band gap bounded by solid lines 27A and 29A is different in the various regions of n-p-n bipolar device 30*a*. Because the potential of the floating body region 24 and the bit line region 18 is equal, the Fermi levels are constant, resulting in an energy barrier between the bit line region 18 and the floating body region 24. Solid line 23 indicates, for reference purposes, the energy barrier between the bit line region 18 and the floating body region 24. The energy barrier prevents electron flow from the bit line region 18 (connected to BL terminal 74) to the floating body region 24. Thus the n-p-n bipolar device 30a and 30b will remain off.

Sakui-1 and Sakui-2 describe a memory cell based on the reverse base current effect, where the base of a n-p-n bipolar transistor is connected to a p-type MOS transistor. Reisch describes the challenges with the memory cell described in Sakui-1 and Sakui-2, which includes the requirement for the current of the p-type MOS transistor. Because the collector terminal of the bipolar transistor also serves as the channel of the p-type MOS transistor, any changes in operating conditions or process conditions will affect both the bipolar transistor and the p-type MOS transistor. For example, increasing the doping level of the collector region will improve the impact ionization efficiency. However, it will also increase the doping level of the p-type MOS transistor channel region, and reduces the drive current of the p-type MOS transistor.

An autonomous refresh for a floating body memory, without requiring to first read the memory cell state, has been described for example in "Autonomous Refresh of Floating Body Cell (FBC)", Ohsawa et al., pp. 801-804, International Electron Device Meeting, 2008 ("Ohsawa"), U.S. Pat. No. 7,170,807 "Data Storage Device and Refreshing Method for Use with Such Device", Fazan et al. ("Fazan"), which are hereby incorporated herein, in their entireties, by reference thereto. Ohsawa and Fazan teach an autonomous refresh method by applying a periodic gate and drain voltage pulses, which interrupts access to the memory cells being refreshed. In memory cell 50, more than one stable state is achieved because of the vertical bipolar transistors 30a and 30b. The read and write operations of the memory cell 50 are governed by the lateral bipolar transistor 30c and MOS transistor 20. Hence, the holding operation does not require any interruptions to the memory cell 50 access.

In the holding operation described with regard to FIG. 7, there is no individually selected memory cell. Rather the holding operation will be performed at all cells connected to the same buried well terminal 76. In addition, the holding operation does not interrupt read or write access to the memory cell 50.

Figure 10:
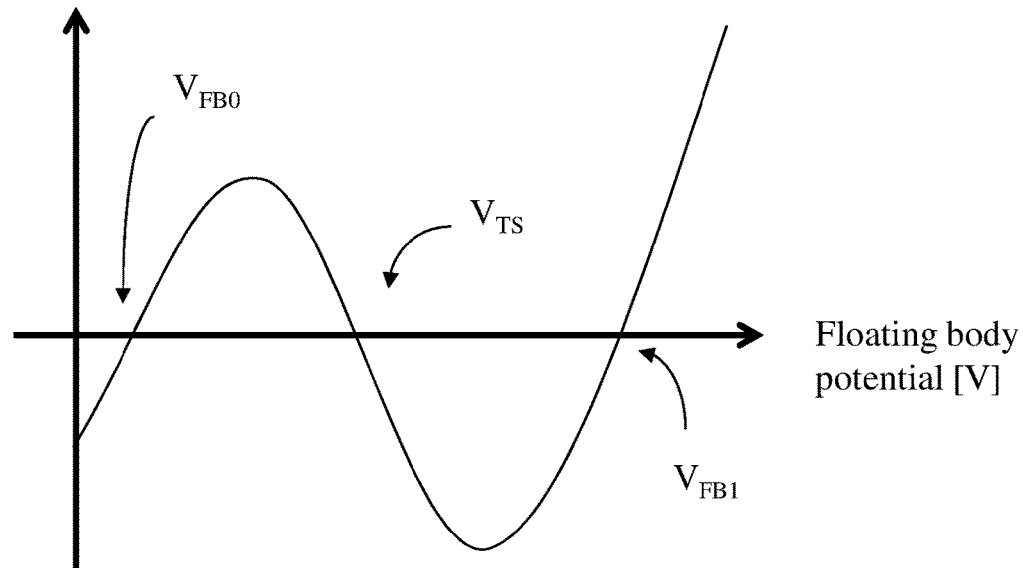
FIG. 10 shows a graph of the net current I flowing into or out of a floating body region as a function of the potential V of the floating body, according to an embodiment of the present invention.

FIG. 10 shows a graph of the net current I flowing into or out of the floating body region 24 as a function of the potential V of the floating body 24 (not drawn to scale). A negative current indicates a net current flowing into the floating body region 24, while a positive current indicates a net current flowing out of the floating body region 24. At low floating body 24 potential, between 0V and $V_{FB0}$ indicated in FIG. 10, the net current is flowing into the floating body region 24 as a result of the p-n diode formed by the floating body region 24 and the buried well region 22 being reverse biased. If the value of the floating body 24 potential is between $V_{FB0}$ and $V_{TS}$, the current will switch direction, resulting in a net current flowing out of the floating body region 24. This is because of the p-n diode, formed by the floating body region 24 and the buried well region 22, being forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the p-n diode leakage current. When the floating body 24 potential is higher than $V_{FB1}$, the net current will be out of the floating body region 24. This is because the p-n diode leakage current is once again greater than the base current of the bipolar devices 30a and 30b.

Figure 11:
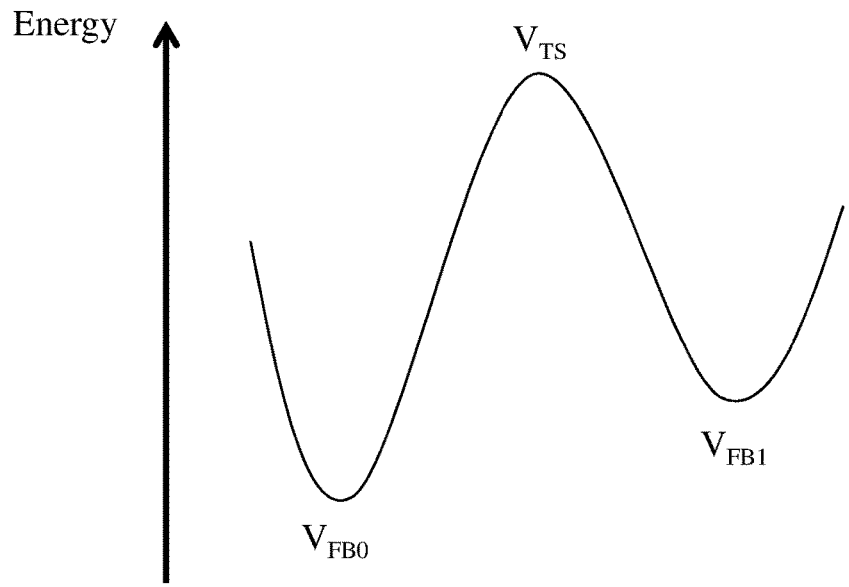
FIG. 11 shows a schematic curve of a potential energy surface (PES) of a memory cell according to an embodiment of the present invention.

The holding operation results in the floating body memory cell having two stable states: the logic-0 state and the logic-1 state separated by an energy barrier, which are represented by $V_{FB0}$, $V_{FB1}$, and $V_{TS}$, respectively. FIG. 11 shows a schematic curve of a potential energy surface (PES) of the memory cell 50, which shows another representation of the two stable states resulting from applying a back bias to the BW terminal 76 (connected to the buried well region 22).

The values of the floating body 24 potential where the current changes direction, i.e. $V_{FB0}$, $V_{FB1}$, and $V_{TS}$, can be modulated by the potential applied to the BW terminal 76. These values are also temperature dependent.

Figure 12:
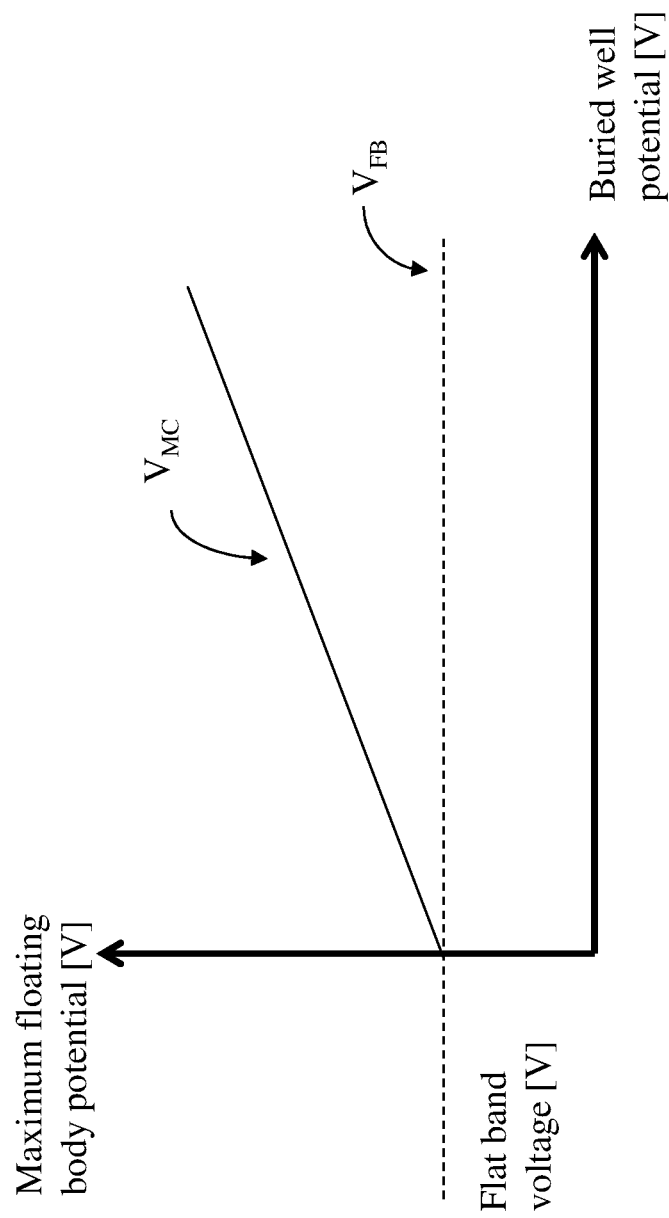
FIG. 12 illustrates a charge stored in a floating body region of a memory cell as a function of a potential applied to a buried well region, connected to a BW terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to substrate terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the substrate terminal 78 as shown in FIG. 12. The increase in the maximum charge stored in the floating body 24 results in a larger memory window.

Floating body DRAM cells described in Ranica-1, Ranica-2, Villaret, and Pulicani only exhibit one stable state, which is often assigned as logic-0 state. Villaret describes the intrinsic bipolar transistors enhance the data retention of logic-1 state, by drawing the electrons which otherwise would recombine with the holes stored in the floating body region. However, only one stable state is observed because there is no hole injection into the floating body region to compensate for the charge leakage and recombination.

The operation range to satisfy the holding operation condition $\beta \times (M-1) \approx 1$ is low $\beta$ and high M to high $\beta$ and low M. The low $\beta$, high M condition is preferred as it results in a lower power for the holding operation since the current flow (from the collector (BW terminal 76) to the emitter (source line region 16 or bit line region 18) is proportional to $\beta$. Therefore, the lower the common-emitter gain $\beta$ (i.e. the closer $\beta$ is to 1), the lower the current consumed during the holding operation is (a common value of $\beta$ would be between 20 and 500). Process conditions that result in low $\beta$, high M will be described below, following discussion on the read and write operations.

The read and write operations of the memory cell have been described, for example, in Widjaja-1 and Widjaja-2. An active low read scheme—where the selected BL terminal 74 is biased at low voltage, for example, at zero voltage—will be described in FIGS. 13 and 14, where the following bias conditions are applied: a positive voltage is applied to the BW terminal 76a, a positive voltage is applied to the selected SL terminal 72a, zero voltage is applied to the selected BL terminal 74a, a positive voltage applied to the selected WL terminal 70a, while zero voltage is applied to the substrate terminal 78a. The positive voltage applied to SL terminal 72 may be less than the positive voltage applied to WL terminal 70, in which the difference in the threshold voltage of the memory cell 50 is employed to represent the state of the memory cell 50. The positive voltage applied to SL terminal 72 may also be greater than or equal to the positive voltage applied to WL terminal 70 and may generate sufficiently high electric field to trigger the bipolar read mechanism. When cell 50 is in an array 80 of cells 50, the unselected BL terminals 74 (e.g., 74b, . . . , 74n) will be biased at the same voltage applied to the selected SL terminal, the unselected SL terminals 72 will be at zero voltage, and the unselected WL terminals 70 (e.g., 70n and any other WL terminals 70 not connected to selected cell 50a) will remain at zero or negative voltage.

Figure 13:
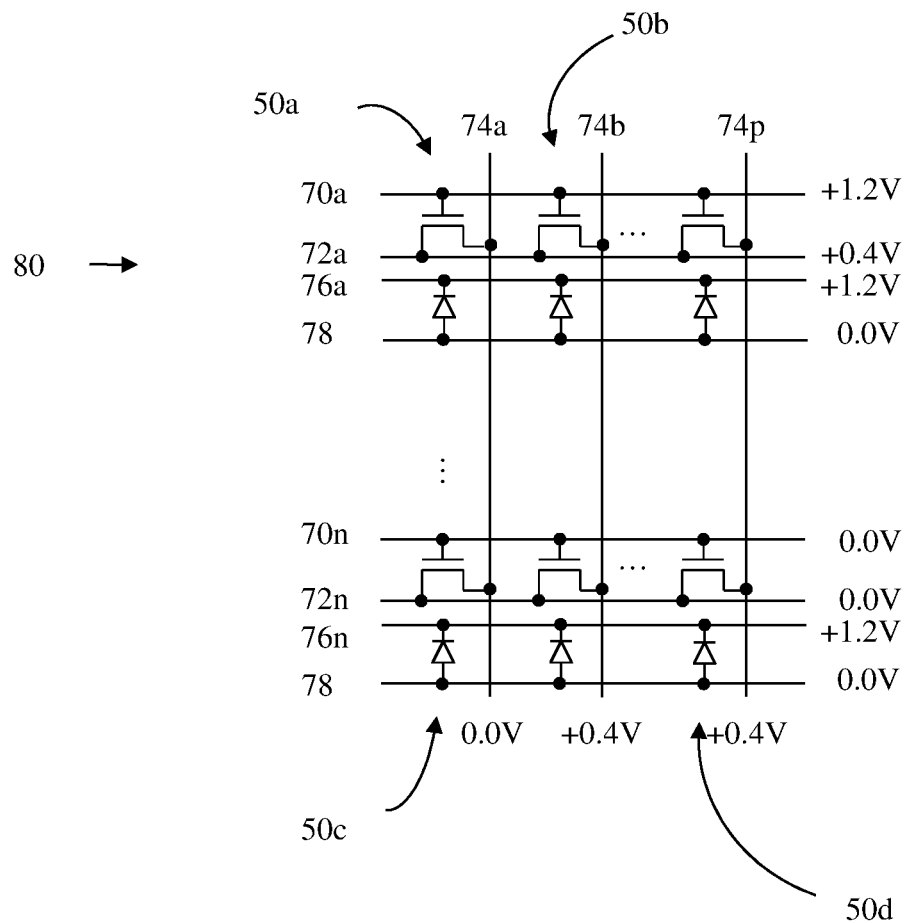
FIG. 13 schematically illustrates a read operation performed on a memory array according to an embodiment of the present invention.
Figure 14:
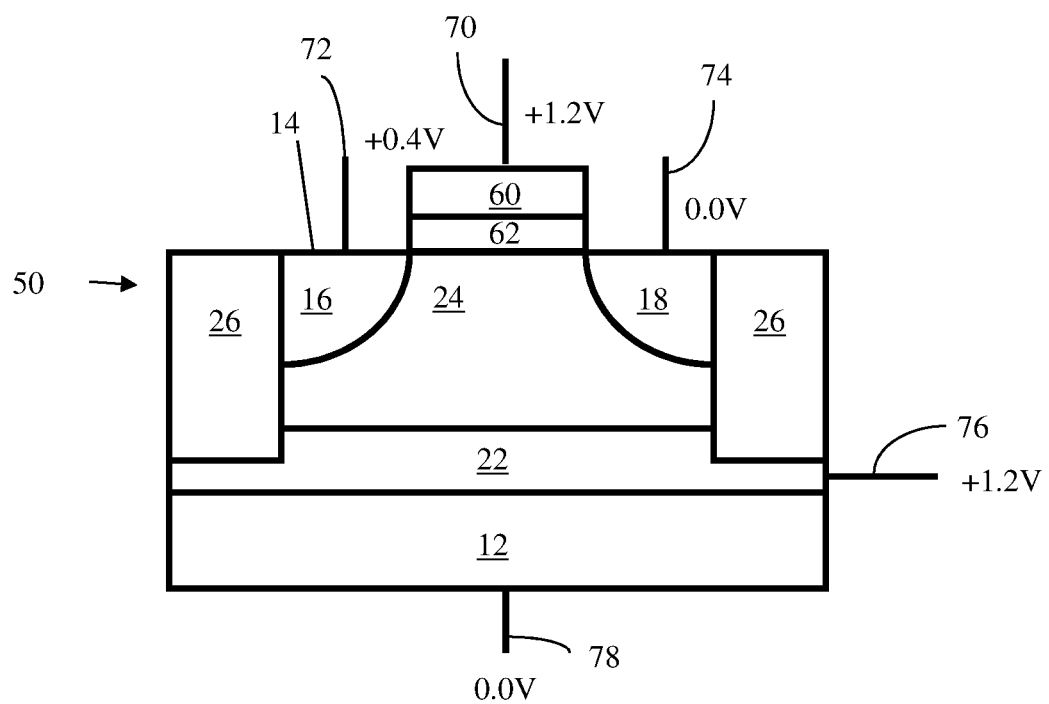
FIG. 14 illustrates bias conditions applied on the terminals of a memory cell to perform a read operation.

In one particular non-limiting embodiment, about 0.0 volts is applied to the selected BL terminal 74a, about +0.4 volts is applied to the selected SL terminal 72a, about +1.2 volts is applied to the selected WL terminal 70a, about +1.2 volts is applied to BW terminal 76, and about 0.0 volts is applied to terminal 78, as illustrated in FIG. 13. The unselected SL terminals 72 remain at 0.0 volts, the unselected BL terminals 74 are biased at +0.4 volts, and the unselected WL terminals 70 remain at 0.0 volts as illustrated in FIG. 13. However, these voltage levels may vary while maintaining the relative relationships between voltage levels as generally described above.

Figure 15:
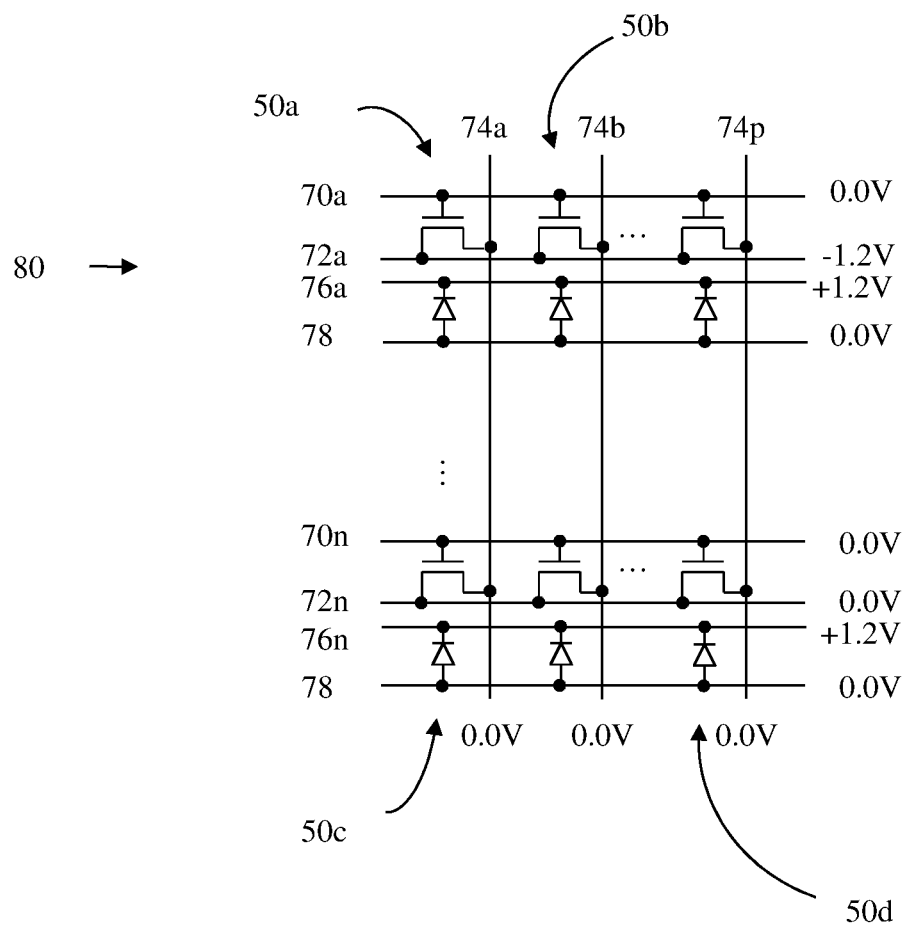
FIG. 15 schematically illustrates a write logic-0 operation performed on a memory array according to an embodiment of the present invention.
Figure 16:
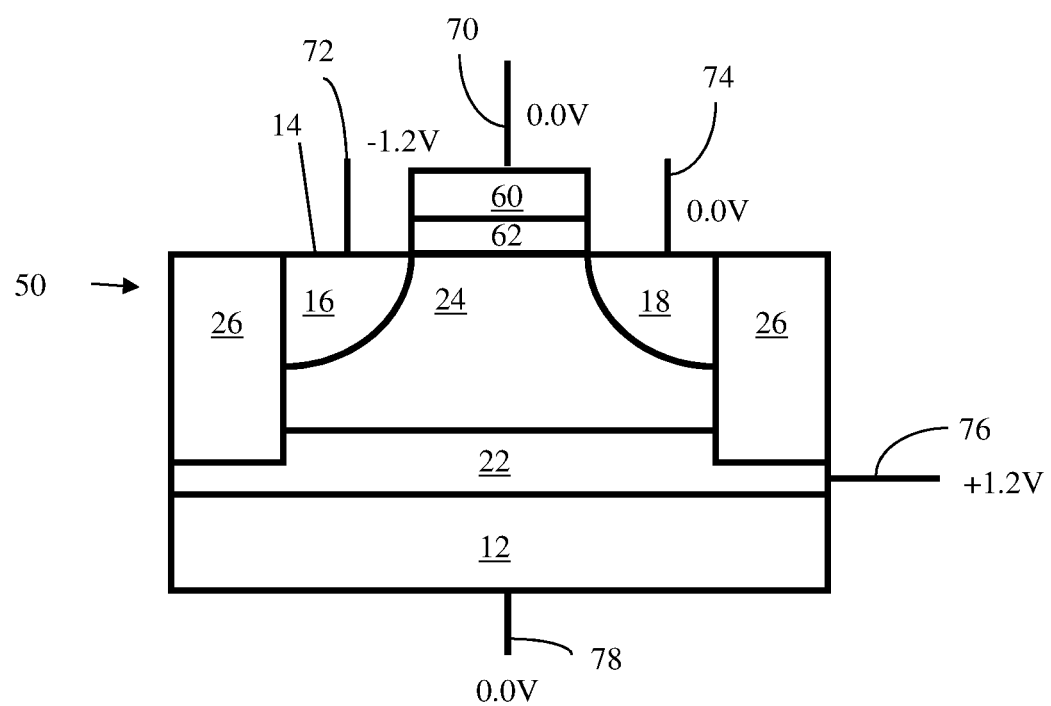
FIG. 16 illustrates bias conditions applied on the terminals of a memory cell to perform a write logic-0 operation.

A row write logic-0 operation is described in FIGS. 15 and 16, where the following bias conditions are applied: a negative voltage is applied to the selected SL terminal 72a, zero or positive voltage is applied to the BW terminal 76, zero voltage or negative voltage is applied to the WL terminal 70, and zero voltage is applied to BL terminal 74 and substrate terminal 78; while zero voltage is applied to the unselected SL terminals 72. Under these conditions, the p-n junction between floating body 24 and source line region 16 of the selected cell 50 is forward-biased, evacuating holes from the floating body 24. All memory cells 50 sharing the same SL terminal 72a will be written to simultaneously. To write arbitrary binary data to different memory cells 50, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72a, about 0.0 volts is applied to WL terminal 70a, about 0.0 volts or +1.2 volts is applied to BW terminal 76a, and about 0.0 volts is applied to substrate terminal 78a. These voltage levels are exemplary only may vary from embodiment to embodiment.

A write logic-0 operation may also be performed by applying the following bias conditions: a negative voltage to the selected BW terminal 76, zero voltage is applied to the WL terminal 70, SL terminal 72, BL terminal 74, and substrate terminal 78. Under these conditions, the p-n junction between floating body 24 and buried well 22 of the selected cell 50 is forward-biased, evacuating any holes from the floating body 24. In one particular non-limiting embodiment, about −0.5 volts is applied to BW terminal 76, about 0.0 volts is applied to WL terminal 70, SL terminal 72, BL terminal 76, and substrate terminal 78. A lower negative voltage may also be applied to the substrate terminal 78 to prevent the p-n diode formed between the substrate terminal 78 and the BW terminal 76 to be forward biased.

Figure 17:
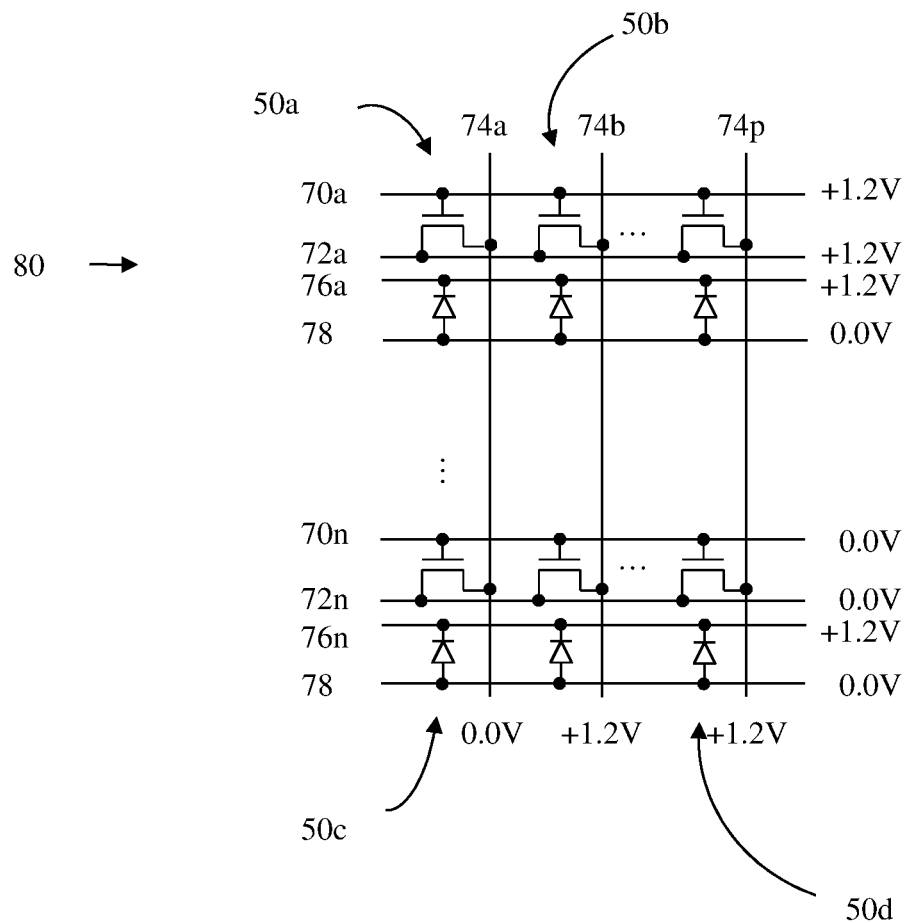
FIG. 17 schematically illustrates a write logic-1 operation performed on a memory array according to an embodiment of the present invention.
Figure 18:
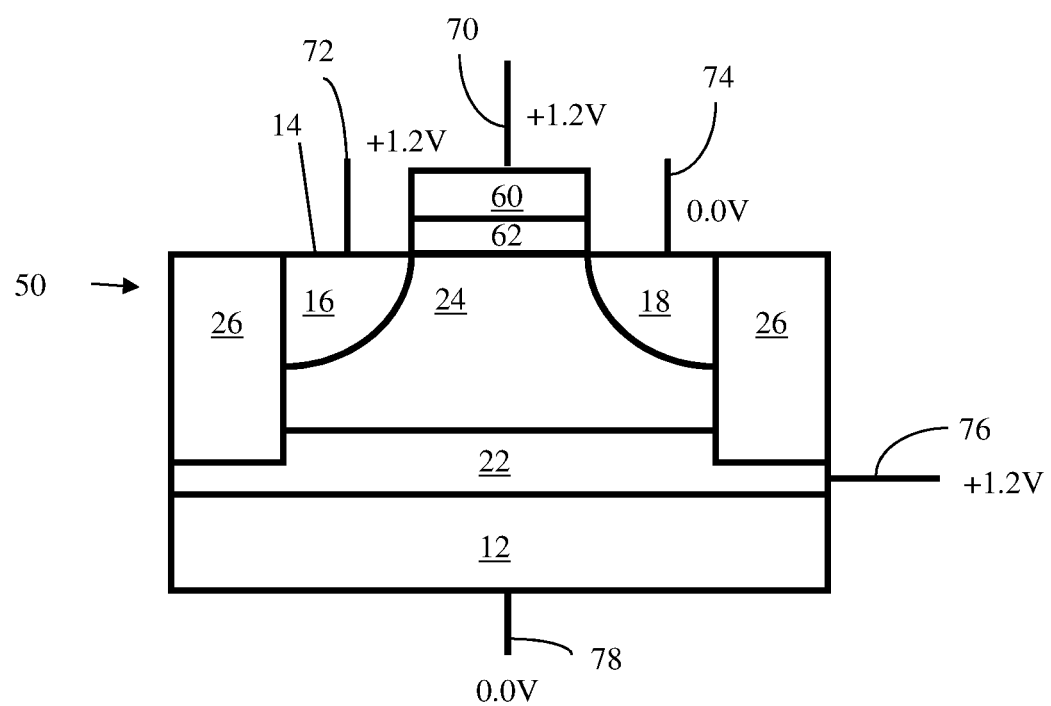
FIG. 18 illustrates bias conditions applied on the terminals of a memory cell to perform a write logic-1 operation.

An active low write logic-1 operation is shown in FIGS. 17 and 18, where the following bias conditions are applied: a positive voltage is applied to the BW terminal 76a, a positive voltage is applied to the selected SL terminal 72a, zero voltage is applied to the selected BL terminal 74a, a positive voltage applied to the selected WL terminal 70a, while zero voltage is applied to the substrate terminal 78a. The positive voltage applied to the selected SL terminal 72a is greater than or equal to the positive voltage applied to the selected WL terminal 70a and may generate sufficiently high enough electric field to trigger impact ionization mechanism. The impact ionization rate as a function of the electric field is for example described in "Physics of Semiconductor Devices", Sze S. M. and Ng K. K., which is hereby incorporated herein, in its entirety, by reference thereto.

When cell 50 is in an array 80 of cells 50, the unselected BL terminals 74 (e.g., 74b, . . . , 74n) will be biased at the same voltage applied to the selected SL terminal, the unselected SL terminals 72 will be at zero voltage, and the unselected WL terminals 70 (e.g., 70n and any other WL terminals 70 not connected to selected cell 50a) will remain at zero or negative voltage. A negative voltage can be applied on the unselected WL terminals 70 to suppress the electron flow from the bit line region 18 to source line region 16, thus reducing the probability that unselected cells in logic-0 state will be accidentally written to logic-1. (The negative voltage will also reduce the probability of undesired write, often referred to as write disturb, in active high write logic-1 scheme).

In one particular non-limiting embodiment, about 0.0 volts is applied to the selected BL terminal 74a, about +1.2 volts is applied to the selected SL terminal 72a, about +1.2 volts is applied to the selected WL terminal 70a, about +1.2 volts is applied to BW terminal 76, and about 0.0 volts is applied to terminal 78a, as illustrated in FIG. 17. The unselected SL terminals 72 remain at 0.0 volts, the unselected BL terminals 74 are biased at +1.2 volts, and the unselected WL terminals 70 remain at 0.0 volts as illustrated in FIG. 17. However, these voltage levels may vary while maintaining the relative relationships between voltage levels as generally described above.

Figure 19:
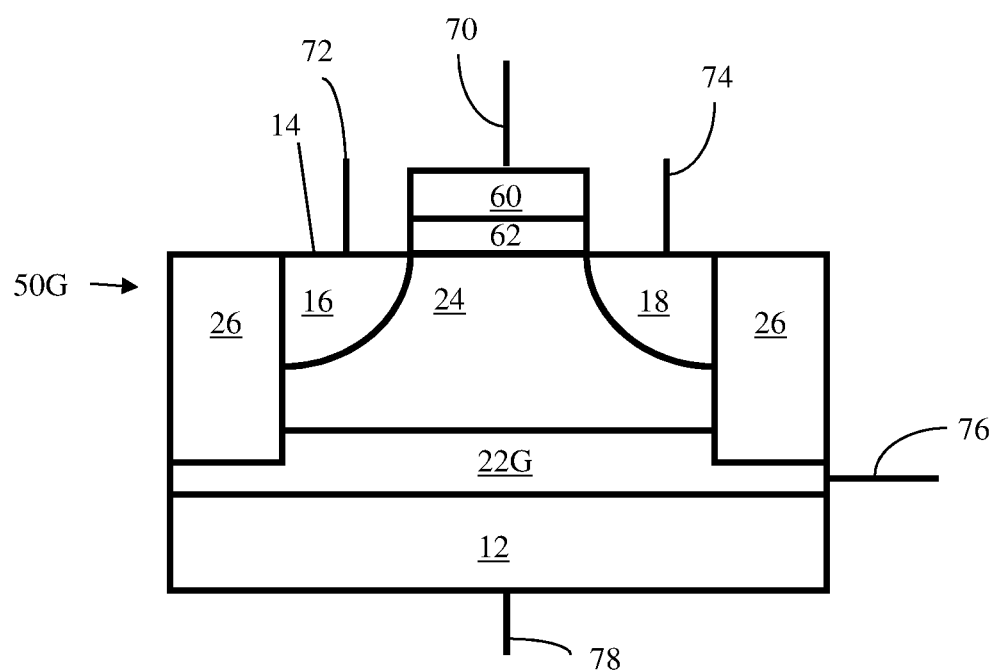
FIG. 19 is a schematic, cross-sectional illustration of a memory cell according to another embodiment of the present invention.

Low β and high impact ionization efficiency M will result in a more efficient holding operation. In an embodiment of the memory cell 50G shown in FIG. 19, the buried well region 22G comprises a material with a low band gap (relative to the band gap of silicon, which is about 1.12 eV), examples of which include germanium (band gap is ~0.7 eV) and silicon germanium (band gap depends on the ratio of silicon and germanium), which band gap is lower than that of silicon (band gap is ~1.12 eV). The lower band gap results in a lower energy necessary to create an electron-hole pair, thus increases the impact ionization efficiency M. The lower band gap also results in a lower voltage that can be applied to the BW terminal 76 during the operation of the memory cell 50G. For example, using germanium as the buried well region 22G may result in a holding voltage as low as 0.7V to be applied to the BW terminal 76. A lower band gap can also be obtained by having the buried well region 22G heavily doped. For example, H. P. D Lanyon and R. A. Tuft describe the band gap narrowing in silicon in "Bandgap Narrowing in Moderately to Heavily Doped Silicon", pp. 1014-1018, IEEE Transactions on Electron Devices, vol. ED-26, no. 7, July 1979. The lower band gap region 22G can be formed through ion implantation process, solid state diffusion, and/or through epitaxial growth process.

Figure 20A:
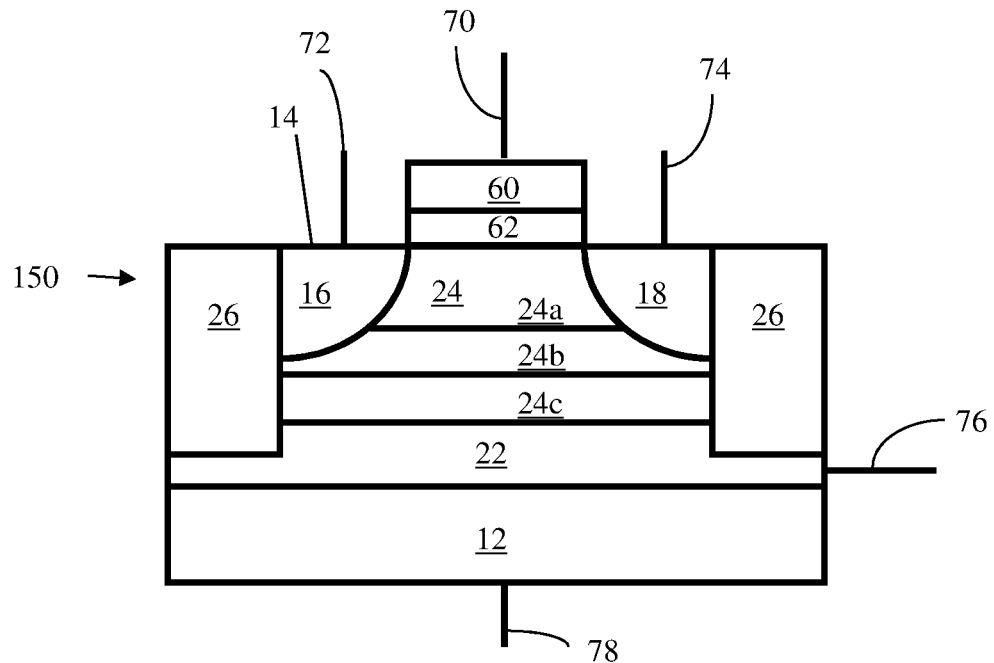
FIG. 20A is a schematic, cross-sectional illustration of a memory cell according to another embodiment of the present invention.

In another embodiment of the memory cell 150 shown in FIG. 20A, the floating body region 24 may comprise regions having different doping concentrations having the same conductivity type. FIG. 20A illustrates an example of floating body region 24 comprising three different regions 24a, 24b, and 24c. Region 24a, which is the closest one to the surface region 14, may have the lowest doping concentration to reduce the random dopant fluctuation (RDF) and hence improve the variability of the memory cell performance, for example its threshold voltage. The doping concentration of region 24b may be, but not necessarily, lower than the doping concentration of region 24c, but higher than that of region 24a. Region 24b may also function as a barrier layer to suppress dopant diffusion, for example but not limited to Si:C layer. This prevents dopant diffusion from the heavier doped region 24c to the lowest doped region 24a. The different floating body regions 24a, 24b, and 24c, may be formed through ion implantation process, solid-state diffusion, and/or epitaxial growth.

Figure 20B:
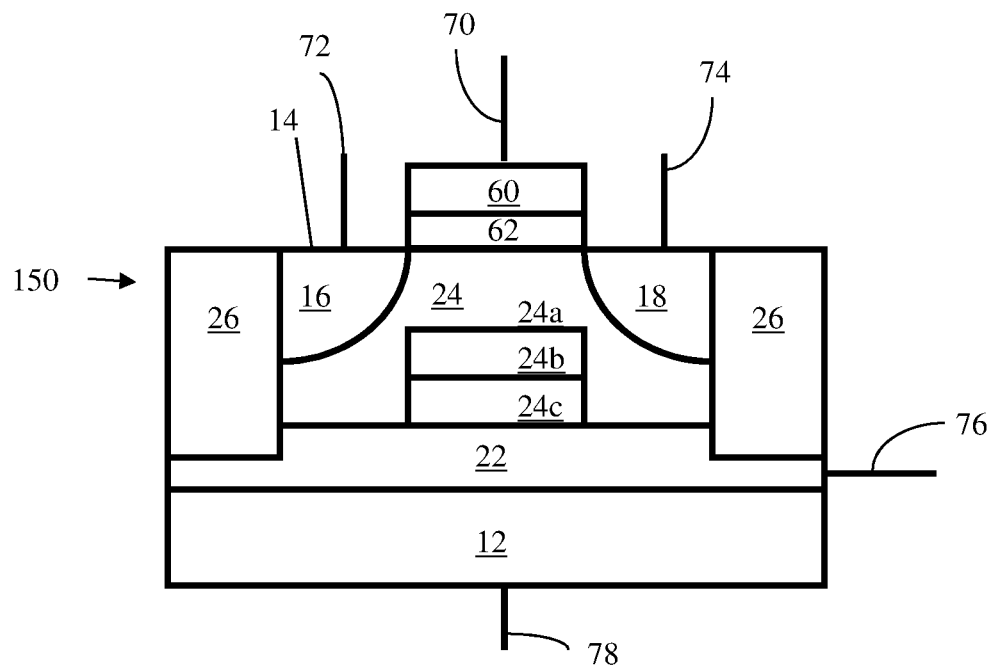
FIG. 20B is a schematic, cross-sectional illustration of a memory cell according to another embodiment of the present invention.

FIG. 20B illustrates another example of another embodiment of memory cell 150 according to the present invention, where regions 24b and 24c are localized, for example between the regions 16 and 18, meaning that regions 24b and 24c do not underlie all portions of regions 16 and 18. The remainder of region 24 outside of regions 24b and 24c underlies all portions of regions 16 and 18 and is considered to be region 24a in this embodiment.

Figure 21A:
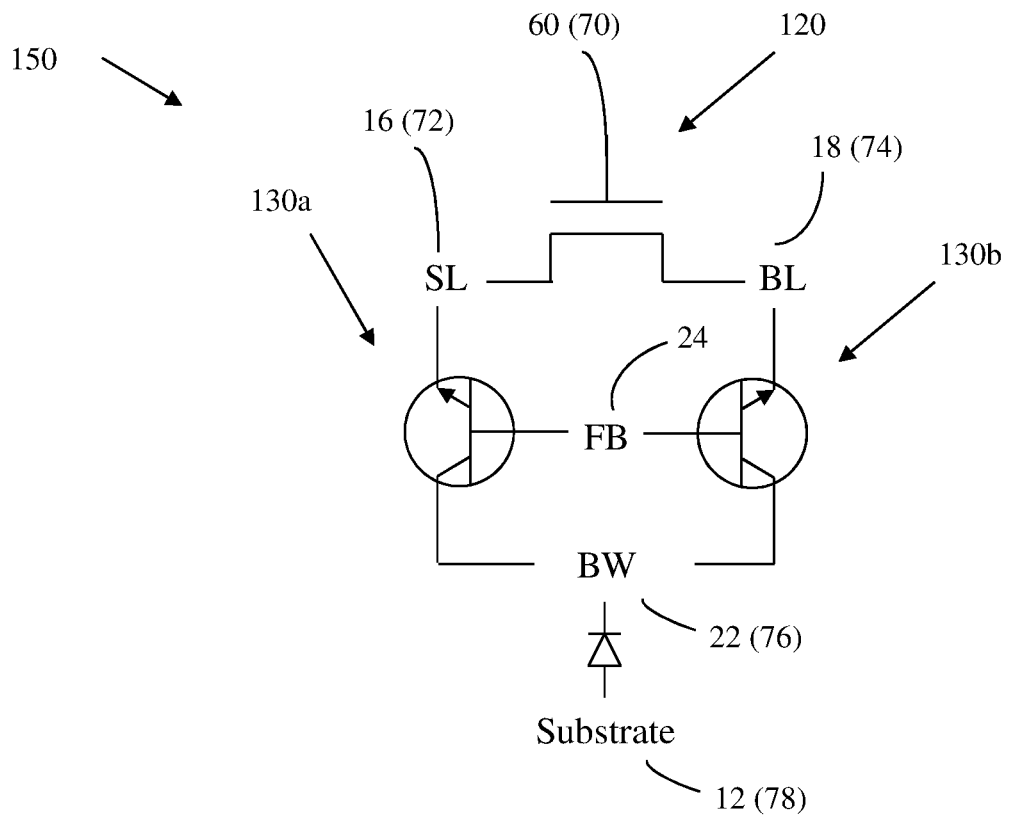
FIG. 21A schematically illustrates an equivalent circuit representation of the memory cells shown in FIGS. 20A-20B.

FIG. 21A illustrates an equivalent circuit representation of memory cell 150. Inherent in memory cell 150 are metal-oxide-semiconductor (MOS) transistor 120, formed by source line region 16, gate 60, bit line region 18, and floating body region 24, and bipolar devices 130a and 130b, formed by buried well region 22, floating body region 24, and source line region 16 or bit line region 18, respectively.

Figure 21B:
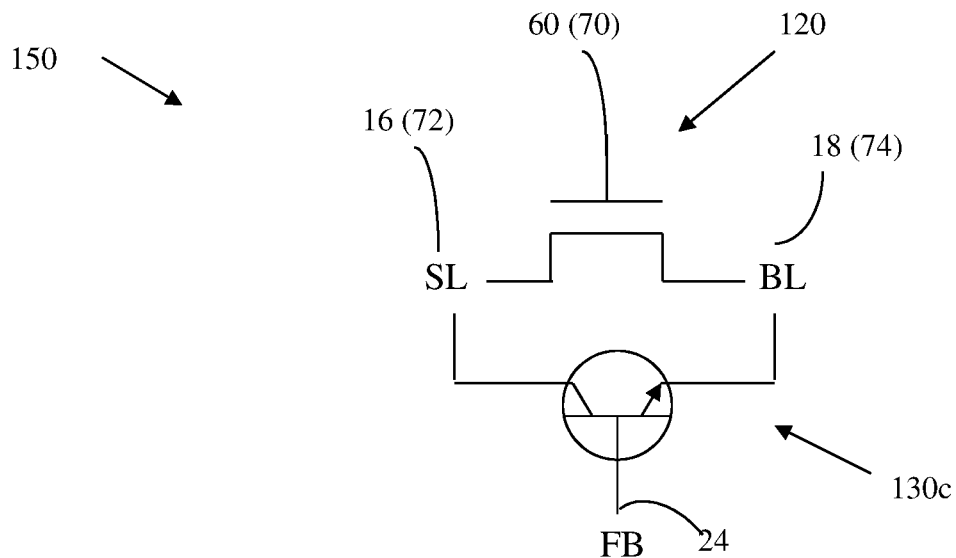
FIG. 21B schematically illustrates a bipolar device inherent in memory devices of FIGS. 20A-20B.

Also inherent in memory device 150 is bipolar device 130c, formed by source line region 16, floating body 24, and bit line region 18. For drawings clarity, bipolar device 30c is shown separately in FIG. 21B.

Figure 22:
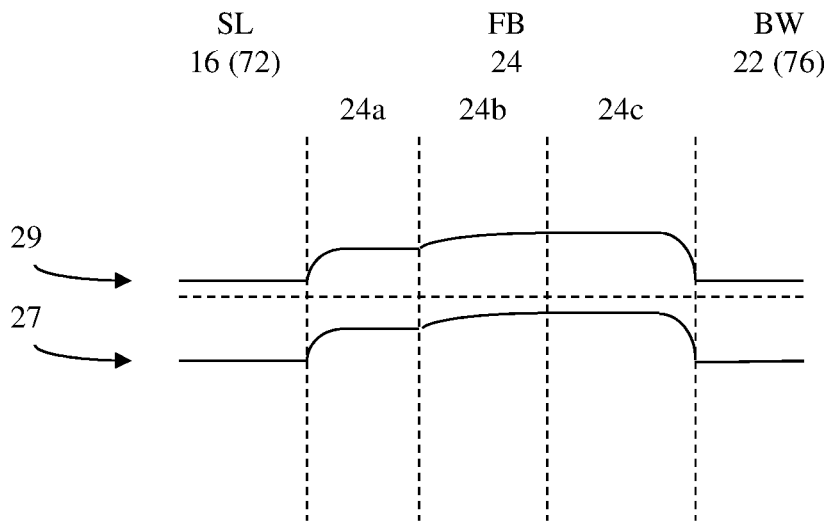
FIG. 22 shows an energy band diagram characterizing an intrinsic bipolar device of a memory cell according to an embodiment of the present invention under equilibrium condition.

FIG. 22 illustrates an energy band diagram characterizing the intrinsic n-p-n bipolar device 130a formed by the source line region 16, floating body region 24, and the buried well region 22 when the n-p-n bipolar device is in equilibrium for the memory cell 150 comprising of regions with different doping concentrations 24a, 24b, and 24c. The vertical dashed lines mark the regions with different doping concentrations of the bipolar device 130b. The energy band diagram of the intrinsic n-p-n bipolar device 130b can be constructed in a similar manner, with the bit line region 18 (connected to the BL terminal 74) in place of the source line region 16 (connected to the SL terminal 72). The dashed horizontal lines indicate the Fermi levels in the various regions of the n-p-n bipolar device 130a. The Fermi level is located in the band gap between the solid line 27 indicating the top of the valence band (the bottom of the band gap) and the solid line 29 indicating the bottom of the conduction band (the top of the band gap) as is well known in the art. The different regions of the floating body 24 are indicated in FIG. 22. Because of the different doping concentration in different regions of floating body 24, the Fermi level is also different across different regions. In the band diagram illustrated in FIG. 22, region 24c with the highest doping concentration has the lowest energy for holes storage. As a result, when memory cell 150 stores holes in the floating body region 24, holes storage will be concentrated in region 24c.

Figure 23:
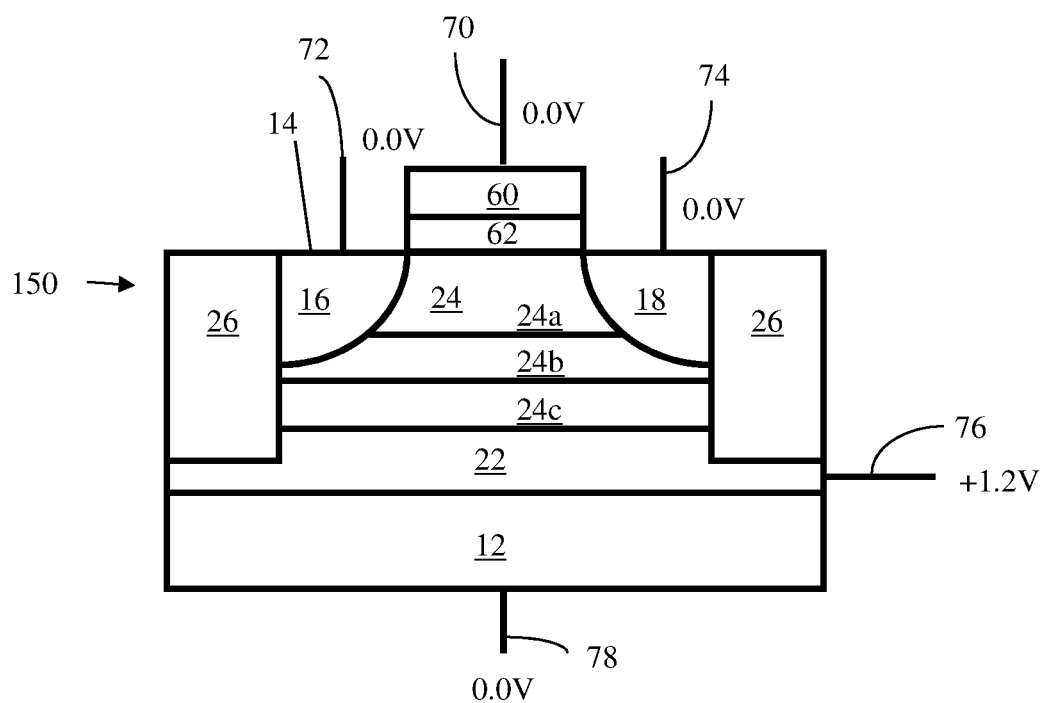
FIG. 23 illustrates exemplary bias conditions applied on the terminals of a memory cell shown in FIGS. 20A-20B to perform a holding operation.

FIG. 23 schematically illustrates performance of a holding operation on memory cell 150 comprising different regions of floating body 24. The holding operation is similar to that of memory cell 50 shown in FIGS. 7 and 8 and is performed by applying a positive back bias to the BW terminal 76, zero bias on the WL terminal 70, BL terminal 74, SL terminal 72, and substrate terminal 78. The positive back bias applied to the buried layer region 22 connected to the BW terminal 76 will maintain the state of the memory cell 50 that it is connected to. The positive bias applied to the BW terminal 76 needs to generate sufficient electric field to trigger impact ionization mechanism as will be described through the band diagram shown in FIGS. 24 and 25. The impact ionization rate as a function of the electric field is for example described in "Physics of Semiconductor Devices", Sze S. M. and Ng K. K., which is hereby incorporated herein, in its entirety, by reference thereto.

In one embodiment the bias conditions for the holding operation on memory cell 150 is: 0 volts is applied to WL terminal 70, 0 volts is applied to BL terminal 74, 0 volts is applied to SL terminal 72, a positive voltage, for example, +1.2 volts is applied to BW terminal 76, and 0 volts is applied to the substrate terminal 78. In other embodiments, different voltages may be applied to the various terminals of memory cell 150 and the exemplary voltages described are not limiting.

Figure 24:
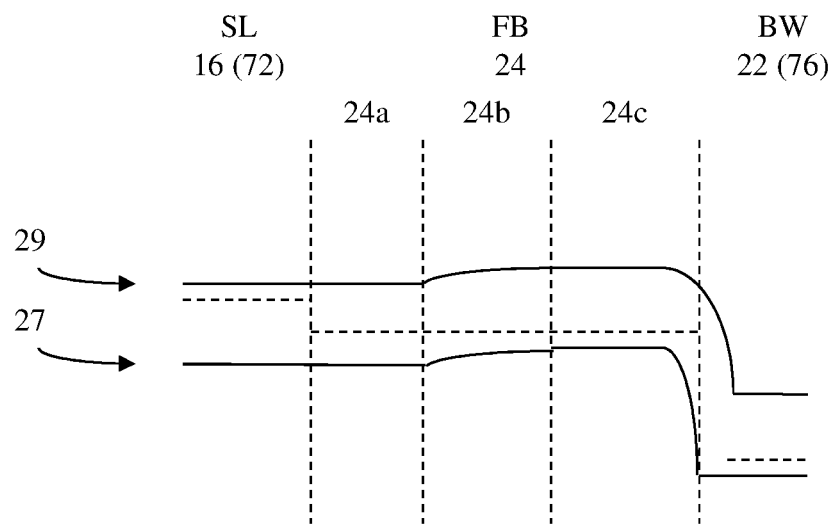
FIG. 24 shows an energy band diagram characterizing an intrinsic bipolar device when a floating body region is positively charged and a positive bias is applied to a buried well region of a memory cell according to an embodiment of the present invention.

FIG. 24 shows an energy band diagram characterizing the intrinsic n-p-n bipolar device 130a when the floating body region 24 is positively charged and a positive bias voltage is applied to the buried well region 22. The energy band diagram of the intrinsic n-p-n bipolar device 130b can be constructed in a similar manner, with the bit line region 18 (connected to the BL terminal 74) in place of the bit line region 16 (connected to the SL terminal 72). If floating body 24 is positively charged, a state corresponding to logic-1, the bipolar transistors 130a and 130b will be turned on as the positive charge in the floating body region lowers the energy barrier of electron flow into the base region. Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. This process restores the charge on floating body 24 and will maintain the charge stored in the floating body region 24 which will keep the n-p-n bipolar transistors 130a and 130b on for as long as a positive bias is applied to the buried well region 22 through BW terminal 76.

The higher doping concentration of region 24c relative to the remaining floating body regions 24a and 24b result in a higher electric field between the floating body region 24c and the buried well region 22. This results in a more efficient impact ionization mechanism, which in turn results in a lower voltage applied to the buried well region needed for the holding operation.

If floating body 24 is neutrally charged (the voltage on floating body 24 being equal to the voltage on grounded source line region 16), a state corresponding to logic-0, no current will flow through the n-p-n bipolar devices 130a and 130b. The bipolar devices 130a and 130b will remain off and no impact ionization occurs. Consequently memory cells in the logic-0 state will remain in the logic-0 state.

Figure 25:
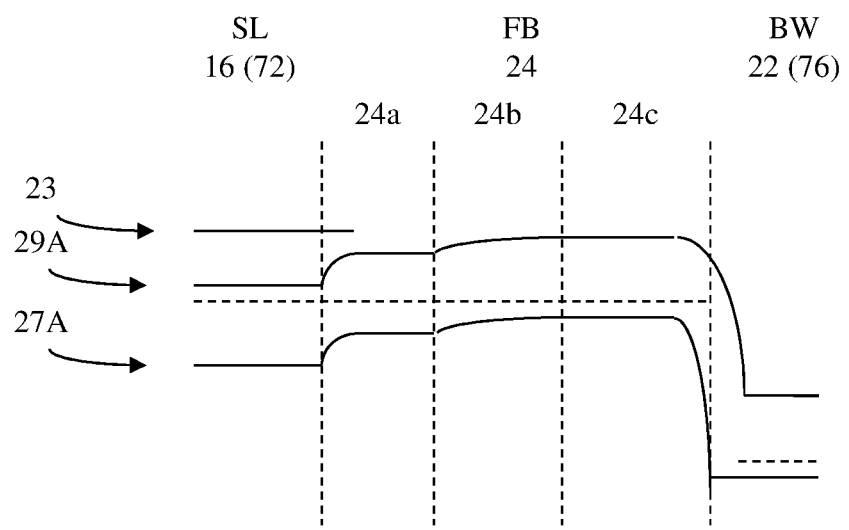
FIG. 25 shows an energy band diagram of an intrinsic bipolar device when a floating body region is neutrally charged and a positive bias is applied to a buried well region of a memory cell according to an embodiment of the present invention.

FIG. 25 shows an energy band diagram of the intrinsic bipolar device 130a when the floating body region 24 is neutrally charged and a bias voltage is applied to the buried well region 22. In this state the energy level of the band gap bounded by solid lines 27A and 29A is different in the various regions of n-p-n bipolar device 130a. Because the potential of the floating body region 24 and the source line region 16 is equal, the Fermi levels are constant, resulting in an energy barrier between the source line region 16 and the floating body region 24. Solid line 23 indicates, for reference purposes, the energy barrier between the source line region 16 and the floating body region 24. The energy barrier prevents electron flow from the source line region 16 (connected to BL terminal 72) to the floating body region 24. Thus the n-p-n bipolar devices 130a and 130b will remain off.

In the holding operation described with regard to FIG. 23, there is no individually selected memory cell. Rather the holding operation will be performed at all cells connected to the same buried well terminal 76.

Figure 26:
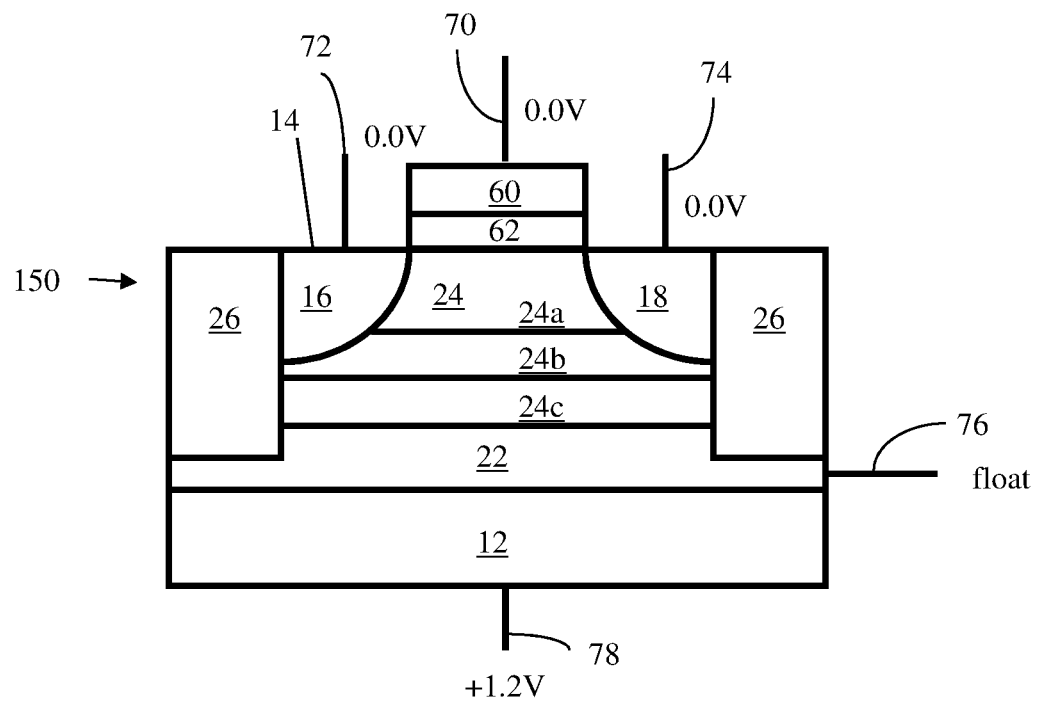
FIG. 26 schematically illustrates bias conditions applied on the terminals of a memory cell to perform an alternative holding operation on a memory cell employing intrinsic silicon controlled rectifier principle according to an embodiment of the present invention.

An alternative holding operation employing the intrinsic silicon controlled rectifier (SCR) device of memory cell, as described for example in Widjaja-2, may also be performed on memory cell 150. FIG. 26 illustrates bias conditions for an alternative holding operation applied on memory cell 150, as described for example in U.S. Pat. No. 8,077,536, "Method of Operating Semiconductor Memory Device with Floating Body Transistor Using Silicon Controlled Rectifier Principle", which is incorporated by reference herein in its entirety. The holding operation may also be performed by applying the following bias conditions: zero voltage is applied to WL terminal 70, SL terminal 72, and BL terminal 74, a positive voltage is applied to the substrate terminal 78, while the BW terminal 76 is left floating. Under these conditions, if memory cell 150 is in memory/data state "1" with positive voltage in floating body 24, the intrinsic silicon controlled rectifier (SCR) device of memory cell 150, formed by the substrate 12, the buried well region 22, the floating body region 24, and the bit line region 16 or the source line region 18, is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 150 may be refreshed by periodically applying a positive voltage pulse through substrate terminal 78. Those memory cells 150 that are commonly connected to substrate terminal 78 and which have a positive voltage in body region 24 will be refreshed with a "1" data state, while those memory cells 150 that are commonly connected to the substrate terminal 78 and which do not have a positive voltage in body region 24 will remain in blocking mode, since their SCR device will not be turned on, and therefore memory state "0" will be maintained in those cells. In this way, all memory cells 150 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to BL terminal 74, a voltage of about 0.0 volts is applied to WL terminal 70, about 0.0 volts is applied to SL terminal 72, and about +1.2 volts is applied to terminal 78, while the BW terminal 76 is left floating. However, these voltage levels may vary, while maintaining the relative relationships therebetween.

The amount of charge stored in the floating body 24 can be sensed by monitoring the cell current of the memory cell 150. If the memory cell is in a logic-1 state having holes in the floating body region 24, then the memory cell 150 will have a lower threshold voltage (gate voltage where the transistor is turned on), and consequently a higher cell current, compared to when the floating body memory cell 150 is in logic-0 state having no holes in the floating body region 24. The higher doping concentration of region 24c will also result in a larger difference between the logic-0 and logic-1 states.

Figure 27:
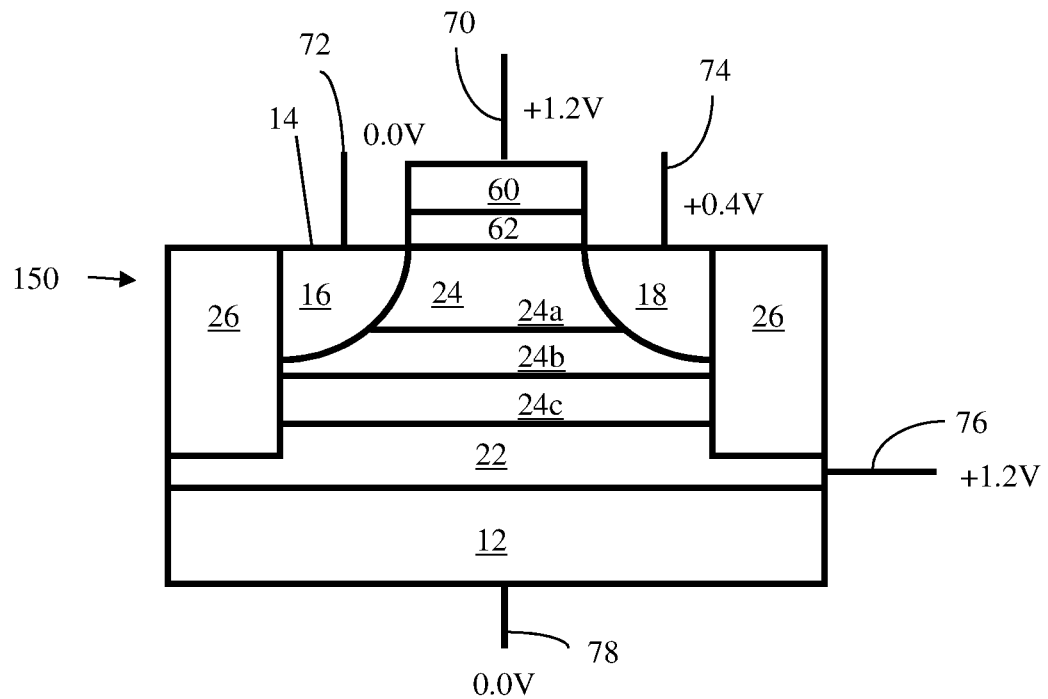
FIG. 27 schematically illustrates bias conditions applied on the terminals of a memory cell to perform a read operation on a memory cell according to an embodiment of the present invention.

FIG. 27 illustrates an exemplary bias condition applied to the memory cell 150 for performing a read operation. The read operation is performed by applying the following bias conditions: a positive bias to the WL terminal 70, a positive bias to the BL terminal 74, zero bias to the SL terminal 72, zero or positive bias to the BW terminal 76, and zero bias to the substrate terminal 78.

In one embodiment the bias conditions for the read operation for memory cell 150 are: +1.2 volts is applied to WL terminal 70, +0.4 volts is applied to BL terminal 74, 0.0 volts is applied to SL terminal 72, +1.2 volts is applied to BW terminal 76, and 0.0 volts is applied to the substrate terminal 78. In other embodiments, different voltages may be applied to the various terminals of memory cell 150 and the exemplary voltages described are not limiting. The positive voltage applied to BL terminal 74 may be less than the positive voltage applied to WL terminal 70, in which the difference in the threshold voltage of the memory cell 150 is employed to represent the state of the memory cell 150. The positive voltage applied to BL terminal 74 may also be greater than or equal to the positive voltage applied to WL terminal 70 and may generate sufficiently high electric field to trigger the bipolar read mechanism.

A sensing circuit typically connected to BL terminal 74 can be used to determine the data state of the memory cell 150. Any sensing scheme known in the art can be used in conjunction with memory cell 150.

A higher doping concentration of region 24c also results in a higher body effect, which in turn results in a greater difference between the characteristics of memory cells in logic-0 and logic-1 states.

Figure 28:
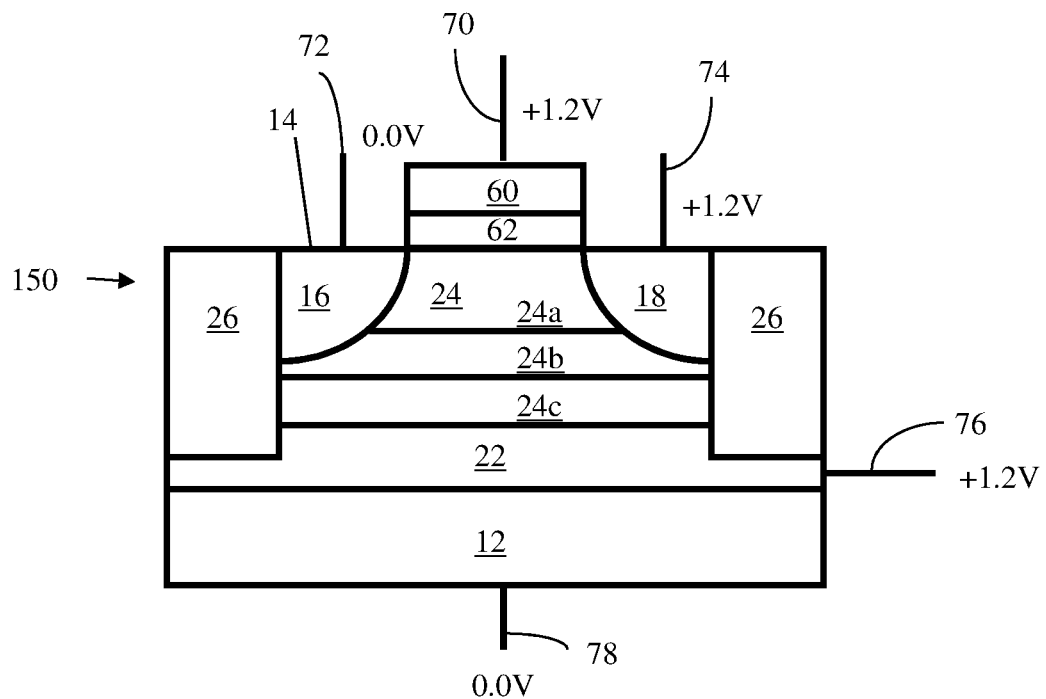
FIG. 28 schematically illustrates bias conditions applied on the terminals of a memory cell to perform a write logic-1 operation with impact ionization mechanism on a memory cell according to an embodiment of the present invention.

FIG. 28 illustrates exemplary bias conditions for an active high write logic-1 operation on the memory cell 150, where the following bias conditions are applied: a positive voltage is applied to the selected WL terminal 70, a positive voltage is applied to the selected BL terminal 74, zero voltage is applied to the selected SL terminal 72, zero or positive voltage is applied to the selected BW terminal 76, and zero voltage is applied to the substrate terminal 78. This positive voltage applied to the selected BL terminal 74 is greater than or equal to the positive voltage applied to the selected WL terminal 70 and may generate sufficiently high enough electric field to trigger impact ionization mechanism.

In one particular non-limiting embodiment, about +1.2 volts is applied to the selected WL terminal 70, about +1.2 volts is applied to the selected BL terminal 74, about 0.0 volts is applied to SL terminal 72, about 0.0 volts or +1.2 volts is applied to BW terminal 76, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only and may vary from embodiment to embodiment. Thus the exemplary embodiments, features, bias levels, etc., described are not limiting.

In another example, the positive voltage applied to the selected WL terminal 70 is about one-half of the positive voltage applied to the selected BL terminal 74. These bias conditions result in a high impact ionization efficiency, which will shorten the excess hole charging time to the floating body region 24 and consequently increase the speed for the write logic-1. In addition, the power required for the write logic-1 operation can be reduced since a lower gate voltage results in a lower current flow (from the BL terminal 74 to the SL terminal 72) compared to the current flow when the voltage applied to the selected WL terminal 70 is equal to the positive voltage applied to the selected BL terminal 74.

In another particular non-limiting embodiment, about +0.6 volts is applied to the selected WL terminal 70, about +1.2 volts is applied to the selected BL terminal 74, about 0.0 volts is applied to SL terminal 72, about 0.0 volts or +1.2 volts is applied to BW terminal 76, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only and may vary from embodiment to embodiment. Thus the exemplary embodiments, features, bias levels, etc., described are not limiting.

In another embodiment of the memory cell 150, the doping concentration of region 24b may be lower than the doping concentration of region 24a and lower than the doping concentration of region 24c (while the doping concentration of region 24c is higher than that of region 24a). This results in a current flow in the region 24b, away from the surface 14 of the memory cell 150. This will be advantageous for logic-1 write operation using impact ionization mechanism, as the hot electron will be generated away from the surface 14, hence reduces the damage of gate oxide 62 due to hot electron effect and improves the reliability of the memory cell 150.

Figure 29:
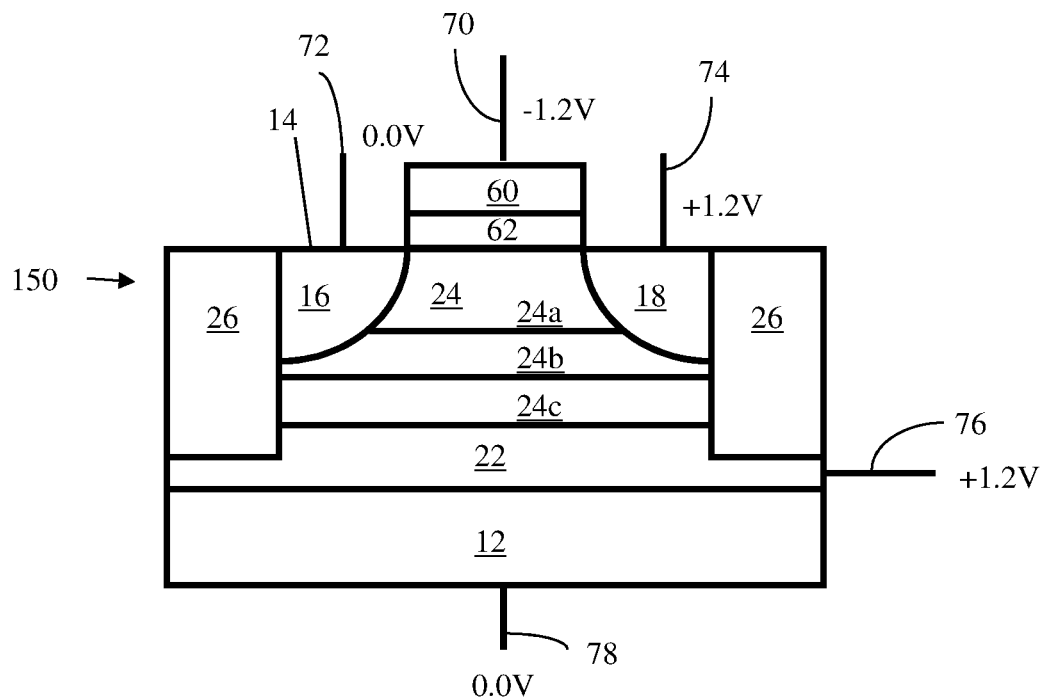
FIG. 29 schematically illustrates bias conditions applied on the terminals of a memory cell to perform a write logic-1 operation with band-to-band tunneling or gate induced drain leakage (GIDL) mechanism on a memory cell according to an embodiment of the present invention.

FIG. 29 is a schematic illustration showing bias conditions for a write logic-1 operation using band-to-band tunneling mechanism performed on memory cell 150, where the following bias conditions are applied: a negative voltage is applied to the selected WL terminal 70, a positive voltage is applied to the selected BL terminal 74, zero voltage is applied to the selected SL terminal 72, zero or positive voltage is applied to the selected BW terminal 76, and zero voltage is applied to the substrate terminal 78.

In one particular non-limiting embodiment, about −1.2 volts is applied to the selected WL terminal 70, about +1.2 volts is applied to the selected BL terminal 74, about 0.0 volts is applied to SL terminal 72, about 0.0 volts or +1.2 volts is applied to BW terminal 76, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only may vary from embodiment to embodiment. Thus the exemplary embodiments, features, bias levels, etc., described are not limiting.

The negative charge on the gate 60 (connected to WL terminal 70) and the positive voltage on bit line region 18 (connected to BL terminal 74) create a strong electric field (for example, about $10^6$ V/cm in silicon, as described in Sze, p. 104) between the bit line region 18 and the floating body region 24 in the proximity of gate 60. This bends the energy band sharply upward near the gate and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

Figure 30:
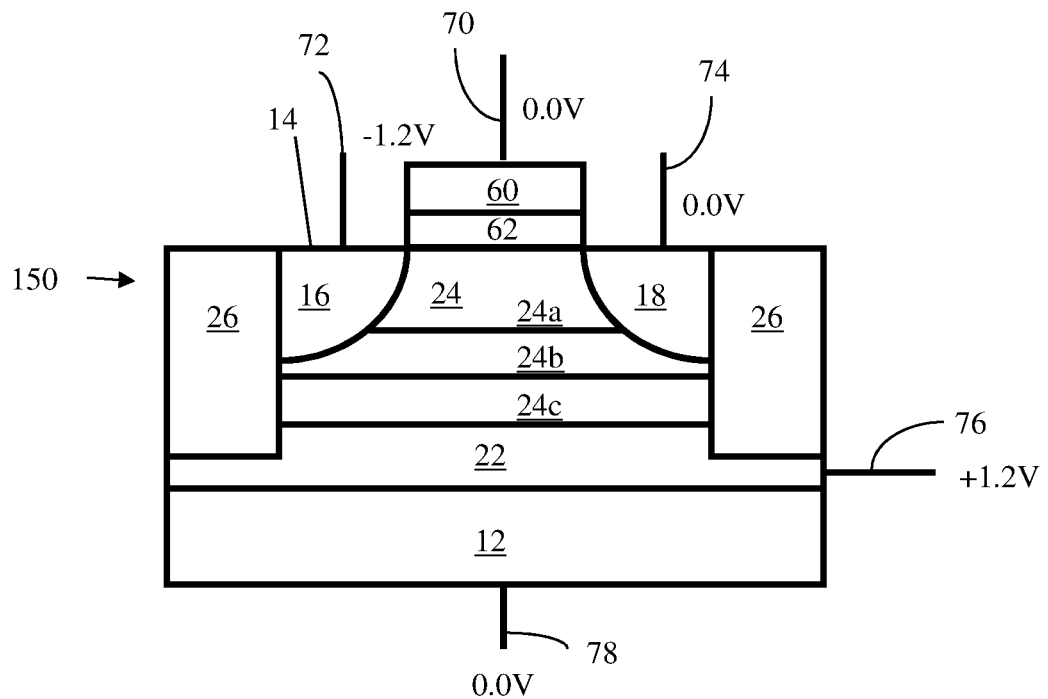
FIG. 30 schematically illustrates bias conditions applied on the terminals of a memory cell to perform a write logic-0 operation on a memory cell according to an embodiment of the present invention.

FIG. 30 is a schematic illustration showing bias conditions for a write logic-0 operation which can be performed by applying a negative voltage bias to the selected SL terminal 72, zero bias to the selected WL terminal 70, zero bias to the BL terminal 74, zero or positive bias to the BW terminal 76, and zero bias to the substrate terminal 78; while zero voltage is applied to the unselected SL terminals 72, zero voltage bias applied to the unselected WL terminals 70, zero or positive bias applied to the BW terminal 76, and zero voltage bias applied to the substrate 78. Under these conditions, the p-n junction between floating body 24 and source line region 16 of the selected cell 150 is forward-biased, evacuating holes from the floating body 24. All memory cells 150 sharing the same selected SL terminal 72a will be written to simultaneously. To write arbitrary binary data to different memory cells 150, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72, about 0.0 volts is applied to WL terminal 70, about 0.0 volts is applied to BL terminal 74, about 0.0 volts or +1.2 volts is applied to BW terminal 76, and about 0.0 volts is applied to substrate terminal 78, while zero voltage is applied to the unselected SL terminals 72, zero voltage bias applied to the unselected WL terminals 70, zero or positive bias applied to the BW terminal 76, and zero voltage bias applied to the substrate 78. These voltage levels are exemplary only may vary from embodiment to embodiment. Thus the exemplary embodiments, features, bias levels, etc., described are not limiting.

Figure 31:
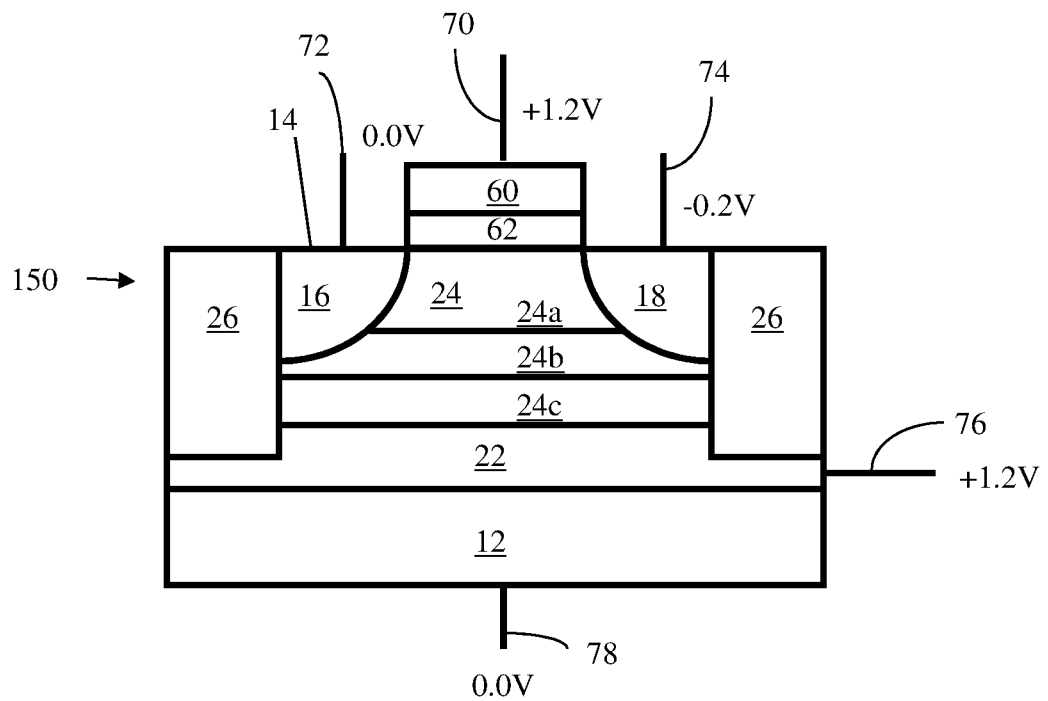
FIG. 31 schematically illustrates bias conditions applied on the terminals of a memory cell to perform a bit-selective write logic-0 operation on a memory cell according to another embodiment of the present invention.

FIG. 31 illustrates a bit-selective write logic-0 operation performed on a selected memory cell 150, where the following bias conditions are applied: a positive voltage to the selected WL terminal 70, a negative voltage to the selected BL terminal 74, zero voltage bias to the selected SL terminal 72, zero or positive voltage bias to the BW terminal 76, and zero voltage to the substrate terminal 78; while zero voltage is applied to the unselected WL terminals 70, zero voltage is applied to the unselected BL terminals 74, zero voltage bias is applied to the unselected SL terminals 72, zero or positive voltage is applied to the BW terminal 76, and zero voltage is applied to the substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between floating body region 24 and bit line region 18 is forward-biased, evacuating holes from the floating body 24.

To reduce undesired write logic-0 disturb to other memory cells 150 in a memory array, the applied potential can be optimized as follows: if the floating body 24 potential of state logic-1 is referred to as $V_{FB1}$, then the voltage applied to the WL terminal 70 is configured to increase the floating body 24 potential by $V_{FB1}/2$ while $-V_{FB1}/2$ is applied to BL terminal 74. Additionally, either ground or a slightly positive voltage may also be applied to the BL terminals 74 of unselected memory cells 150 that do not share the same BL terminal 74 as the selected memory cell 150, while a negative voltage may also be applied to the WL terminals 70 of unselected memory cells 150 that do not share the same WL terminal 70a as the selected memory cell 150.

As illustrated in FIG. 31, the following exemplary bias conditions may be applied to the selected memory cell 50 to perform a bit-selective write logic-0 operation: a potential of about −0.2 volts to the selected BL terminal 74, a potential of about +1.2 volts to the selected WL terminal 70, about 0.0 volts is applied to the selected SL terminal 72, a potential of about 0.0 volts or +1.2 volts to the BW terminal 76, about 0.0 volts to the substrate terminal 78.

Figure 32A:
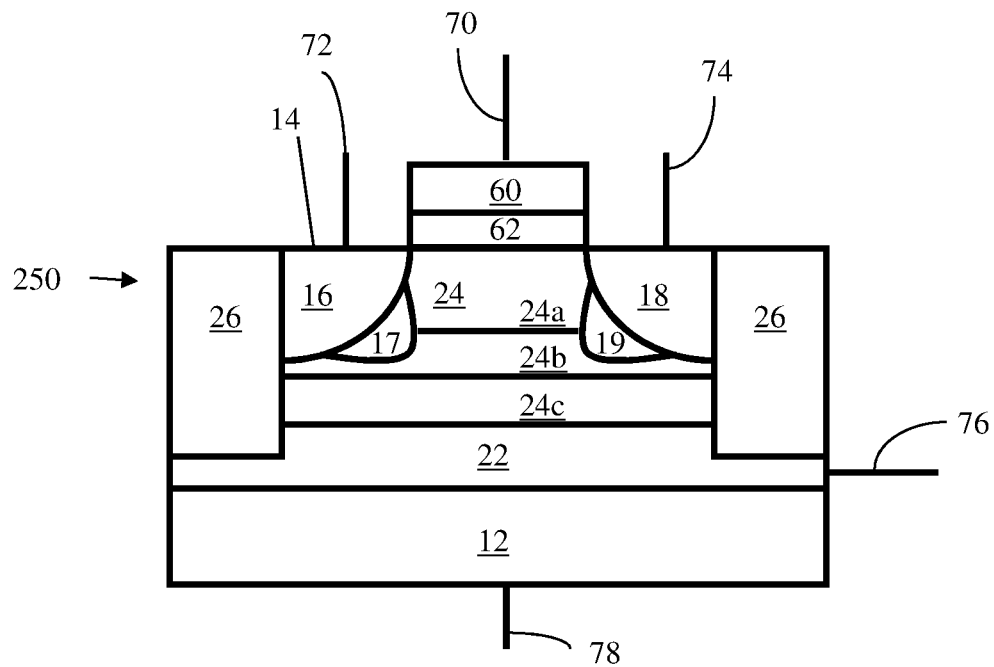
FIG. 32A is a schematic, cross-sectional illustration of a memory cell according to another embodiment of the present invention.
Figure 32B:
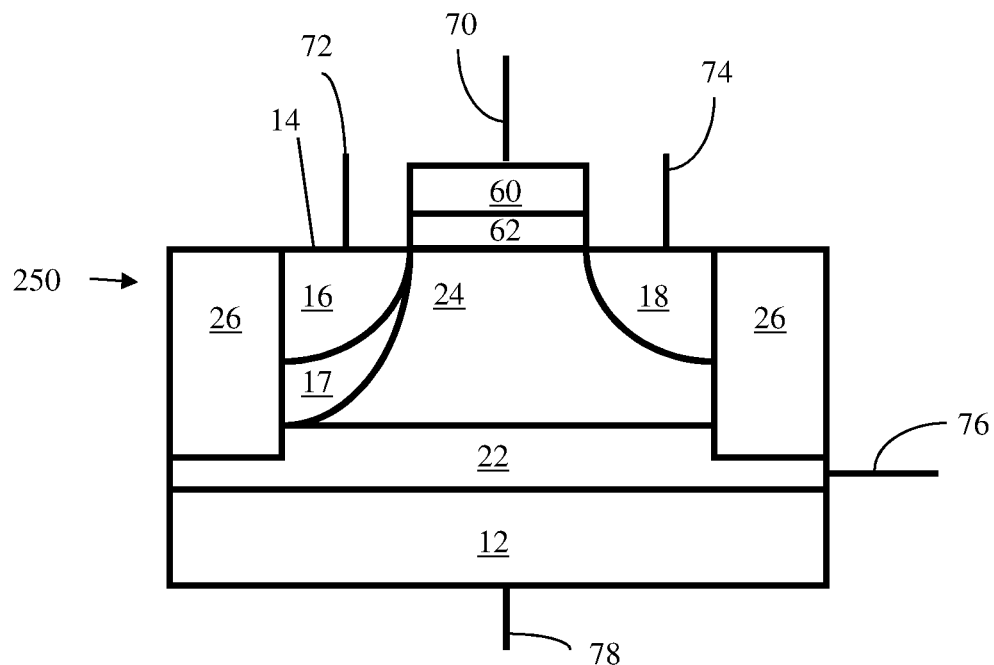
FIG. 32B is a schematic, cross-sectional illustration of a memory cell according to another embodiment of the present invention.

FIG. 32A illustrates memory cell 250 according to another embodiment of the present invention, which comprises halo regions 17 and 19 of the first conductivity type respectively adjacent to the source line region 16 and bit line region 18 of the second conductivity type. Memory cell 250 may comprise both halo regions 17 and 19, or memory cell 250 may comprise only one halo region 17 or 19, as shown in an asymmetric cell 250 in FIG. 32B. FIG. 32A also shows floating body region 24 comprises, although not necessarily, different doping concentrations 24a, 24b, and 24c. The halo regions 17 or 19 can be located at an angle with respect to the surface 14, such as shown in FIG. 32A or could be located below the source line region 16 or bit line region 18, such as shown in FIG. 32B.

Figure 33:
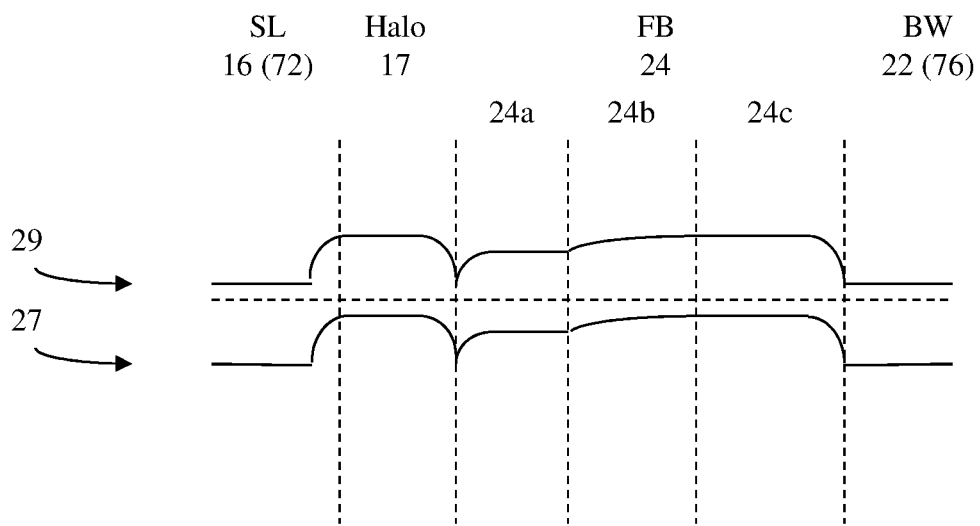
FIG. 33 shows an energy band diagram characterizing an intrinsic bipolar device of a memory cell according to an embodiment of the present invention under equilibrium condition.

FIG. 33 illustrates the band diagram of memory cell 250 under equilibrium condition. Because of the different doping concentrations, multiple regions with lower energy for holes exist in memory cell 250. For example, regions of low energy for holes storage are available in halo region 17 (and 19) and region 24c. Multiple storage locations can be used to construct a multi-level cell with a memory cell 250 storing holes in different regions of the memory cell 250.

Figure 34:
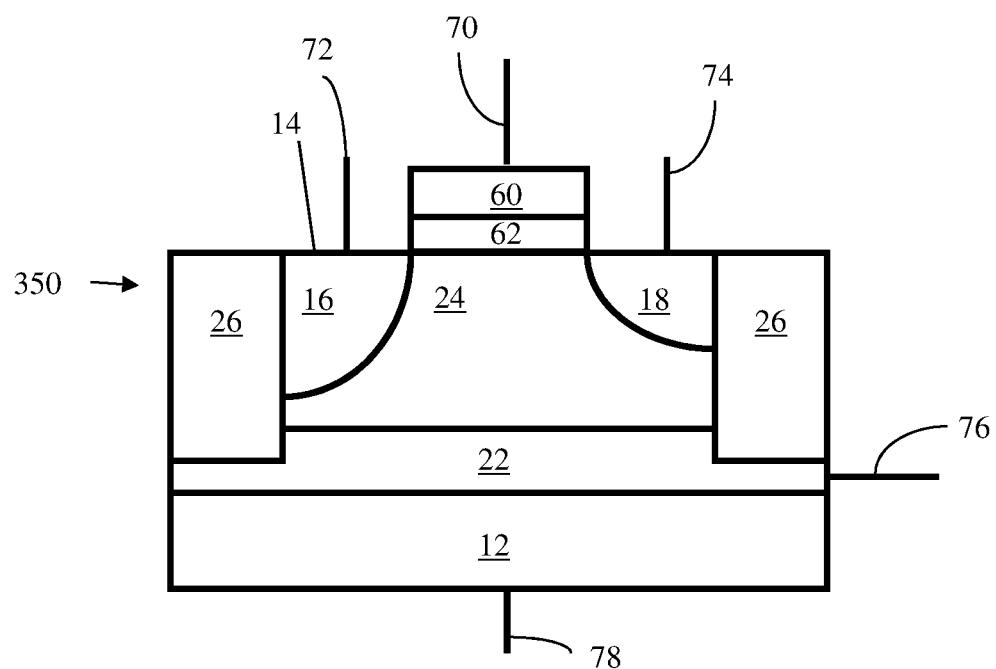
FIG. 34 is a schematic, cross-sectional illustration of an asymmetric memory cell according to another embodiment of the present invention.

FIG. 34 illustrates a cross-sectional view of another embodiment of the memory cell 350. Memory cell 350 is asymmetric in that the source line region 16 and the bit line region 18 have different physical properties, for example the junction depth, and electrical properties, for example the breakdown voltage. As will be described, asymmetric memory cell 350 has some advantages, for example, allowing for a write logic-1 operation through impact ionization mechanism away from the surface region 14. This results in less degradation of the gate oxide 62. The source line region 16 (connected to the SL terminal 72) is shown to have a deeper junction depth in FIG. 34 than that of bit line region 18. In another embodiment of the memory cell 350, the bit line region 18 may have a deeper junction depth than the source line region 16.

Figure 35:
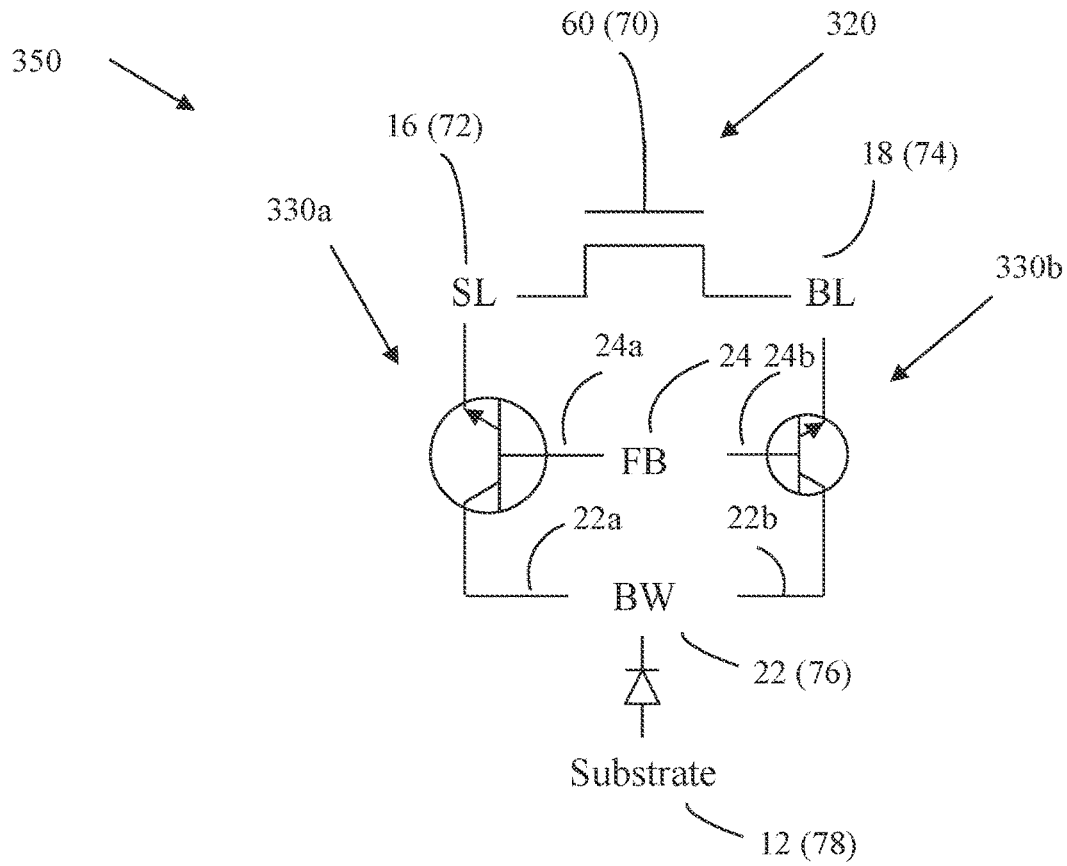
FIG. 35 schematically illustrates an equivalent circuit representation of the memory cells shown in FIG. 34.

An equivalent circuit representation of memory cell 350 is shown in FIG. 35. The vertical bipolar device 330a— formed by the source line region 16, floating body region 24 (24a), and buried well region 22 (22a)—is schematically shown to be larger in size compared to the vertical bipolar device 330b, formed by the bit line region 18, floating body region 24 (24b), and buried well region 22 (22a). Note that the first floating body (base) region 24a is common to the second floating body (base) region 24b as shown by 24 and the first collector or collector region (buried well region 22a) is common to the second collector or collector region (buried well region 22b) as shown by 22. For the same bias conditions (for example the same voltage difference across the emitter and collector terminals, i.e. the buried well region 22 and the source line region 16 or the bit line region 18), the vertical bipolar device 330a will conduct a higher current because of the narrower base region of the bipolar device 330a. Similarly, the emitter-collector breakdown voltage, which results in impact ionization at the collector region (buried well region 22) and subsequently injects holes into the floating body region 24, is lower for bipolar device 330a compared to that of bipolar device 330b.

Figure 36:
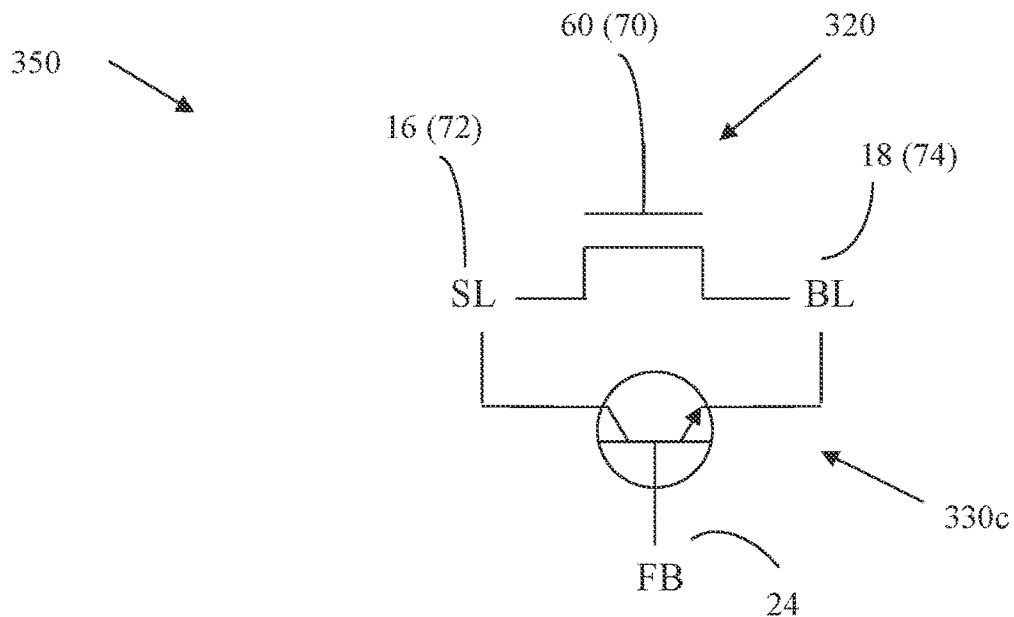
FIG. 36 schematically illustrates a bipolar device inherent in memory devices of FIG. 34.

Also inherent in memory device 350 is bipolar device 330c, formed by source line region 16, floating body 24, and bit line region 18. For drawings clarity, bipolar device 330c is shown separately in FIG. 36.

The operations performed on the memory cell 350 are similar to those of memory cell 50. Due to the asymmetric nature of the memory cell 350, further optimizations can be performed to the write operations.

Figure 37:
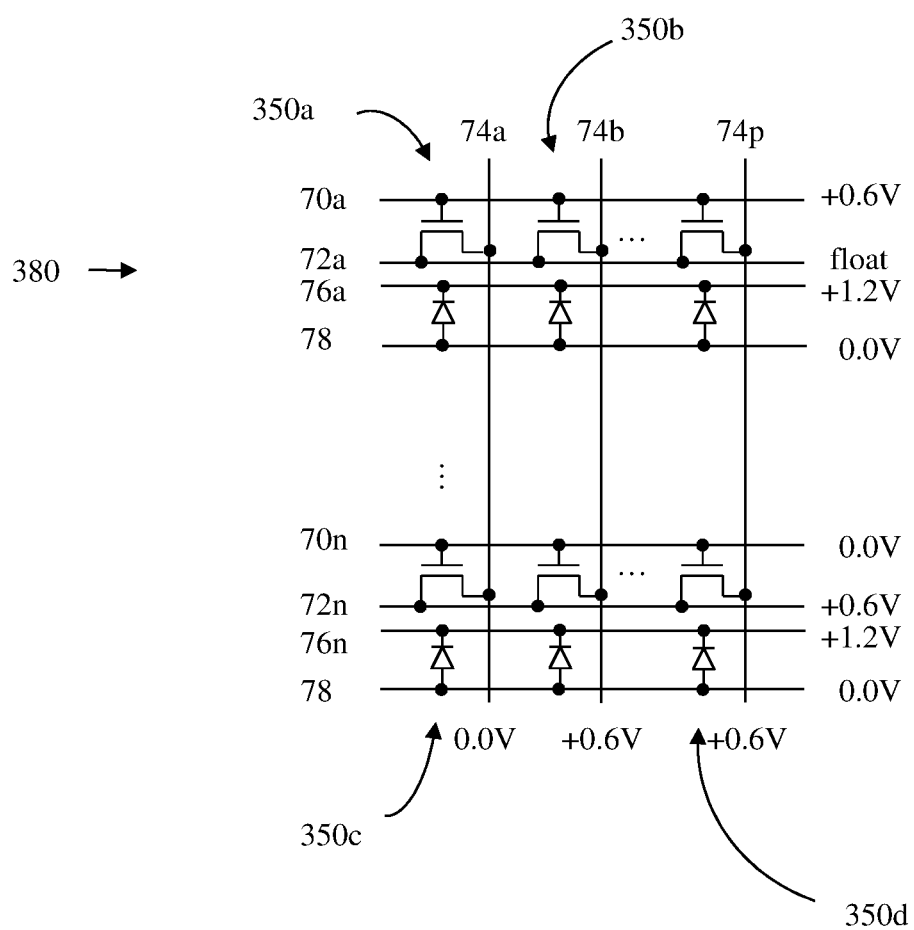
FIG. 37 schematically illustrates a write logic-1 operation performed on a memory array according to an embodiment of the present invention.

FIG. 37 schematically illustrates a write logic-1 operation performed on memory array 380, where the following bias conditions are applied to the selected memory cell 350a: a positive voltage is applied to the selected WL terminal 70, zero voltage is applied to the selected BL terminal 74, a positive voltage is applied to the BW terminal 76, zero voltage is applied to the substrate terminal 78, and selected SL terminal 72 is left floating; while the following bias conditions are applied to the unselected terminals: zero voltage is applied to the unselected WL terminal 70, a positive voltage is applied to the unselected BL terminal 74, a positive voltage is applied to the unselected SL terminal 72, a positive voltage is applied to the unselected BW terminal, and zero voltage is applied to the unselected substrate terminal 78 (in the case of memory array 380 where the BW terminals 76 and substrate terminals 78 are segmented).

In one particular non-limiting embodiment, about +0.6 volts is applied to selected WL terminal 70, about 0.0 volts is applied to the selected BL terminal 74, about +1.2 volts is applied to the selected BW terminal 76, about 0.0 volts is applied to the substrate terminal 78, while selected SL terminal 72 is left floating; while about 0.0 volts is applied to the unselected WL terminal 70, about +0.6 volts is applied to the unselected BL terminal 74, and about +0.6 volts is applied to the unselected SL terminal 72. These voltage levels are exemplary only may vary from embodiment to embodiment. Thus the exemplary embodiments, features, bias levels, etc., described are not limiting.

Figure 38:
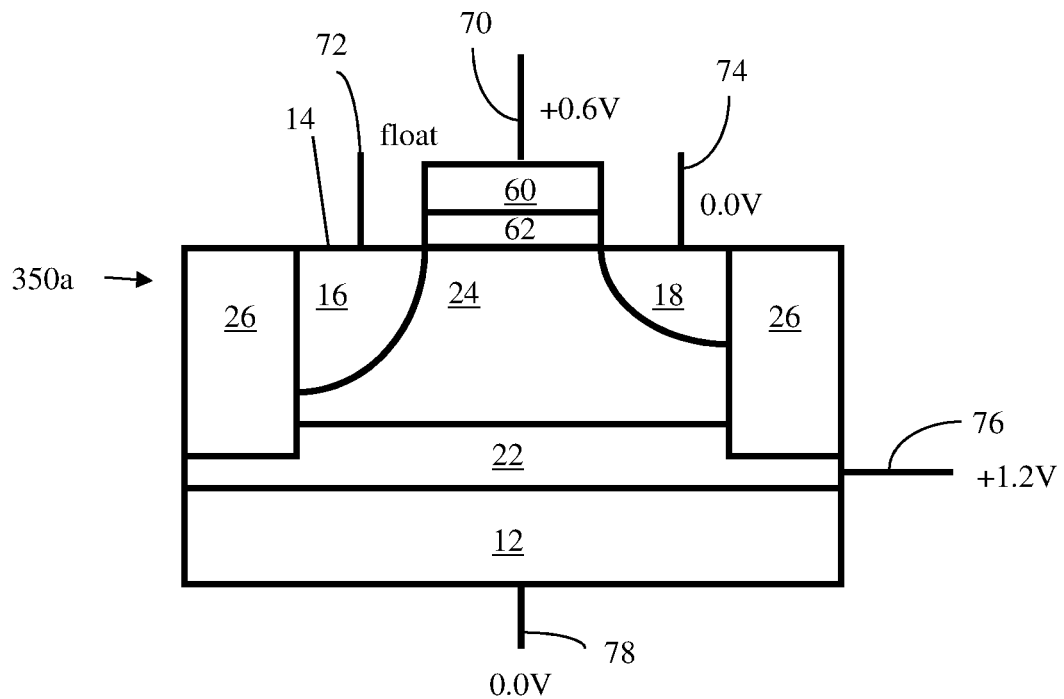
FIG. 38 illustrates exemplary bias conditions applied on the terminals of a selected memory cell of the array of FIG. 37.

The bias conditions on the selected memory cell 350a are shown in FIG. 38. The positive voltage applied to the selected WL terminal 70a will turn on the MOS transistor 320 and pull the source line region 16 (which is floating) to about zero voltage (the potential applied to the BL terminal 74a). Because the bipolar transistor 330a has a lower emitter-collector breakdown voltage, this will result in electron flow from the source line region 16 to the buried well region 22. The electron flow will result in impact ionization at the interface of the buried well region 22 and the floating body region 24, and hot holes will be injected to the floating body region 24. No (or significantly lower) electron flow will occur through the bipolar transistor 330b as it has a higher emitter-collector breakdown voltage.

Figure 39:
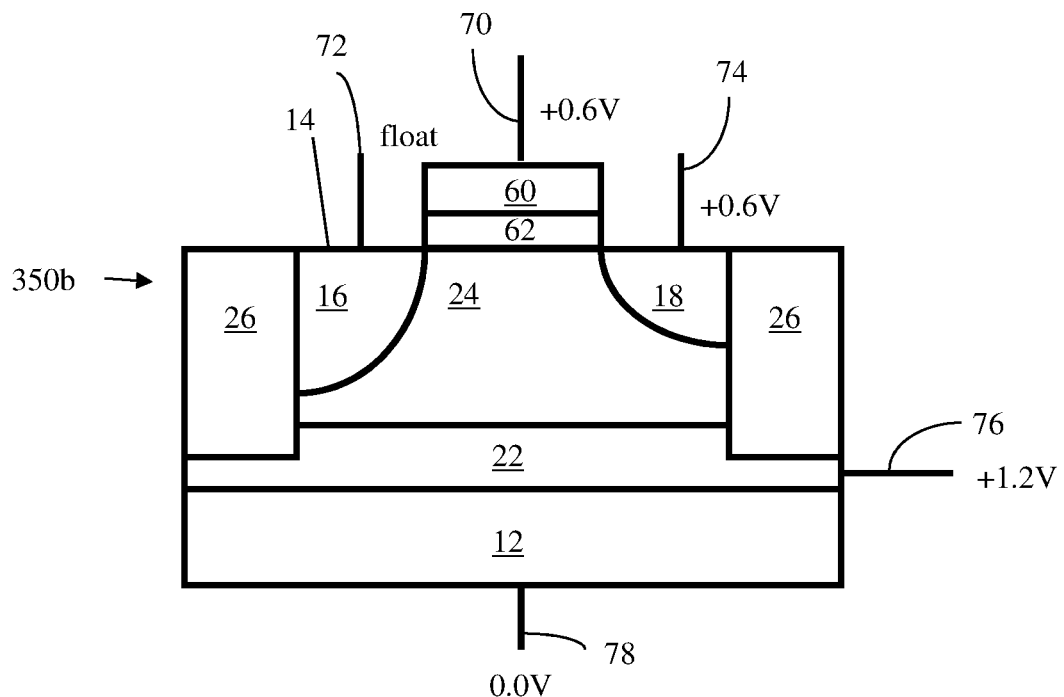
FIG. 39 illustrates exemplary bias conditions applied on the terminals of an unselected memory cell, sharing the same row as the selected cell, of the array of FIG. 37.

FIG. 39 shows the bias conditions on the unselected memory cell 350b, which is a representative of an unselected memory cell in the same row as the selected memory cell 350a. The potential of the floating source line region 16 for the memory cell 350b will be about the voltage difference between the gate voltage and the threshold voltage of the MOS transistor 320. The emitter-collector voltage (the difference between the potential of the buried well region 22 and the source line region 16 or the bit line region 18) is lower than the emitter-collector breakdown voltage of both bipolar transistors 330a and 330b and thus no (or significantly lower) impact ionization occurs on the unselected memory cell 350b.

Figure 40:
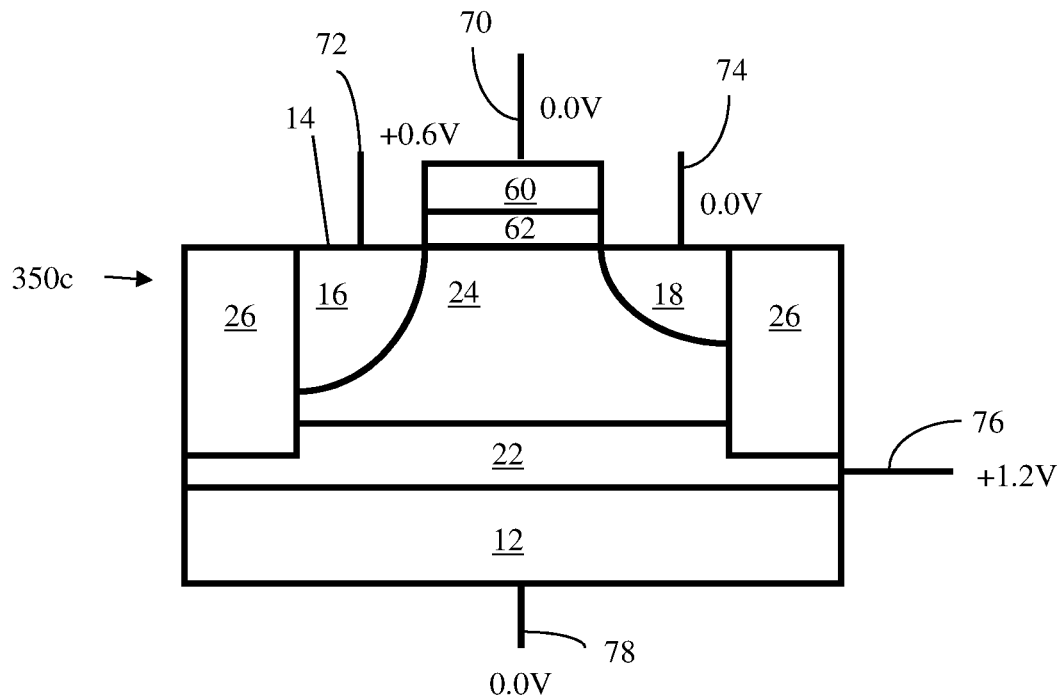
FIG. 40 illustrates exemplary bias conditions applied on the terminals of an unselected memory cell, sharing the same column as the selected cell, of the array of FIG. 37.

FIG. 40 shows the bias conditions on the unselected memory cell 350c, which is a representative of an unselected memory cell sharing the same column as the selected memory cell 350a. The emitter-collector voltages of the bipolar transistor 330a and 330b are both lower than the emitter-collector breakdown voltages of both bipolar transistor 330a and 330b and thus no (or significantly lower) impact ionization occurs on the unselected memory cell 350c.

Figure 41:
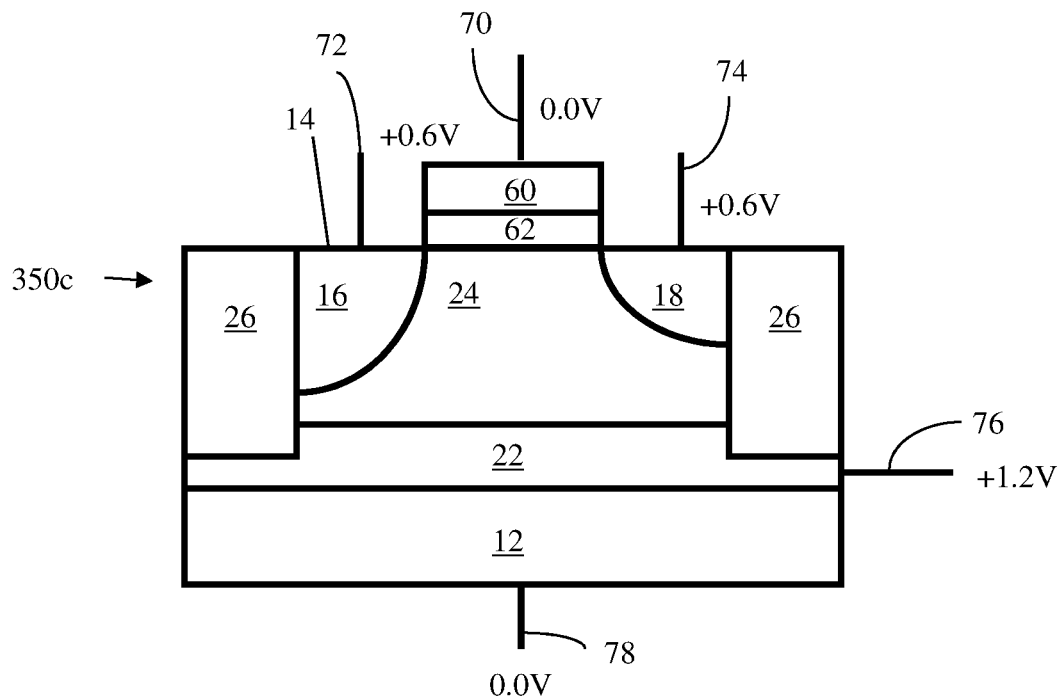
FIG. 41 illustrates exemplary bias conditions applied on the terminals of an unselected memory cell, not sharing the same row nor the same column as the selected cell, of the array of FIG. 37.

FIG. 41 shows the bias conditions on the unselected memory cell 350d, which is a representative of an unselected memory cell sharing neither row nor column with the selected memory cell 350a. The emitter-collector voltages of the bipolar transistor 330a and 330b are both lower than the emitter-collector breakdown voltages of both bipolar transistor 330a and 330b and thus no (or significantly lower) impact ionization occurs on the unselected memory cell 350d.

Figure 42:
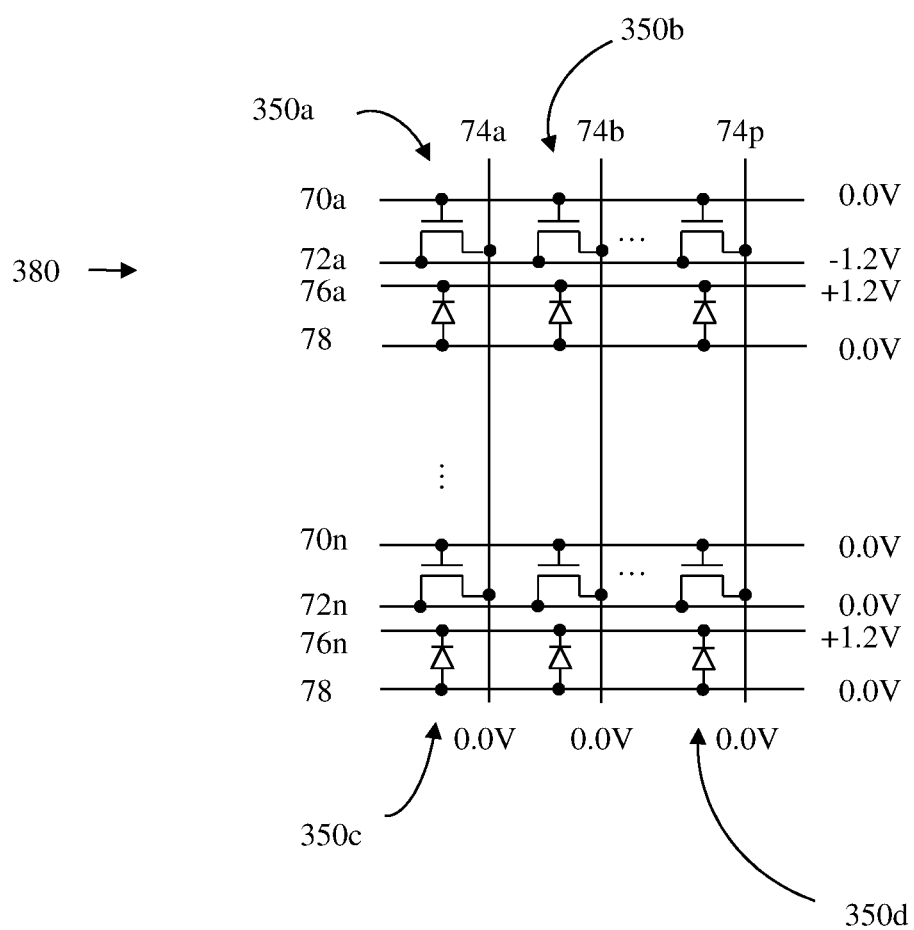
FIG. 42 schematically illustrates a write logic-0 operation performed on a memory array according to an embodiment of the present invention.
Figure 43:
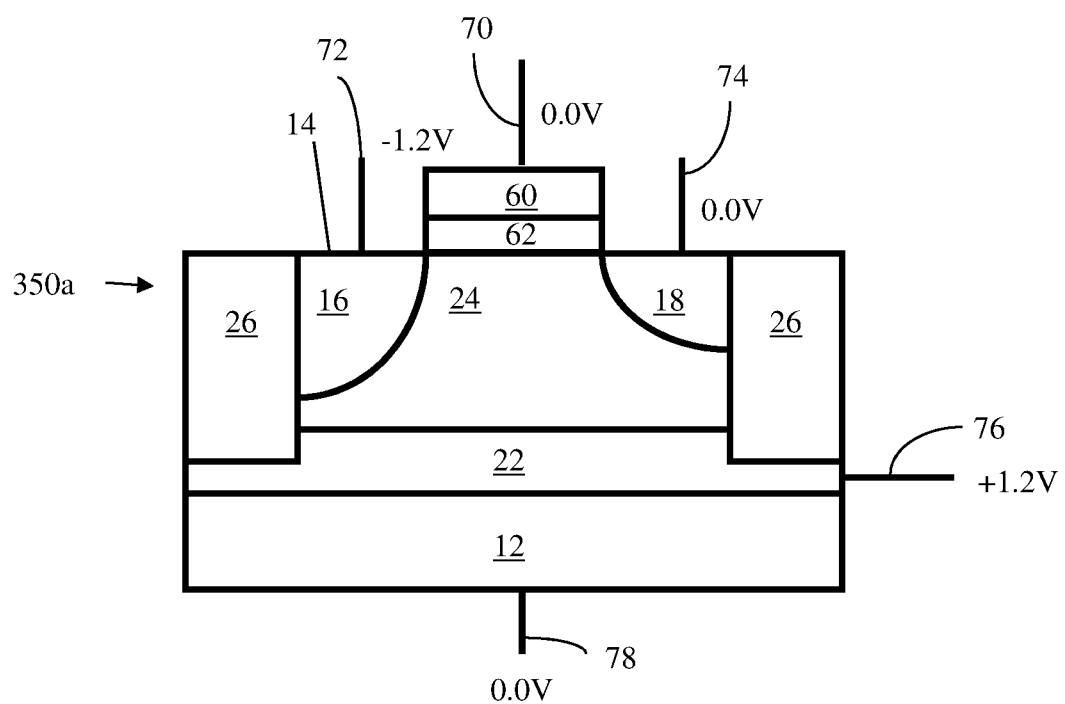
FIG. 43 illustrates exemplary bias conditions applied on the terminals of a selected memory cell of the array of FIG. 42.
Figure 44A:
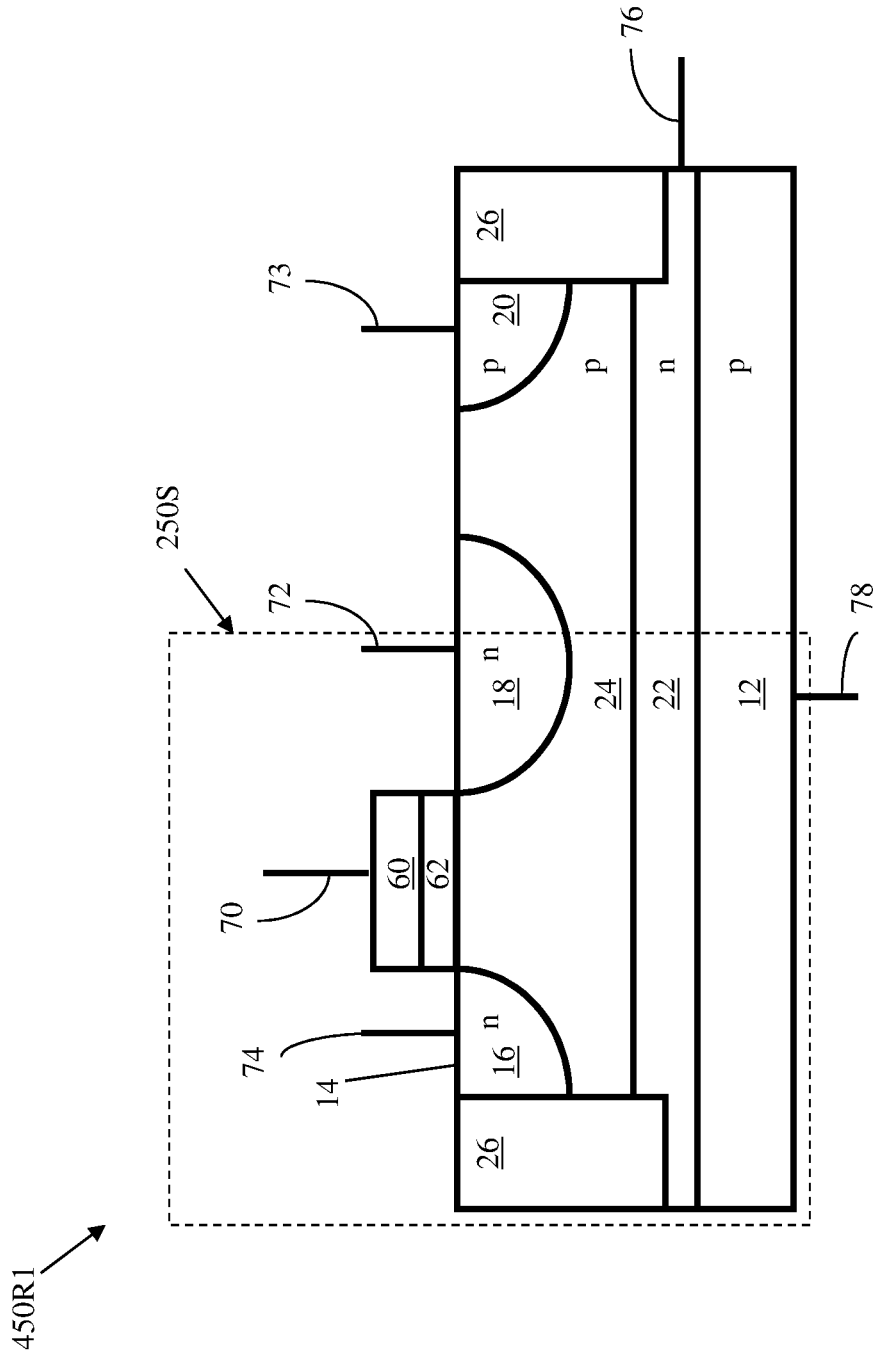
FIG. 44A is a schematic, cross-sectional illustration of a memory cell which can be used as a reference cell in sensing the state of a floating body memory cell according to an embodiment of the present invention.
Figure 44B:
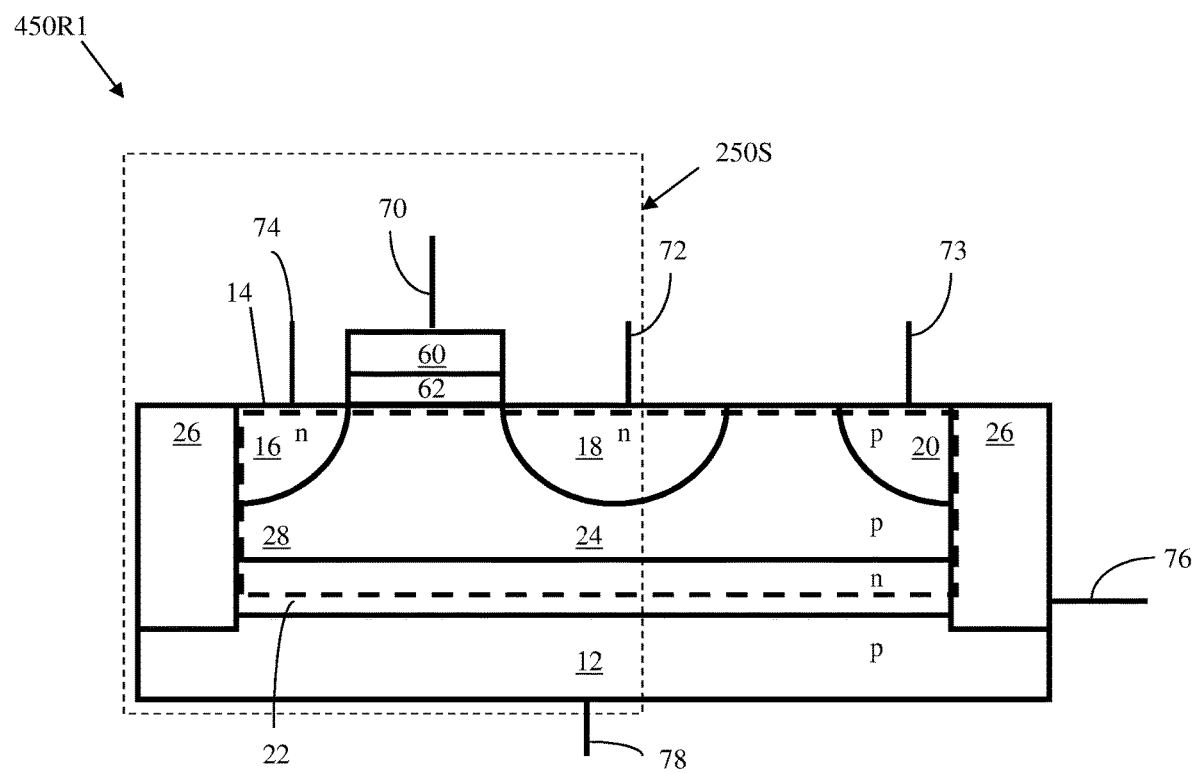
FIG. 44B is a schematic, cross-sectional illustration of a memory cell which can be used as a reference cell in sensing the state of a floating body memory cell according to another embodiment of the present invention.
Figure 45A:
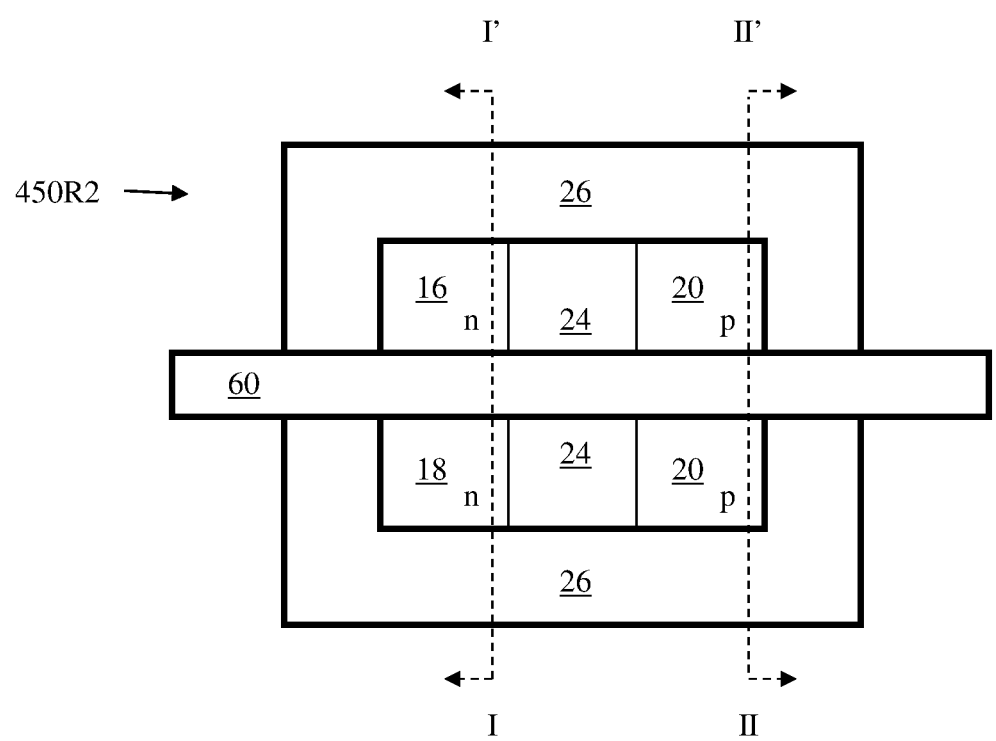
FIG. 45A is a schematic illustration of a top view of a memory cell according to another embodiment of the present invention.
Figure 45B:
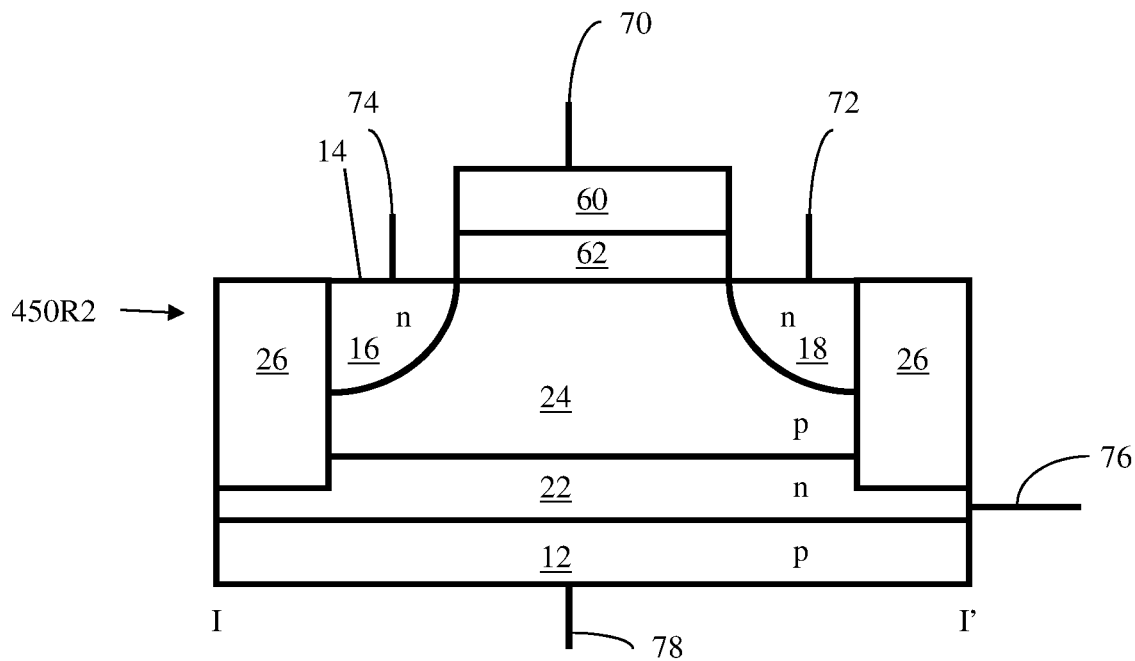
FIGS. 45B and 45C are schematic, cross-sectional illustrations of the cell of FIG. 45A taken along the I-I' and II-II' cut lines of FIG. 30A, respectively.
Figure 45C:
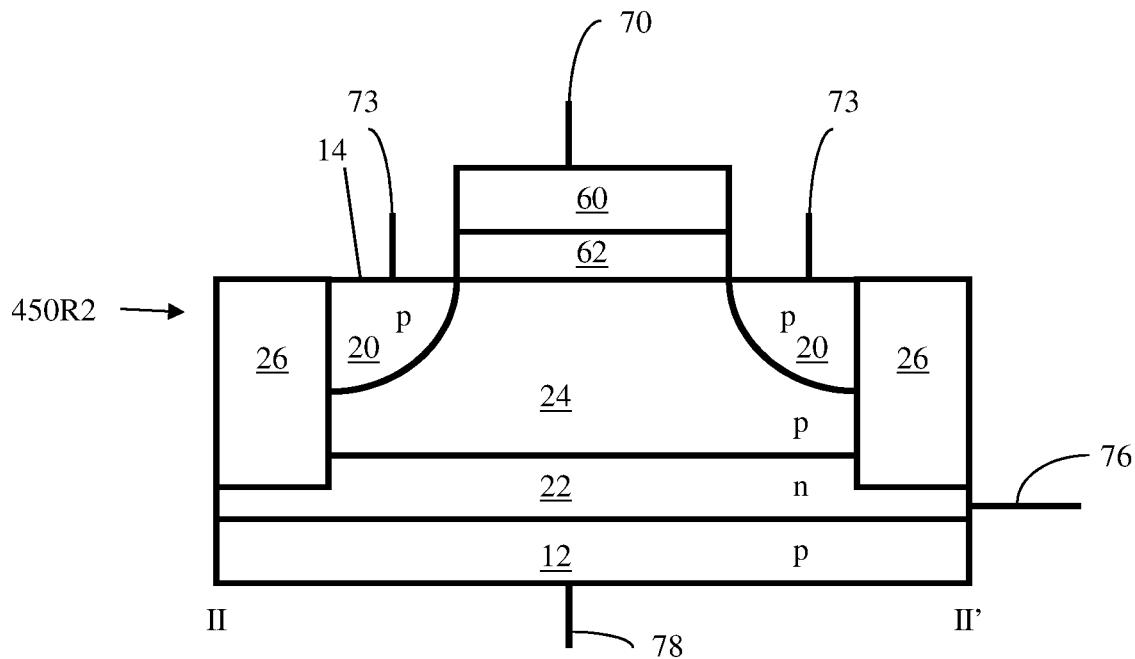

A write logic-0 is performed on the memory cell 350 as shown in FIGS. 42 and 43 through the application of the following bias conditions: a negative voltage is applied to the selected SL terminal 72, zero or negative voltage is applied to the selected WL terminal 70, zero voltage is applied to the BL terminal 74, zero or positive voltage is applied to the selected BW terminal 76, and zero voltage is applied to the selected substrate terminal 78; while zero voltage is applied to the unselected SL terminal 72, BL terminal 74, and substrate terminal 78, zero or negative voltage is applied to the unselected WL terminal 70, and zero or positive voltage is applied to the selected BW terminal 76.

Under these conditions, the p-n junction between floating body 24 and source line region 16 of the selected cell 350 is forward-biased, evacuating holes from the floating body 24. All memory cells 350 sharing the same selected SL terminal 72a will be written to simultaneously. To write arbitrary binary data to different memory cells 350, a write logic-0 operation is first performed on all the memory cells to be written, followed by one or more write logic-1 operations on the memory cells that must be written to logic-1.

In the write logic-0 operation shown in FIGS. 42 and 43, hole injection into the floating body region 24 may occur if the emitter-collector voltage of the bipolar transistor 330a is larger than its emitter-collector breakdown voltage and reduces the efficiency of the write logic-0 operation. In another embodiment of the write logic-0 operation, the following bias conditions are applied: a negative voltage is applied to the selected BL terminal 74, zero or negative voltage is applied to the selected WL terminal 70, zero voltage is applied to the SL terminal 72, zero or positive voltage is applied to the selected BW terminal 76, and zero voltage is applied to the selected substrate terminal 78; while zero voltage is applied to the unselected SL terminal 72, BL terminal 74, and substrate terminal 78, zero or negative voltage is applied to the unselected WL terminal 70, and zero or positive voltage is applied to the selected BW terminal 76. Because the emitter-collector breakdown voltage of the bipolar transistor 330b is higher than that of bipolar transistor 330a, no (or significantly lower) impact ionization and hole injection into the floating body region 24 occur.

Memory cells 50, 50G, 150, 250, and 350 can also be constructed in a three-dimensional structure for example having FinFET structures.

FIGS. 44A-44B and FIGS. 45A-45C illustrate reference memory cells 450R1 and 450R2, respectively, which have been described by Widjaja in U.S. application Ser. No. 13/244,899, "Asymmetric Semiconductor Memory Device Having Electrically Floating Body", which is hereby incorporated herein, in its entirety, by reference thereto. Reference memory cells 450R1 and 450R2 comprise sense line region 20 having the same conductivity type as that of floating body region 24. The sense line region 20 allows for an Ohmic connection to the floating body region 24. Reference memory cells 450R1 and 450R2 may also comprise buried well regions 22G having a lower band gap materials (such as illustrated in memory cell 50G shown in FIG. 19), or having different regions comprising the floating body region 24 (such as regions 24a, 24b, and 24c of memory cell 150 shown in FIG. 20A), halo regions 17 and 19 (such as memory cell 250 shown in FIG. 32A or FIG. 32B), or having asymmetric source and drain regions (such as memory cell 350 shown in FIG. 34).

Figure 46:
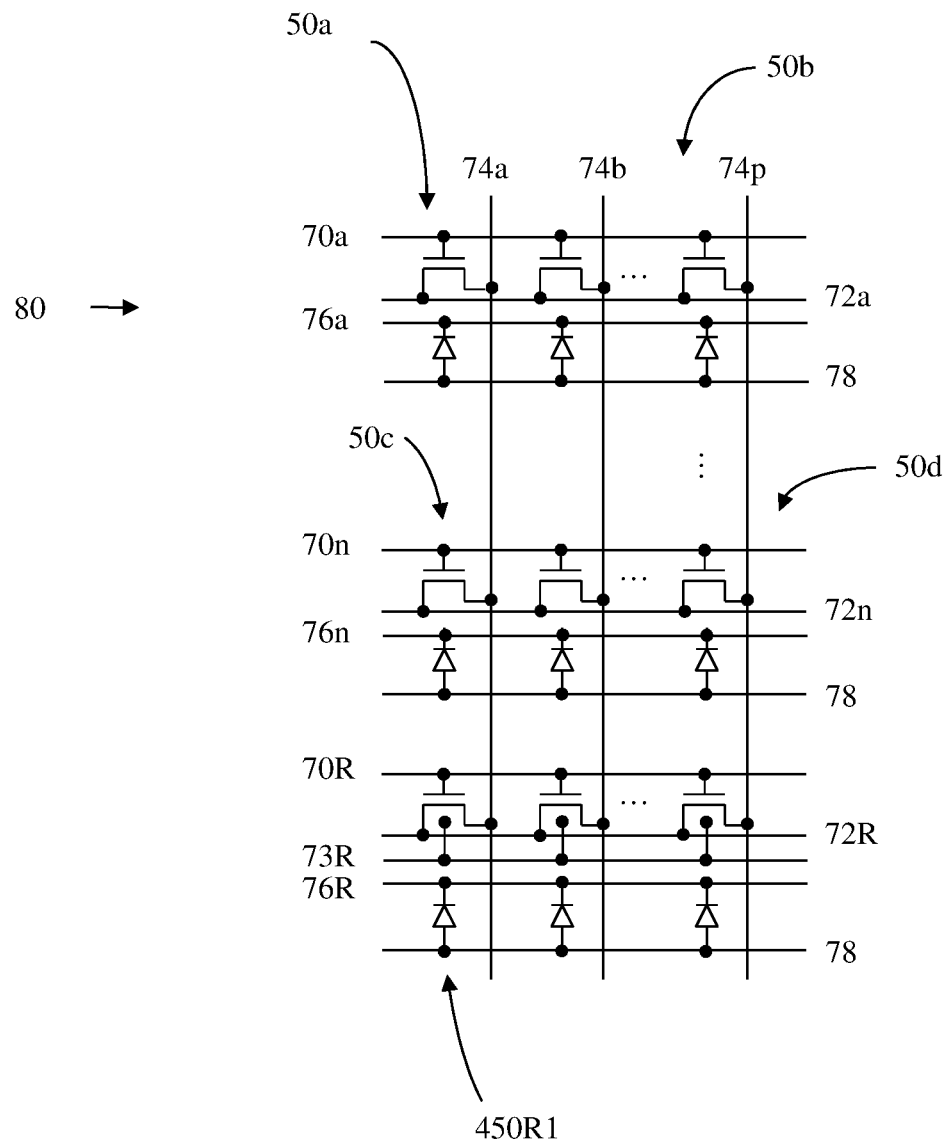
FIG. 46 schematically illustrates a memory array comprising multiple cells of the type shown in FIGS. 1-3 and a reference cell of the type shown in FIGS. 44A and 44B.

FIG. 46 shows an exemplary memory array 80 comprising a plurality of memory cells 50 along with a row of reference cells 450R1. Although only one row of reference cells 450R1 is shown, it is understood that memory array 80 may comprise multiple rows of reference cells 450R1, which may be located adjacent to each other or located separate from each other. Similarly, rows of reference cells 450R1 may be located at the edge of the array 80, or in the middle of the memory array 80, or otherwise intermediate of rows of memory cells 50.

Figure 47:
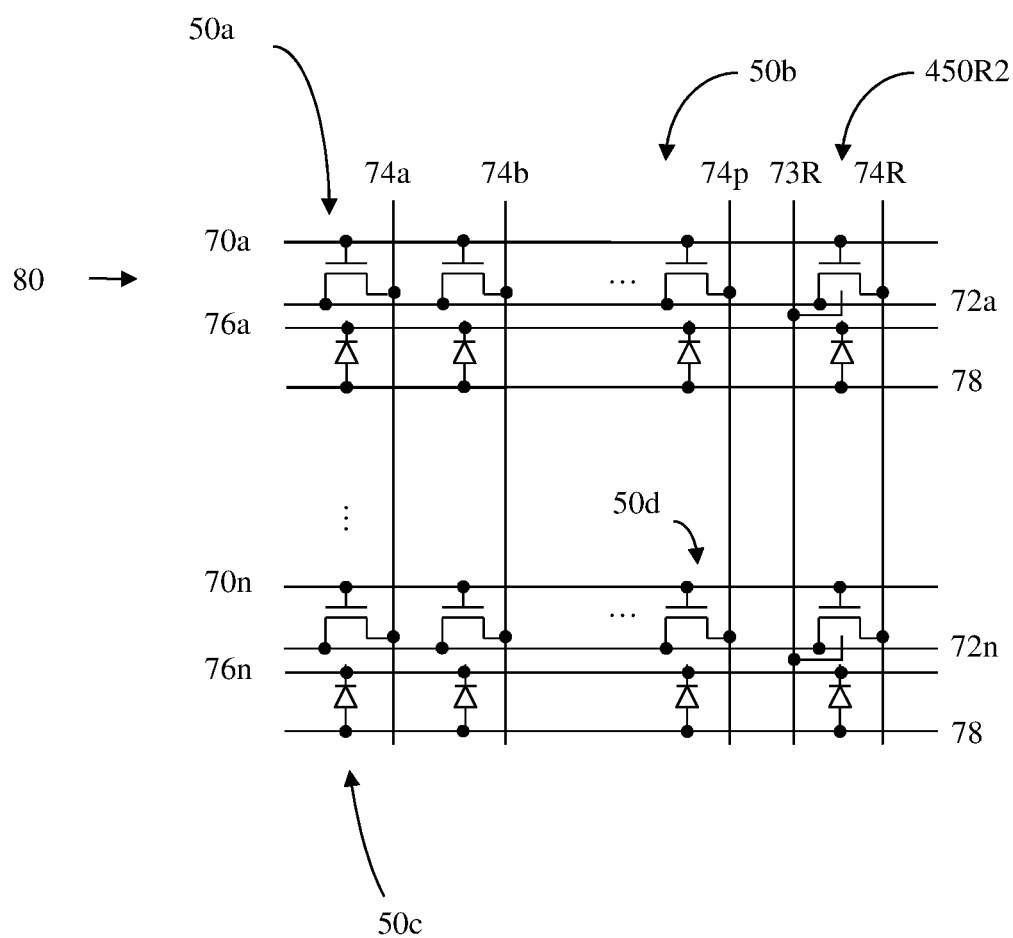
FIG. 47 schematically illustrates a memory array comprising multiple cells of the type shown in FIGS. 1-3 and a reference cell of the type shown in FIGS. 45A-45C.

FIG. 47 shows an exemplary memory array 80 comprising a plurality of memory cells 50 along with a column of reference cells 450R2. Although only one column of reference cells 450R2 is shown, it is understood that memory array 80 may comprise multiple columns of reference cells 450R2, which may be located adjacent to each other or located separate from each other. Similarly, columns of reference cells 450R2 may be located at the edge of the array 80, or in the middle of the memory array 80, or otherwise intermediate of columns of memory cells 50.

From the foregoing it can be seen that a memory cell comprising a floating body transistor has been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:
1. A semiconductor memory cell comprising:
a first bipolar device having a first floating base region, a first collector region, and a first emitter, and
a second bipolar device having a second floating base region, a second collector region, and a second emitter,
wherein said first floating base region is common to said second floating base region,
wherein said first collector region is common to said second collector region, and
a transistor comprising said first emitter, said first floating body region, and said second emitter, wherein a state of said semiconductor memory cell is maintained through a back bias applied to said first and second collector regions;

wherein current flow through said transistor during a read operation is determined by said state of said semiconductor memory cell;

wherein said first and second collector regions are commonly connected to at least two of said memory cells; and wherein said first and second collector regions have a band gap that is lower than a band gap of said first and second floating base regions.

2. The semiconductor memory cell of claim 1, further comprising a gate region positioned above said first and second floating base regions.

3. The semiconductor memory cell of claim 1, wherein said first and second collectors are configured to maintain a charge in said first and second floating base regions.

4. The semiconductor memory cell of claim 1, wherein said state of said memory cell is a state selected from at least first and second states, and wherein said first and second states are stable states.

5. The semiconductor memory cell of claim 1, wherein said state of said memory cell is a state selected from at least first and second states; and wherein a product of forward emitter gain and impact ionization efficiency of said first and second bipolar transistors approaches unity when said memory cell is in one of said first and second states, and wherein impact ionization, when said memory cell is in the other of said first and second states is less than the impact ionization when said memory cell is in said one of said first and second states.

6. The semiconductor memory cell of claim 1, wherein said state of said memory cell is maintained through impact ionization.

7. The semiconductor memory cell of claim 1, wherein at least a portion of said semiconductor memory cell is formed in a fin structure.

8. A semiconductor memory array comprising:
a plurality of semiconductor memory cells arranged in a matrix of rows and columns, wherein each said semiconductor memory cell includes:
a first bipolar device having a first floating base region, a first collector, and a first emitter, and
a second bipolar device having a second floating base region, a second collector, and a second emitter;
wherein said first floating base region is common to said second floating base region;
wherein said first collector is common to said second collector; and
a transistor comprising said first emitter, said first floating body region, and said second emitter,
wherein a state of said semiconductor memory cell is maintained through a back bias applied to said first and second collectors;
wherein current flow through said transistor during a read operation is determined by said state of said semiconductor memory cell;
wherein said first and second collectors are commonly connected to at least two of said memory cells; and
wherein said first and second collectors have a band gap that is lower than a band gap of said first and second floating base regions.

9. The semiconductor memory array of claim 8, wherein each of said semiconductor memory cells further comprises a gate region positioned above said first and second floating base regions, respectively.

10. The semiconductor memory array of claim 8, wherein said first and second collectors are configured to maintain a charge in said floating base regions.

11. The semiconductor memory array of claim 8, wherein said state of said memory is selected from at least first and second states; and wherein said first and second states are stable states.

12. The semiconductor memory array of claim 8, wherein said state of said memory is selected from at least first and second states; wherein a product of forward emitter gain and impact ionization efficiency of said first and second bipolar transistors approaches unity when said memory cell is in one of said first and second states, and wherein impact ionization, when said memory cell is in the other of said first and second states is less than the impact ionization when said memory cell is in said one of said first and second states.

13. The semiconductor memory array of claim 8, wherein said memory cell states are maintained through impact ionization.

14. The semiconductor memory array of claim 8, wherein at least a portion of each said semiconductor memory cell is formed in at least one fin structure, respectively.

15. An integrated circuit comprising:
a semiconductor memory array comprising:
a plurality of semiconductor memory cells arranged in a matrix of rows and columns, wherein each said semiconductor memory cell includes:
a first bipolar device having a first floating base region, a first collector, and a first emitter; and
a second bipolar device having a second floating base region, a second collector, and a second emitter;
wherein said first floating base region is common to said second floating base region;
wherein said first collector is common to said second collector; and
a transistor comprising said first emitter, said first floating body region, and said second emitter,
wherein a state of said semiconductor memory cell is maintained through a back bias applied to said first and second collectors;
wherein current flow through said transistor during a read operation is determined by said state of said semiconductor memory cell;
wherein said first and second collectors are commonly connected to at least two of said memory cells;
wherein said first and second collectors have a band gap that is lower than a band gap of said first and second floating base regions; and
a control circuit configured to provide electrical signals to apply said back bias.

16. The integrated circuit of claim 15, wherein each of said semiconductor memory cells further comprises a gate region positioned above said first and second floating base regions, respectively.

17. The integrated circuit of claim 15, wherein said first and second collectors are configured to maintain a charge in said floating base regions.

18. The integrated circuit of claim 15, wherein said state of said memory cell is selected from at least first and second states; and wherein said first and second states are stable states.

19. The integrated circuit of claim 15, wherein said memory cell states are maintained through impact ionization.

20. The integrated circuit of claim 15, wherein at least a portion of at least one of said semiconductor memory cells is formed in a fin structure.

* * * * *